US011133455B2

(12) United States Patent
Spann et al.

(10) Patent No.: US 11,133,455 B2
(45) Date of Patent: Sep. 28, 2021

(54) REDUCED HYSTERESIS AND REDUCED CREEP IN NANOVOIDED POLYMER DEVICES

(71) Applicant: Facebook Technologies, LLC, Menlo Park, CA (US)

(72) Inventors: Andrew Spann, Needham, MA (US); Eric Schmitt, Needham, MA (US); Nagi Elabbasi, Framingham, MA (US); Kenneth Diest, Kirkland, WA (US); Katherine Marie Smyth, Seattle, WA (US); Renate Eva Klementine Landig, Seattle, WA (US); Andrew John Ouderkirk, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 37 days.

(21) Appl. No.: 16/703,291

(22) Filed: Dec. 4, 2019

(65) Prior Publication Data
US 2020/0185592 A1 Jun. 11, 2020

Related U.S. Application Data

(60) Provisional application No. 62/777,825, filed on Dec. 11, 2018.

(51) Int. Cl.
*H01L 41/193* (2006.01)
*H01L 41/09* (2006.01)
(Continued)

(52) U.S. Cl.
CPC ............ *H01L 41/193* (2013.01); *C08F 14/20* (2013.01); *C08F 14/22* (2013.01); *C08G 77/04* (2013.01);
(Continued)

(58) Field of Classification Search
None
See application file for complete search history.

(56) References Cited

U.S. PATENT DOCUMENTS 5,095,515 A 3/1992 Seaver
6,420,441 B1 7/2002 Allen et al.
(Continued)

OTHER PUBLICATIONS

Non-Final Office Action received for U.S. Appl. No. 16/351,477 dated Jun. 23, 2020, 27 pages.
(Continued)

*Primary Examiner* — Evren Seven
(74) *Attorney, Agent, or Firm* — FisherBroyles, LLP

(57) ABSTRACT

An example device includes a nanovoided polymer element, which may be located at least in part between the electrodes. In some examples, the nanovoided polymer element may include anisotropic voids, including a gas, and separated from each other by polymer walls. The device may be an electroactive device, such as an actuator having a response time for a transition between actuation states. The gas may have a characteristic diffusion time (e.g., to diffuse half the mean wall thickness through the polymer walls) that is less than the response time. The nanovoids may be sufficiently small (e.g., below 1 micron in diameter or an analogous dimension), and/or the polymer walls may be sufficiently thin, such that the gas interchange between gas in the voids and gas absorbed by the polymer walls may occur faster than the response time, and in some examples, effectively instantaneously.

20 Claims, 31 Drawing Sheets

(51) Int. Cl.
*H01L 41/047* (2006.01)
*H04R 17/00* (2006.01)
*G02B 27/01* (2006.01)
*G02F 1/01* (2006.01)
*G02F 1/061* (2006.01)
*G02B 5/08* (2006.01)
*G02B 5/30* (2006.01)
*G02B 27/10* (2006.01)
*G06F 3/01* (2006.01)
*C08F 14/20* (2006.01)
*C08F 14/22* (2006.01)
*C08G 77/04* (2006.01)
*H01L 41/083* (2006.01)
*H01L 41/18* (2006.01)
*C08L 83/04* (2006.01)
*B82Y 30/00* (2011.01)
*B82Y 40/00* (2011.01)

(52) U.S. Cl.
CPC ............. *G02B 5/08* (2013.01); *G02B 5/3083* (2013.01); *G02B 27/0172* (2013.01); *G02B 27/0176* (2013.01); *G02B 27/10* (2013.01); *G02F 1/0102* (2013.01); *G02F 1/061* (2013.01); *G06F 3/011* (2013.01); *H01L 41/047* (2013.01); *H01L 41/0472* (2013.01); *H01L 41/083* (2013.01); *H01L 41/09* (2013.01); *H01L 41/0913* (2013.01); *H01L 41/0986* (2013.01); *H01L 41/18* (2013.01); *H04R 17/00* (2013.01); *B82Y 30/00* (2013.01); *B82Y 40/00* (2013.01); *C08L 83/04* (2013.01); *G02B 2027/0178* (2013.01); *G02F 2202/022* (2013.01)

(56) References Cited

U.S. PATENT DOCUMENTS

| | | |
|---|---|---|
| 6,628,850 B1 | 9/2003 | Yao |
| 7,230,771 B2 | 6/2007 | Kuiper et al. |
| 8,477,402 B2 | 7/2013 | Duncan et al. |
| 8,848,280 B2 | 9/2014 | Arsenault |
| 9,228,822 B2 | 1/2016 | Majidi et al. |
| 10,670,782 B2 | 6/2020 | Arbabi et al. |
| 10,690,946 B2 | 6/2020 | Wilson |
| 10,749,448 B2 | 8/2020 | Lindsay et al. |
| 11,022,856 B1 | 6/2021 | Ouderkirk et al. |
| 11,025,175 B1 | 6/2021 | Landig et al. |
| 2002/0009251 A1 | 1/2002 | Byrne |
| 2002/0135863 A1 | 9/2002 | Fukshima et al. |
| 2002/0186928 A1 | 12/2002 | Curtis |
| 2005/0196552 A1 | 9/2005 | Lehmann et al. |
| 2006/0024976 A1 | 2/2006 | Waldfried et al. |
| 2006/0028734 A1 | 2/2006 | Kuiper et al. |
| 2007/0020404 A1 | 1/2007 | Seiberle et al. |
| 2007/0263963 A1 | 11/2007 | Hughes et al. |
| 2008/0137031 A1 | 6/2008 | Hillis et al. |
| 2008/0171431 A1 | 7/2008 | Yu et al. |
| 2008/0197518 A1 | 8/2008 | Aylward et al. |
| 2008/0224103 A1 | 9/2008 | Arsenault et al. |
| 2009/0034051 A1 | 2/2009 | Arsenault et al. |
| 2009/0296188 A1 | 12/2009 | Jain et al. |
| 2010/0075056 A1 | 3/2010 | Axisa et al. |
| 2011/0149410 A1 | 6/2011 | Blum |
| 2011/0242638 A1 | 10/2011 | Horning et al. |
| 2012/0019185 A1 | 1/2012 | Guidarelli et al. |
| 2012/0029416 A1 | 2/2012 | Parker et al. |
| 2012/0200931 A1 | 8/2012 | Haag et al. |
| 2012/0298200 A1 | 11/2012 | Niggemann et al. |
| 2013/0202867 A1 | 8/2013 | Coggio et al. |
| 2013/0222881 A1 | 8/2013 | Aizenberg et al. |
| 2013/0279151 A1 | 10/2013 | Ouderkirk et al. |
| 2013/0335807 A1 | 12/2013 | Arsenault et al. |
| 2014/0133010 A1 | 5/2014 | Han et al. |
| 2014/0204372 A1 | 7/2014 | Pang et al. |
| 2014/0217539 A1 | 8/2014 | Rantala |
| 2014/0234995 A1 | 8/2014 | Li et al. |
| 2014/0266647 A1 | 9/2014 | Visitacion et al. |
| 2015/0109657 A1 | 4/2015 | Baumberg et al. |
| 2015/0205126 A1 | 7/2015 | Schowengerdt |
| 2015/0241698 A1 | 8/2015 | Schowengerdt |
| 2015/0315012 A1 | 11/2015 | Wiersma et al. |
| 2016/0103341 A1 | 4/2016 | Long et al. |
| 2016/0187985 A1 | 6/2016 | Lim et al. |
| 2016/0283773 A1 | 9/2016 | Popovich et al. |
| 2017/0023807 A1 | 1/2017 | Chang-Hasnain et al. |
| 2017/0031078 A1 | 2/2017 | Thompson et al. |
| 2017/0090570 A1 | 3/2017 | Rain et al. |
| 2017/0192595 A1 | 7/2017 | Choi et al. |
| 2017/0285348 A1 | 10/2017 | Ayres et al. |
| 2017/0365630 A1 | 12/2017 | Yang |
| 2018/0093456 A1 | 4/2018 | Van Overmeere et al. |
| 2018/0164627 A1 | 6/2018 | Oh |
| 2018/0356303 A1 | 12/2018 | Li et al. |
| 2019/0296218 A1 | 9/2019 | Ouderkirk et al. |
| 2019/0361318 A1 | 11/2019 | Johnson et al. |
| 2020/0076328 A1 | 3/2020 | Cha et al. |
| 2020/0183168 A1 | 6/2020 | Spann et al. |
| 2020/0183199 A1 | 6/2020 | Diest et al. |
| 2020/0183200 A1 | 6/2020 | Diest et al. |
| 2020/0185590 A1 | 6/2020 | Malhotra et al. |

OTHER PUBLICATIONS

Moore, Duncan T., "Gradient Index Optics", Optical Elements, IVPV Handbook of Optics, 2nd Edition, vol. II—Devices, Measurements, and Properties, 1995, pp. 9.1-9.10.

Nguyen et al., "Synthesis, Processing, and Characterization of Inorganic-Organic Hybrid Cross-Linked Silica, Organic Polyimide, and Inorganic Aluminosilicate Aerogels", National Aeronautics and Space Administration STI Program, NASA/CR-2014-218328, Jul. 2014, 58 pages.

Shatz, Narkis, "Gradient-Index Optics", Science Applications International Corp., Final Report, Mar. 31, 2010, 103 pages.

Teichman et al., "Gradient Index Optics at DARPA", Institute for Defense Analyses, IDA Document D-5027, Nov. 2013, 69 pages.

Tanaka et al., "Polymer Nanocomposites as Dielectrics and Electrical Insulation-perspectives for Processing Technologies, Material Characterization and Future Applications", IEEE Transactions on Dielectrics and Electrical Insulation, vol. 11, No. 5, Oct. 2004, pp. 763-784.

Fuse et al., "Possible Mechanism of Superior Partial-Discharge Resistance of Polyamide Nanocomposites", Annual Report Conference on Electrical Insulation and Dielectric Phenomena, 2004, pp. 322-325.

Johnson et al., "A brief review of atomic layer deposition:from fundamentals to applications", Materials Today, vol. 17, No. 5, Jun. 2014, pp. 236-246.

Amino et al., "Polydimethylsiloxane thermal degradation Part 1. Kinetic aspects", Polymer, vol. 42, 2001, pp. 2395-2402.

Tanaka et al., "Proposal of a Multi-core Model for Polymer Nanocomposite Dielectrics", IEEE Transactions on Dielectrics and Electrical Insulation, vol. 12, No. 4, Aug. 2005, pp. 669-681.

Loiko et al., "Experimental results and theoretical model to describe angular dependence of light scattering by monolayer of nematic droplets", Journal of Quantitative Spectroscopy and Radiative Transfer, vol. 178, Jul. 2016, 11 pages.

Waldem et al., "Digilens Switchable Bragg grating waveguide optics for augmented reality applications", Proc. SPIE 10676, Digital optics for Immersive Displays, May 21, 2018, 1 page.

Diest et al., "Nanovoided Tunable Optics", U.S. Appl. No. 16/262,439, filed Jan. 30, 2019, 57 pages.

Ouderkirk et al., "Nanovoided Graded-Index Optical Elements, Optical Arrays, and Methods of Forming the Same", U.S. Appl. No. 16/426,737, filed May 30, 2019, 113 pages.

Diest et al., "Polymer Materials Including Coated Nanovoids and Methods and Systems for Forming the Same", U.S. Appl. No. 16/512,335, filed Jul. 15, 2019, 133 pages.

(56) References Cited

OTHER PUBLICATIONS

Sharma et al., "Switchable Electroactive Devices for Head-Mounted Displays", U.S. Appl. No. 16/351,477, filed Mar. 12, 2019, 108 pages.
Spann et al., "Nanovoided Polymers Having Shaped Voids", U.S. Appl. No. 16/703,674, filed Dec. 4, 2019, 149 pages.
Landig et al., "Planarization Layers for Nanovoided Polymers", U.S. Appl. No. 16/364,977, filed Mar. 26, 2019, 125 pages.
Ouderkirk et al., "Waveguide with Switchable Input", U.S. Appl. No. 16/263,829, filed Jan. 31, 2019, 55 pages.
Landig et al., "Multiple Layers Between Electrodes Including Nanovoided Polymer", U.S. Appl. No. 16/386,232, filed Apr. 16, 2019, 126 pages.
Landig et al., "Nanovoided Polymers Using Phase Inversion", U.S. Appl. No. 16/449,964, filed Jun. 24, 2019, 139 pages.
Diest et al., "Nanovoided Tunable Birefringence", U.S. Appl. No. 16/262,433, filed Jan. 30, 2019, 51 pages.
Malhotra et al., "Spatially Addressable Nanovoided Polymers", U.S. Appl. No. 16/417,911, filed May 21, 2019, 138 pages.
Landig et al., "Fabrication of Shaped Voids", U.S. Appl. No. 16/669,970, filed Oct. 31, 2019, 110 pages.
International Search Report and Written Opinion received for PCT Application Serial No. PCT/US2019/064395 dated Mar. 12, 2020, 17 pages.
Si et al., "Liquid-Crystal-Enabled Active Plasmonics: A Review", Materials, vol. 7, No. 2, Feb. 18, 2014, pp. 1296-1317.
Crawford, Gregory P., "Electrically Switchable Bragg Gratings", Optics & Photonics News, Apr. 30, 2003, pp. 54-59.
Dickson et al., "Electronically Controlled Surface Plasmon Dispersion and Optical Transmission through Metallic Hole Arrays Using Liquid Crystal", Nano Letters, vol. 8, No. 1, Jan. 1, 2008, pp. 281-286.
International Search Report and Written Opinion received for PCT Application Serial No. PCT/US2019/064367 dated Mar. 11, 2020, 17 pages.
Non-Final Office Action received for U.S. Appl. No. 16/364,977 dated Oct. 19, 2020, 38 pages.
Zhu et al., "Large deformation and electromechanical instability of a dielectric elastomer tube actuator", Journal of Applied Physics, vol. 108, Issue 7, Article 074113, Oct. 13, 2010, pp. 1-6.
Catmull et al., "Recursively generated B-spline surfaces on arbitrary topological meshes", Computer-Aided Design, vol. 10, No. 6, Nov. 1, 1978, pp. 183-188.
Loop, Charles Teorell, "Smooth Subdivision Surfaces Based on Triangles", Thesis, Master of Science, University of Utah, Aug. 1, 1987, 74 pages.
Merkel et al., "Gas Sorption, Diffusion, and Permeation in Poly(dimethylsiloxane)", Journal of Polymer Science: Part B: Polymer Physics, vol. 38, Feb. 1, 2000, pp. 415-434.
Kim et al., "Mathematical analysis of oxygen transfer through polydimethylsiloxane membrane between double layers of cell culture channel and gas chamber in microfluidic oxygenator", Microfluidics and Nanofluidics, vol. 15, Feb. 1, 2013, 39 pages.
Cruz-Hernandez et al., "Phase Control Approach to Hysteresis Reduction", IEEE Transactions on Control Systems Technology, vol. 9, No. 1, Jan. 1, 2001, pp. 17-26.
Zuev, Yu.S., "Elastomer-gas systems", International Polymer Science and Technology, vol. 28, No. 2, Feb. 1, 2001, pp. 43-53.
Shir, Daniel Jay-Lee et, "Three-Dimensional Nanofabrication with Elastomeric Phase Masks", PhD Thesis, University of Illinois at Urbana-Champaign, Oct. 17, 2007, 138 pages.
Notice of Allowance received for U.S. Appl. No. 16/262,439 dated Apr. 6, 2021, 38 pages.
Notice of Allowance received for U.S. Appl. No. 16/351,477 dated Mar. 29, 2021, 28 pages.
Preinterview first office action received for U.S. Appl. No. 16/262,433 dated Oct. 26, 2020, 58 pages.
Preinterview first office action received for U.S. Appl. No. 16/262,439 dated Nov. 30, 2020, 42 pages.
Final office action received for U.S. Appl. No. 16/351,477 dated Dec. 1, 2020, 38 pages.
Preinterview first office action received for U.S. Appl. No. 16/263,829 dated Dec. 22, 2020, 36 pages.
Non-Final office action received for U.S. Appl. No. 16/449,964 dated Nov. 24, 2020, 91 pages.
Holda et al., "Understanding and guiding the phase inversion process for synthesis of solvent resistant nanofiltration membranes", J. APPL. POLYM. SCI. 42130, 2015, 17 pages.
Struzynska-Piron et al., "Synthesis of solvent stable polymeric membranes via UV depth-curing", Chem. Commun., vol. 49, 11494, 2013, 3 pages.
Notice of Allowance received for U.S. Appl. No. 16/364,977 dated Feb. 2, 2021, 40 pages.
Notice of Allowance received for U.S. Appl. No. 16/263,829 dated Feb. 4, 2021, 27 pages.
Notice of Allowance received for U.S. Appl. No. 16/449,964 dated Mar. 4, 2021, 21 pages.
First Action Interview received for U.S. Appl. No. 16/262,433 dated Mar. 1, 2021, 12 pages.
Mullin et al., "Pattern Transformation Triggered by Deformation", Physical Review Letters, vol. 99, No. 8, 084301, Aug. 22, 2007, 4 pages.
Babaee et al., "3D Soft Metamaterials with Negative Poisson's Ratio", Advanced Materials, vol. 25, No. 36, Jul. 22, 2013, pp. 5044-5049.
Bertoldi et al., "Negative Poisson's Ratio Behavior Induced by an Elastic Instability", Advanced Materials, vol. 22, No. 3, Jan. 13, 2010, pp. 361-366.
Overvelde et al., "Relating pore shape to the non-linear response of periodic elastomeric structures", Journal of the Mechanics and Physics of Solids, vol. 64, Mar. 2014, pp. 351-366.
Ren et al., "Design and characterisation of a tuneable 3D buckling-induced auxetic metamaterial", Materials & Design, vol. 139, Feb. 5, 2018, pp. 336-342.
Correa et al., "Negative stiffness honeycombs for reoverable shock isolation", Rapid Prototyping Journal, vol. 21, No. 2, Mar. 16, 2015, pp. 193-200.
Coulais et al., "Discontinuous Buckling of Wide Beams and Metabeams", Physical Review Letters, vol. 115, No. 4, Jul. 21, 2015, 7 pages.
Bickel et al., "Design and Fabrication of Materials with Desired Deformation Behavior", ACM Transactions on Graphics, vol. 29, No. 4, Article 63, Jul. 1, 2010, pp. 1-10.
Rosset et al., "Small, fast, and tough: Shrinking down integrated elastomer transducers", Applied Physics Review, vol. 3, No. 3, Article 031105, Sep. 26, 2016, pp. 1-20.
Plante et al., "Large scale failure modes of dielectric elastomer actuators", International Journal of Solids and Structures, vol. 43, Mar. 29, 2006, pp. 7727-7751.
Optotune, "Electroactive Polymers", URL: https://optotune.com/technology/electroactive-polymers, retrieved on Apr. 30, 2020, 3 pages.
Novasentis, "Haptic Actuators", URL: https://novasentis.com/product, retrieved on Apr. 30, 2020, 4 pages.
Rosset et al., "Mechanical characterization of a dielectric elastomer microactuator with ion-implanted electrodes", Sensors and Actuators, A, vol. 144, No. 1, Jan. 14, 2008, pp. 185-193.
Gerratt et al., "Dielectric breakdown of PDMS thin films", Journal of Micromech and Microengineering, Technical Note, vol. 23, No. 6, Article 067001, Apr. 26, 2013, pp. 1-7.
Hunt et al., "A self-healing dielectric elastomer actuator", Applied Physics Letters, vol. 104, Article 113701, Mar. 19, 2014, pp. 1-3.
Skov et al., "Optimization Techniques for Improving the Performance of Silicone-Based Dielectric Elastomers", Advances Engineering Materials, vol. 20, No. 5, Article 1700762, Nov. 27, 2017, pp. 1-21.
Mazurek et al., "Glycerol as high-permittivity liquid filler in dielectric silicone elastomer", Journal of Applied Polymer Science, vol. 133, No. 43, Article 44153, Jul. 20, 2016, pp. 1-8.
Rao et al., "Synthesis of flexible silica aerogels using methyltrimethoxysilane (MTMS) precursor", Journal of Colloid and Interface Science, vol. 300, No. 1, Aug. 1, 2006, pp. 279-285.

(56) References Cited

OTHER PUBLICATIONS

Seo et al., "Reticulated Nanoporous Polymers by Controlled Polymerization-Induced Microphase Separation", Science, vol. 336, Jun. 15, 2012, pp. 1422-1425.
Jennings, S.G., "The Mean Free Path in Air", J. Aerosol Sci., vol. 19, No. 2, Apr. 2, 1988, pp. 159-166.
Gupta et al., "Nanoemulsions: Formation, Properties, and Applications", Soft Matter, vol. 12, No. 11, Feb. 23, 2016, pp. 1-17.
Helgeson et al., "Mesoporous organohydrogels from thermogelling photocrosslinkable nanoemulsions", Nature Materials, vol. 11, Feb. 12, 2012, pp. 1-9.
Guha et al., "Creating nanoscale emulsions using condensation", Nature Communications, vol. 8, Article 1371, Nov. 8, 2017, pp. 1-7.
Meier et al., "Microemulsion elastomers", Colloid and Polymer Science, vol. 274, Mar. 1, 1996, pp. 218-226.
Richter et al., "Design considerations of form birefringent microstructures", Applied Optics, vol. 34, No. 14, May 10, 1995, pp. 2421-2429.
Mahadik et al., "Elastic and Superhydrophobic Monolithic Methyltrimethoxysilane-based Silica Aerogels by Two-step Sol-gel Process", J. Microelectron. and Packaging Soc., vol. 23, No. 1, Mar. 30, 2016, pp. 35-39.
Jeon et al., "Three dimensional nanoporous density graded materials formed by optical exposures through conformable phase masks", Applied Physics Letters, vol. 89, Article 253101, Dec. 18, 2006, pp. 1-3.
Sultan et al., "Electrical Breakdown Testing of Materials Intended for use in PV Modules", 3rd Atlas/NIST Workshop on Photovoltaics, Dec. 8-9, 2015, 29 pages.
Sekitani et al., "Stretchable active-matrix organic light-emitting diode display using printable elastic conductors", Nature Materials, vol. 8, May 10, 2009, pp. 494-499.
Someya et al., "Conformable, flexible, large-area networks of pressure and thermal sensors with organic transistor active matrixes", PNAS, vol. 102, No. 35, Aug. 30, 2005, pp. 12321-12325.
Wegener et al., "Controlled inflation of voids in cellular polymer ferroelectrets: Optimizing electromechanical transducer properties", Applies Physics Letters, vol. 84, No. 3, Jan. 19, 2004, pp. 392-394.
Wu et al., "Fabrication of ultralong perovskite structure nanotubes", RSC Advances, vol. 8, Jan. 2, 2018, pp. 367-373.
Wu et al., "Efficient multi-barrier thin film encapsulation of OLED using alternating Al2O3 and polymer layers", RSC Advances, vol. 8, Feb. 2, 2018, pp. 5721-5727.
Yang et al., "Harnessing Surface Wrinkle Patterns in Soft Matter", Advanced Functional Materials, vol. 20, Jul. 29, 2010, pp. 2550-2564.
Zhang et al., "Highly Porous Polyhedral Silsesquioxane Polymers. Synthesis and Characterization", J. Am. Chem. Soc., vol. 120, Aug. 11, 1998, pp. 8380-8391.
Yang et al., "Avoiding the pull-in instability of a dielectric elastomer film and the potential for increased actuation and energy harvesting", Soft Matter, vol. 13, Jan. 6, 2017, pp. 4552-4558.
Wu et al., "3D Printed Silicones with Shape Memory", Scientific Reports, vol. 7, Article 4664, Jul. 5, 2017, pp. 1-6.
Jang et al., "Mechanically Tunable Three-Dimensional Elastomeric Network/Air Structures via Interference Lithography", Nano Letters, vol. 6, No. 4, Mar. 15, 2006, pp. 740-743.
Rogers et al., "Materials and Mechanics for Stretchable Electronics", Science, vol. 327, Mar. 26, 2010, pp. 1603-1607.
Wolak et al., "Dielectric response of structured multilayered polymer films fabricated by forced assembly", Applied Physics Letters, vol. 92, Article 113301, Mar. 17, 2008, pp. 1-3.
Mackey et al., "Enhanced breakdown strength of multilayered films fabricated by forced assembly microlayer coextrusion", Journal of Physics D: Applied Physics, vol. 42, Article 175304, Aug. 12, 2009, pp. 1-12.
Ieda, Masayuki, "Dielectric Breakdown Process of Polymers", IEEE Transactions on Electrical Insulation, vol. EI-15, No. 3, Jun. 1980, pp. 206-224.
Matyka et al., "How to Calculate Tortuosity Easily", AIP Conference Proceedings, vol. 1453, May 14, 2012, 6 pages.
Fratzl et al., "The mechanics of tessellations—bioinspired strategies for fracture resistance", Chem Soc Rev., vol. 15, No. 2, Jan. 21, 2016, pp. 252-267.
Cameron et al., "Linear actuation in coextruded dielectric elastomer tubes", ScienceDirect, Sensors and Actuators A: Physical, vol. 147, Issue 1, Sep. 15, 2008, pp. 286-291.
Sole et al., "Nano-emulsions prepared by the phase inversion composition method: Preparation variables and scale up", ScienceDirect, Journal of Colloid and Interface Science, vol. 344, Issue 2, Apr. 15, 2010, pp. 417-423.
Cheng et al., "Controlled In Situ Nanocavitation in Polymeric Materials", Advanced Materials, vol. 23, Issue 3, Jan. 18, 2011, pp. 409-413.
Solans et al., "Nano-emulsions: Formation by low-energy methods", ScienceDirect, Current Opinion in Colloid & Interface Science, vol. 17, No. 5, Oct. 1, 2012, pp. 246-254.
Gohtani et al., "Nano-Emulsions; Emulsification Using Low Energy Methods", Japan Journal of Food Engineering, vol. 15, No. 3, Sep. 1, 2014, pp. 119-130.
Michler et al., "The physics and micro-mechanics of nano-voids and nano-particles in polymer combinations", ScienceDirect, Polymer, vol. 54, No. 13, Jun. 7, 2013, pp. 1-14.
International Preliminary Report on Patentability received for PCT Application Serial No. PCT/US2019/064367 dated Jun. 24, 2021, 10 pages.
Final Office Action received for U.S. Appl. No. 16/262,433 dated May 25, 2021, 30 pages.
Nilson et al., "Variable Wave Plate via Tunable Form-Birefringent Structures", Journal of Microelectromechanical Systems, vol. 17, No. 4, Aug. 2008, pp. 1039-1046.
International Preliminary Report on Patentability received for PCT Application Serial No. PCT/US2019/064395 dated Jun. 24, 2021, 10 pages.

70% Void Fraction

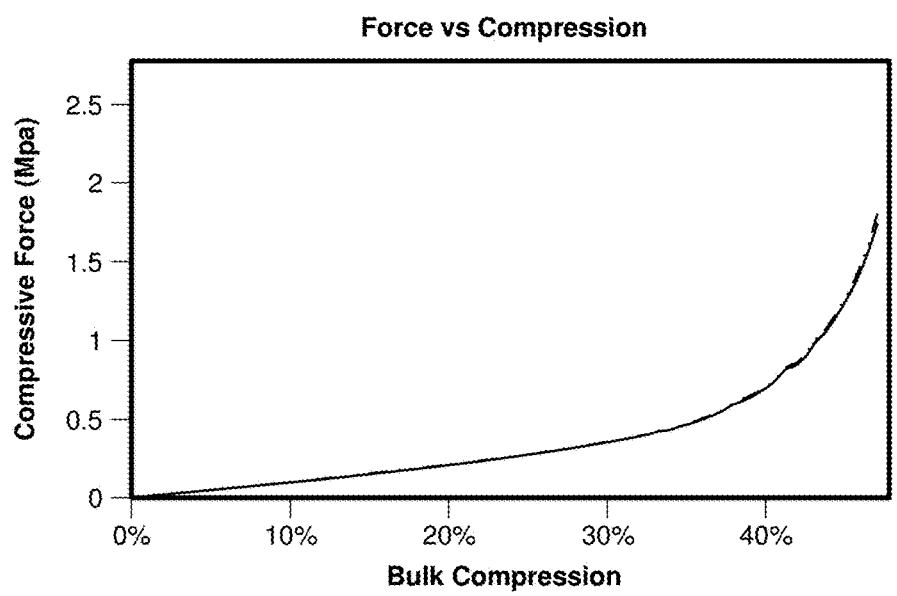
FIG. 17
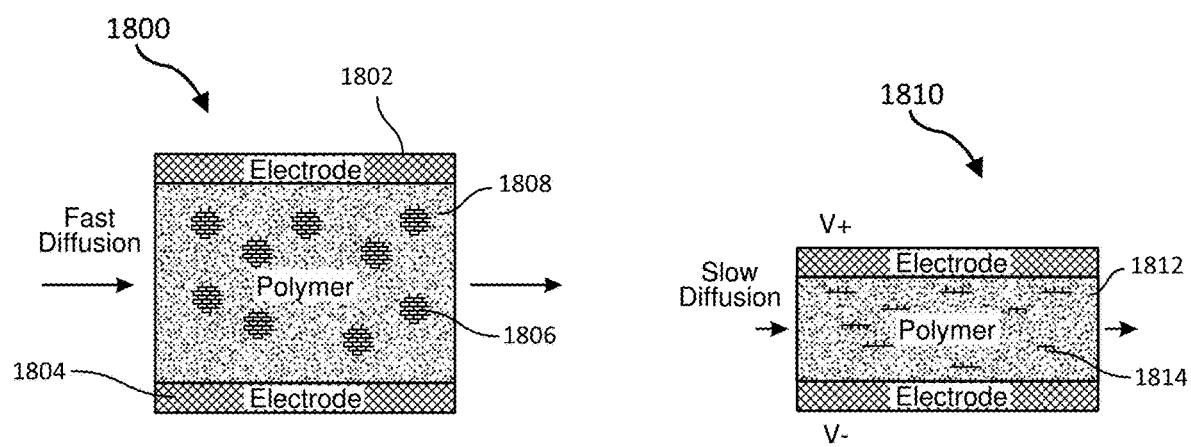
FIG. 18A
FIG. 18B

REDUCED HYSTERESIS AND REDUCED CREEP IN NANOVOIDED POLYMER DEVICES

CROSS REFERENCE TO RELATED APPLICATION

This application claims the benefit of U.S. Provisional Application No. 62/777,825, filed Dec. 11, 2018, the disclosure of which is incorporated, in its entirety, by this reference.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

FIG. 17 depicts advantageous performance in an actuator that satisfies the rapid air pressure equilibrium criterion in accordance with some embodiments.

FIGS. 18A and 18B depicts an example in which a nanovoided polymer is used a diffusion switch, in accordance with some embodiments.

Figure 1A:
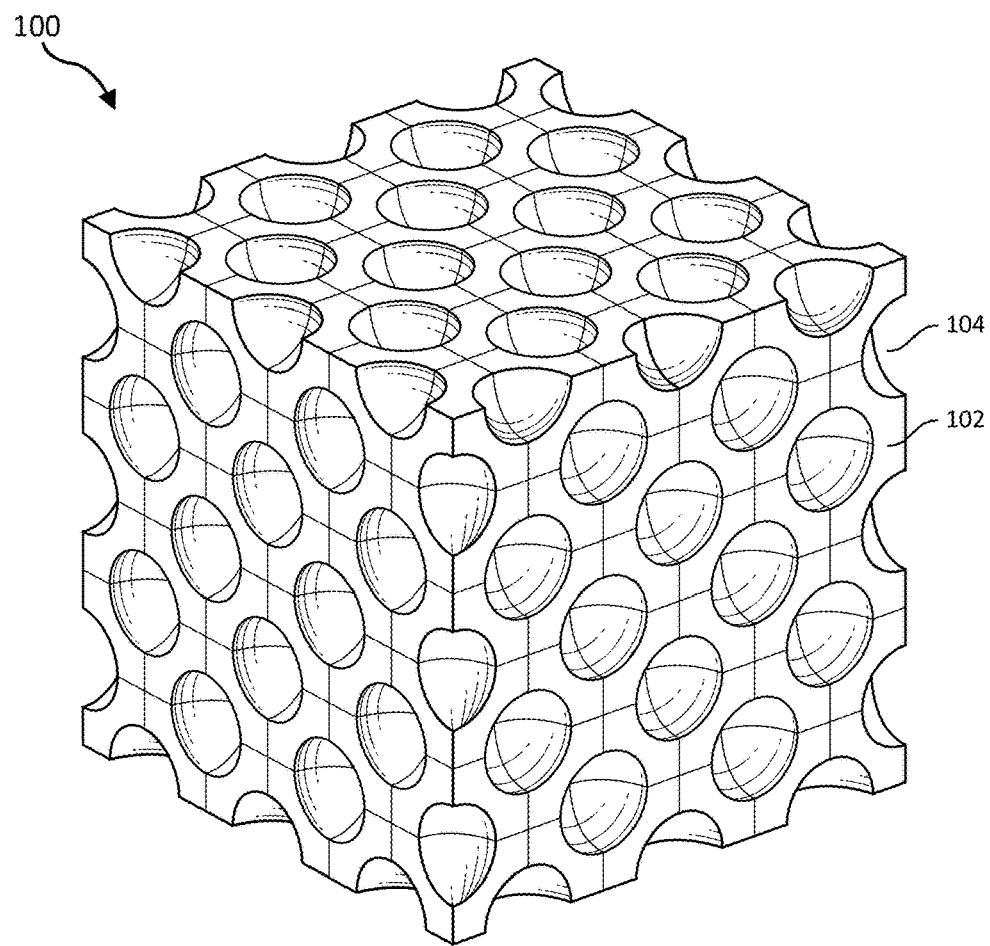
FIGS. 1A-1B depict an NVP element with spherical voids, showing variations in wall thickness.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Polymer materials may be incorporated into a variety of different optic and electro-optic architectures, including active and passive optics and electroactive devices. Electroactive polymer (EAP) materials, for instance, may change their shape under the influence of an electric field. EAP materials have been investigated for use in various technologies, including actuation, sensing, and/or energy harvesting. Lightweight and conformable, electroactive polymers may be incorporated into wearable devices (such as haptic devices) and are attractive candidates for emerging technologies, including virtual reality/augmented reality devices where a comfortable, adjustable form factor is desired.

Virtual reality (VR) and augmented reality (AR) eyewear devices or headsets, for instance, may enable users to experience events, such as interactions with people in a computer-generated simulation of a three-dimensional world or viewing data superimposed on a real-world view. VR/AR eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of thin film polymer materials, including their electrical, mechanical, and/or optical properties. There is a need, for example, for improved actuators, sensors, and optical elements, along with associated methods for applications in AR and VR devices.

The present disclosure is generally directed to nanovoided polymers (NVP), electroactive NVP elements, methods of preparing NVP elements, and devices, methods, and systems including electroactive materials, such as NVP elements. Embodiments of the instant disclosure may include nanovoided polymers, layers thereof, electroactive and/or sensor elements including such nanovoided polymers, applications of nanovoided polymers in devices such as actuators, optical elements (which may include actuators), sensors, and combinations thereof, methods of fabrication of any of the above, and methods of operating any such device.

In some examples described herein, the term voided polymer may refer to a material including a polymer matrix and including voids within the polymer matrix. In some examples, the term "void" may refer to a volume of fluid material within the polymer matrix. For example, a void may include a gas (such as air, nitrogen, an inert gas, or the like), a liquid, or other fluid medium, such as a foam. Voids may include nanovoids, which may include voids having at least one interior dimension (such as a diameter or other analogous interior dimension) that is less than approximately 1 micron. A polymer matrix may include one or more polymer components, and may include other non-polymer components, such as nanoparticles and the like.

Figure 7:
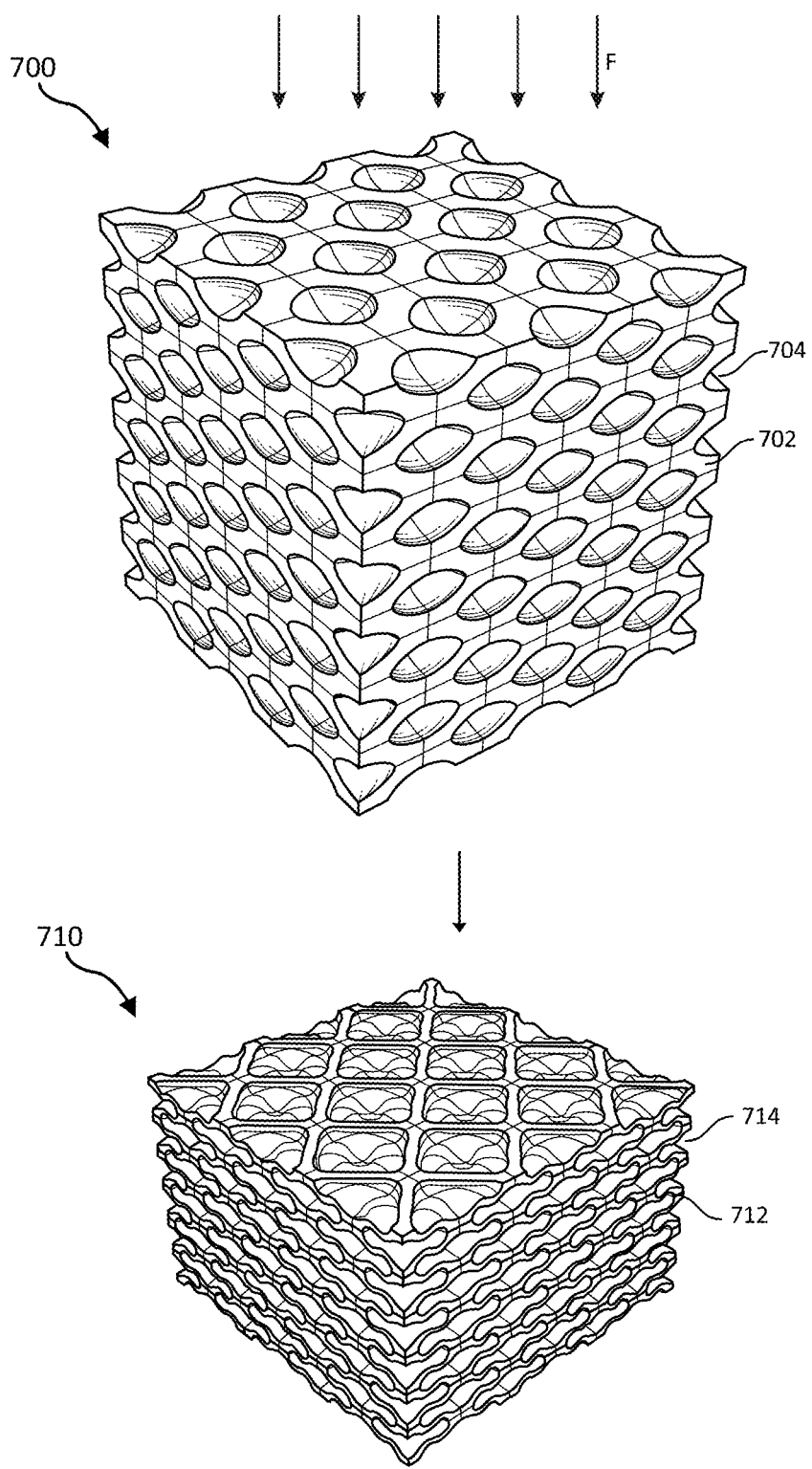
FIG. 7 depicts a nanovoided polymer under compression in accordance with some embodiments.
Figure 8:
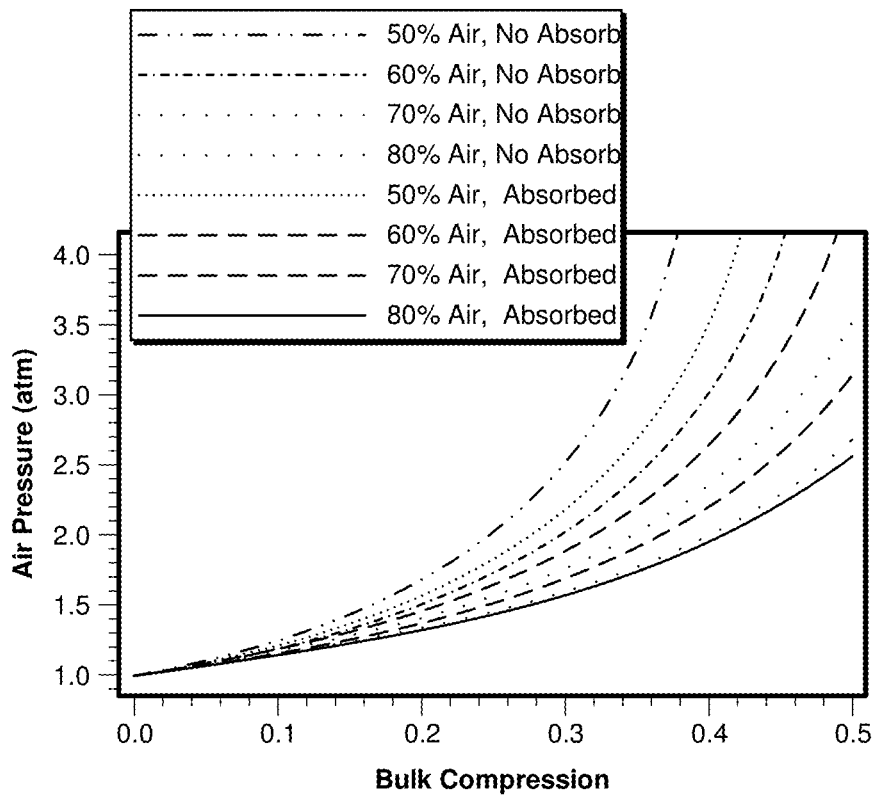
FIG. 8 depicts the linear scale version in accordance with some embodiments.
Figure 9:
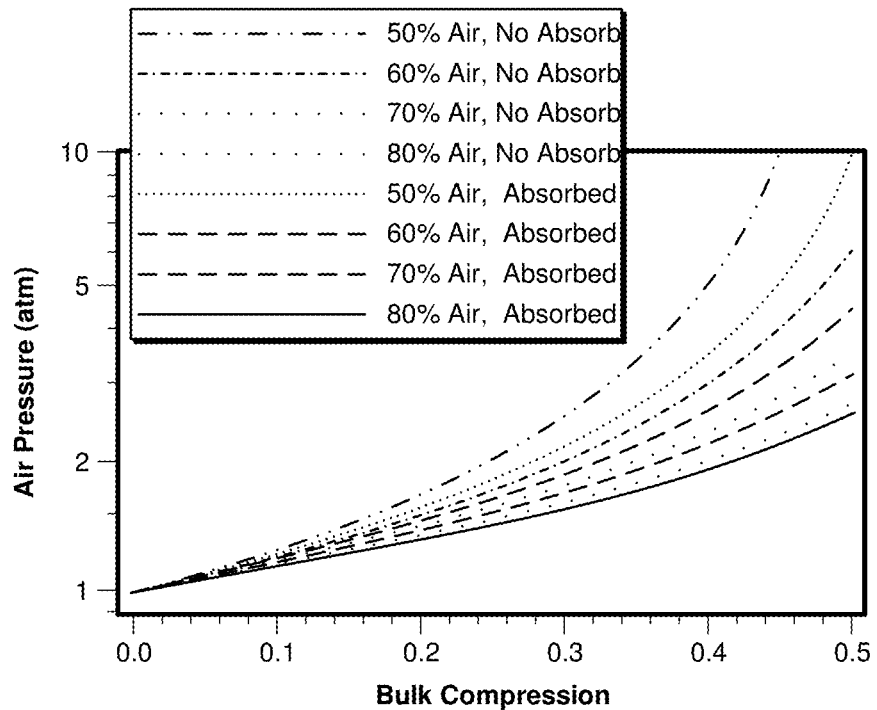
FIG. 9 depicts the log scale version in accordance with some embodiments.
Figure 15:
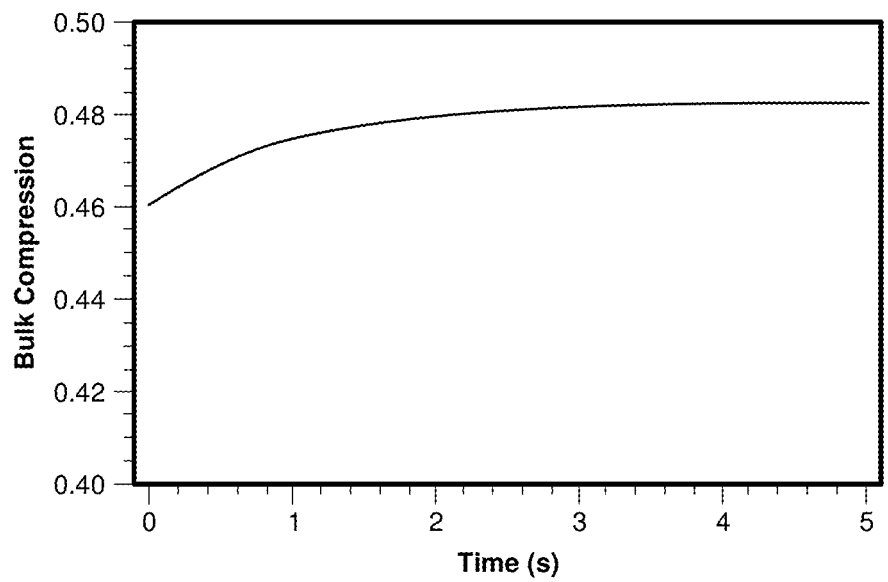
FIG. 15 depicts creep in a nanovoided actuator in accordance with some embodiments.
Figure 16:
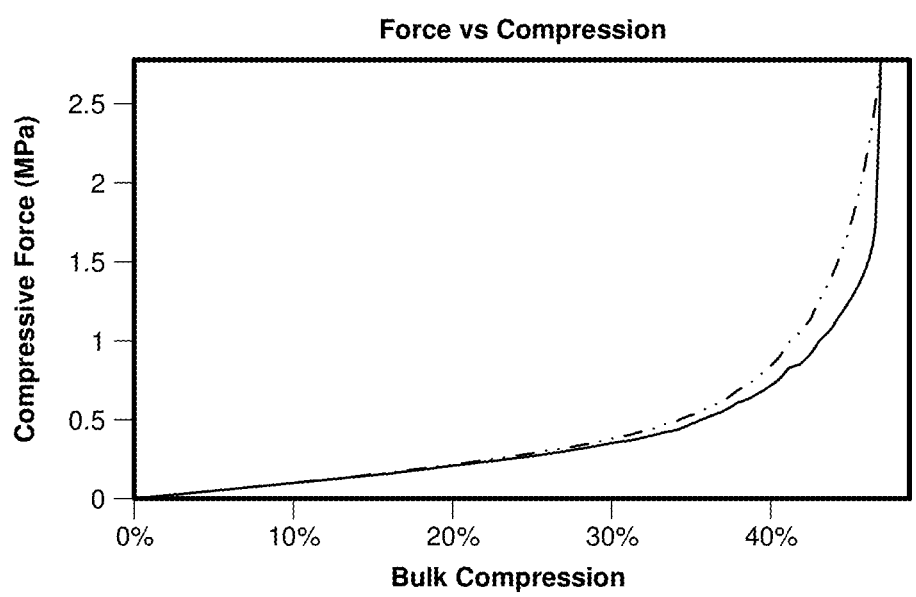
FIG. 16 depicts a typical example of undesirable hysteresis.
Figure 19:
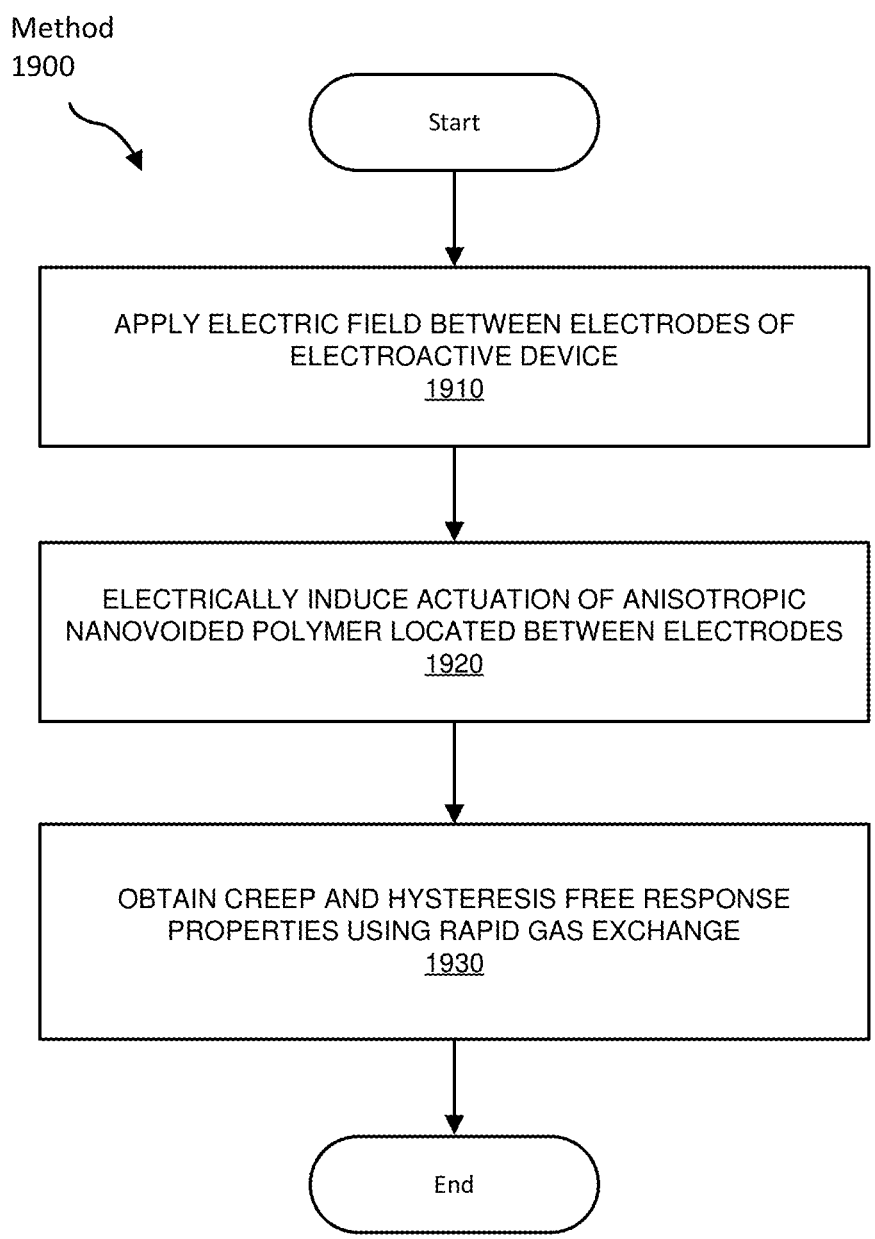
FIG. 19 shows an example method, for example, related to operation of an NVP element.
Figure 20:
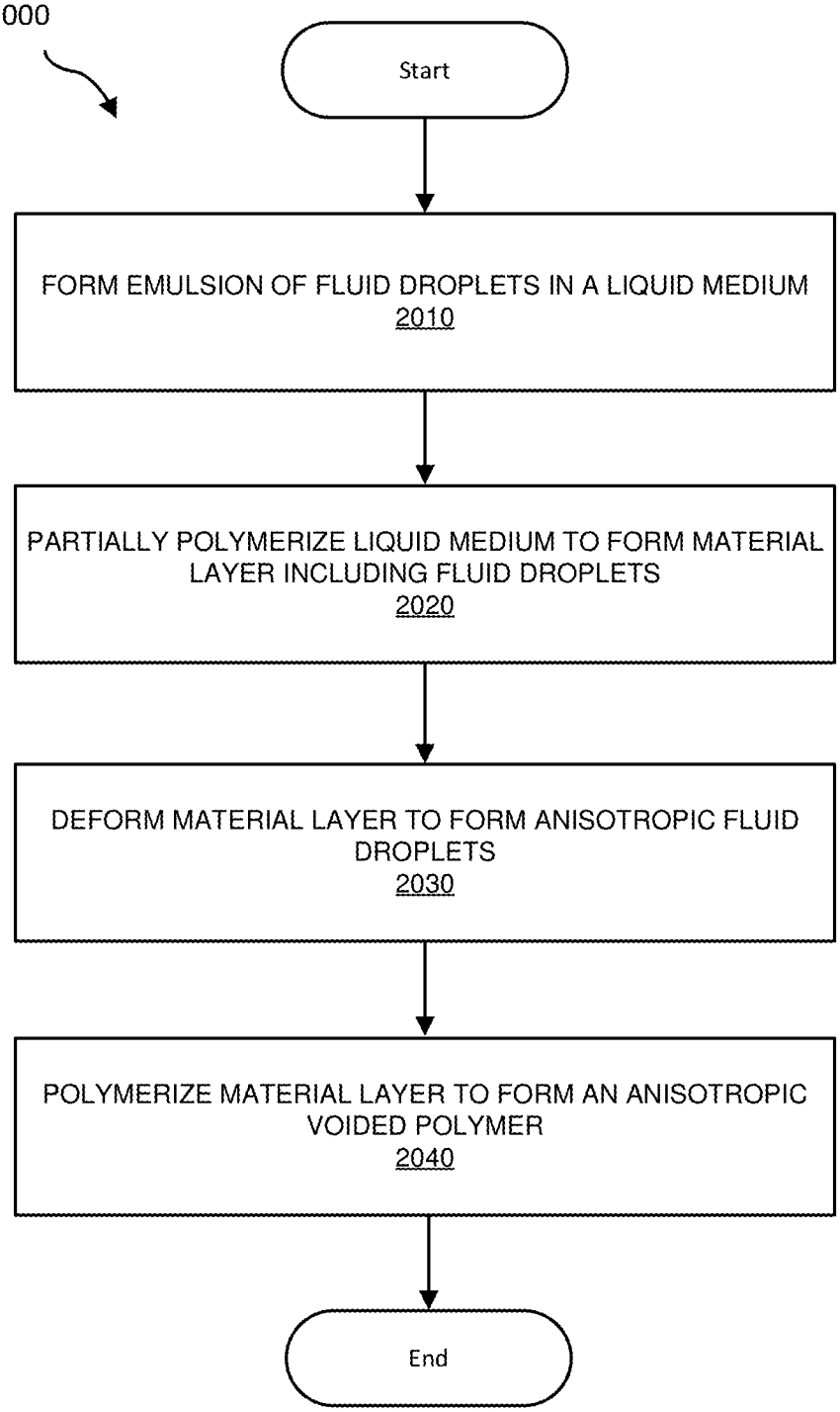
FIG. 20 illustrates an example method, for example, of forming a voided polymer.
Figure 24:
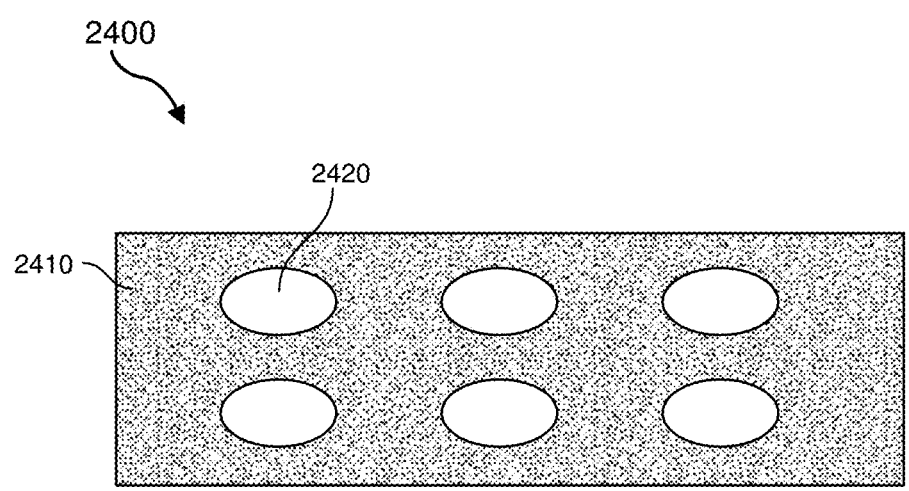
FIG. 24 shows a voided polymer material including a periodic array of voids.
Figure 25:
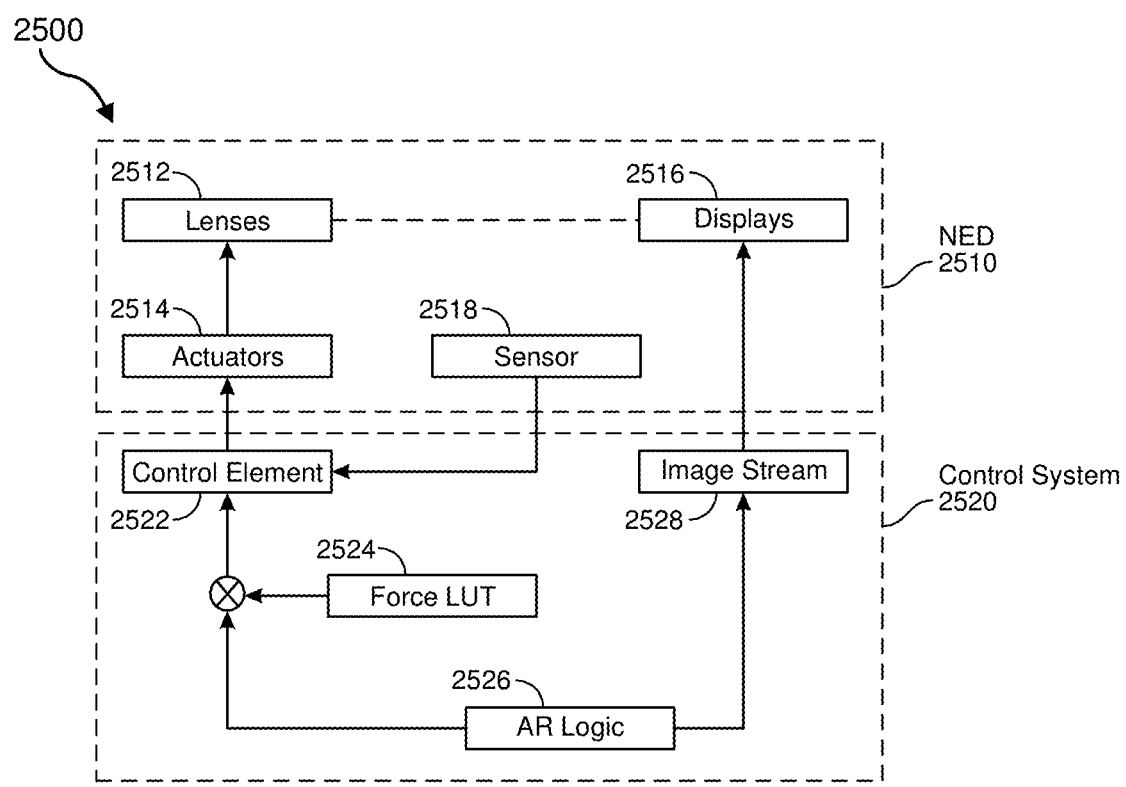
FIG. 25 illustrates an example control system.

The following will provide, with reference to FIGS. 1-30, detailed descriptions of, for example, voided polymer films, their preparation, and applications. FIGS. 1A-6C illustrate example nanovoided polymer elements, wall thickness variations, gas diffusion and absorption, and example buckling deformations. FIGS. 7-9 illustrate compression properties of a nanovoided polymer. FIGS. 10-13 illustrate variations in void fraction. FIGS. 14A-14G illustrate the effects of void fraction, polydispersity, and anisotropy on compression properties. FIGS. 15-17 illustrate hysteresis and creep, and their prevention. FIGS. 18A-18B illustrate a flow modulator. FIGS. 19-20 show example methods. FIGS. 21A-23 show example electrode configurations. FIG. 24 shows an example arrangement of anisotropic nanovoids. FIG. 25 shows an example control system, and FIGS. 26-30 illustrate example augmented reality and/or virtual reality devices that may incorporate the examples described herein, and which may, in some examples, include haptic elements.

As will be described in greater detail below, examples applications of the concepts described in the instant disclosure include electroactive devices, such as NVP elements, actuators, sensors, and optical elements, having, for example, improved electrical and/or mechanical properties, such as improved electrical control of actuation and/or improved spatial resolution of sensing. Features from any of the embodiments described herein may be used in combination with one another in accordance with the general principles described herein.

In some examples, a method of fabricating a nanovoided polymer includes depositing a precursor composition onto a substrate. The substrate may include one or more components and/or layers subsequently used in a device, such as a polymer layer, electrode, or the like. In some examples, the fabricated nanovoided polymer may be released from the substrate before further processing. The precursor composition may include at least one polymerizable species, such as one or more monomer molecular species, or one or more oligomer molecular species. The precursor composition may also include a liquid in which the monomer dissolves and/or a liquid immiscible with the monomer (or which does not dissolve the monomer, for example, if the monomer is solid, and which in some examples may not mix with any solvent used to dissolve the monomer). In some examples described herein, a polymerizable species may be referred to as a monomer for conciseness, though examples are not limited to the use of monomers, as other polymerizable species may be used, such as oligomers. In some examples, the term oligomers may include dimers, trimers, and the like.

Nanovoided polymers may include new classes of materials, for example, materials in which a polymer matrix includes fluid-filled voids, such as gas-filed voids. In some examples, voids may include nanovoids that may have an average diameter (or analogous dimension) between approximately 10 nm and approximately 1000 nm (1 micron). The introduction of nanovoids into the bulk polymer film provides an added degree of material property tunability, for example, in terms of overall macroscopic properties, including electrical, mechanical, thermal, diffusive, and/or chemical properties.

Voids may be formed in a material from the inclusion of a fluid (such as a gas or liquid), and the fluid may naturally form spherical shapes (e.g., spherical droplets) to minimize surface energy. A material, such as an emulsion, including spherical droplets may be used to form a voided polymer (e.g., a nanovoided polymer) including spherical voids. However, anisotropic voids in polymers may provide materials that are favorable for various applications, for example, where the material is compressed, and may also modify how the material interacts with light. An anisotropic NVP may include nanovoids elongated in at least one direction, such as a direction approximately perpendicular to a direction of an applied electrical field (when a potential is applied between electrodes), or perpendicular to a direction of compression (e.g., a compression that may result from electrostriction, or a compression that may be detected in a sensor device). Voids having an average diameter (or analogous dimension) of less than approximately 1 micron (1000 nm) may be termed nanovoids. Application of an electric field to a nanovoided polymer element may induce compression along a compression direction parallel to the electric field. Application of a mechanical compression to a nanovoided polymer element may induce an electric field, for example, when configured as a sensor.

In some examples, an improved nanovoided polymer may be configured with a form-fitting void shape that improves the uniformity of the wall thicknesses. For example, a non-spherical void shape may be configured such that the wall thickness is more uniform across all surfaces.

A number of approaches may be used to design a void shape for a more uniform wall thickness. In some examples, the polymer may be divided into partitions based on a distance to the nearest void, for example, using a Voronoi tessellation. A form-fitting shape may then be designed for each partition using one or more of the following methods: subtracting a rescaled smaller version of the partition shape; rounding off the corners of the partition shape with a fillet, possibly after rescaling as described above; or creating an approximation to the partition shape using a technique such as Catmull-Clark subdivision, Loop subdivision, or a B-spline.

Uniform wall thicknesses may also be obtained using random packing or a periodic lattice arrangement of a 3D space with non-spherical shapes through one or more of the following approaches: using an arrangement of similar void shapes (e.g., generally identical void shapes), for example, with a random arrangement, quasi-random arrangement, or a periodic arrangement; adding random distortions to a base void shape with a random arrangement or a periodic arrangement; either of the above, for example, with the void shape scaled to a distribution of different sizes; or any of the above, with a combination of two or more different void shapes.

In some examples, a nanovoided polymer element includes voids having an anisotropic shape. Adding anisotropy may improve the nanovoided polymer element by reducing the buckling instability. A flattened void shape, such as an oblate spheroid or a "pancake" shaped void, may be obtained by stretching the void shape in one or dimensions relative to the other(s).

Example devices (such as actuators or sensors), device components (such as electroactive elements), methods of operating devices, fabrication methods and the like include (or allow the provision of) reduced hysteresis and/or reduced creep, for example, in nanovoided polymer actuators.

In some examples, a device, such as a polymer actuator, includes a nanovoided polymer element, and the nanovoids may include a gas such as air, nitrogen, an inert gas, or a dielectric gas. The use of a nanovoided polymer element may allow for the construction of a device with reduced hysteresis and/or creep. The relatively small size of the nanovoids (e.g., with a dimension smaller than 1 micrometer) may enable a rapid exchange of gas between the nanovoids and the surrounding polymer matrix, which may provide more desirable operating properties compared with the use of larger voids.

An example functional material includes a nanovoided polymer with a mean wall thickness that is sufficiently small. In some examples, the voids are distributed periodically throughout the polymer layer. In some examples, the voids are distributed throughout the polymer layer with no long-range periodicity. A nanovoided polymer may be formed into a nanovoided polymer element, which may be electroactive and used in an actuator. The material, for example, in the form of a nanovoided polymer element, may be constrained to prevent expansion or contraction in one or more directions. The nanovoided polymer may be used as the dielectric layer in an electrostatic actuator, or as a dielectric layer in an actuator that operates via mechanical actuation. A dielectric layer may be an electroactive layer that may show actuation (e.g., compression) under an electric field.

In some examples, a nanovoided polymer material may include one or more of the following: a silicon-containing polymer (such as a siloxane polymer, such as PDMS, or other silicone polymer such as other organosilicon polymers) or an acrylic polymer. A nanovoided polymer material may be an elastomer. A nanovoided polymer material may be a thermoset polymer. In some examples, the inner surfaces of voids may be coated with a surfactant and/or fluoro-carbon (such as a fluoropolymer) to reduce interactions (e.g., to reduce sticking between inner surfaces if they come into contact during compression). In some examples, a nanovoided polymer may be actuated through compression or tension along one dimension. In some examples, a nanovoided polymer material may be actuated through compression or tension along two dimensions, such as two orthogonal dimensions. A voided polymer, such as a nanovoided polymer material, may be pre-tensioned and/or pre-stretched.

In some examples, a device, such as a polymeric actuator or sensor, may include a nanovoided polymer. The actuator may operate in response to electrostatic forces or via mechanical actuation. In some examples, an actuator may be an electroactive device including an electroactive polymer element, which may, for example, compress under application of an electric field.

An actuator may compress to reduce, for example, its height, or the thickness of an electroactive element including a nanovoided polymer. An electroactive element under compression may expand laterally unless constrained. If an actuator element is a solid polymer material which is constrained so that it cannot expand laterally, the force required to compress the solid polymer material may be significantly increased, and may be unfeasibly high if the solid polymer material is close to incompressible. However, if the polymer material (e.g., used for the actuator) is voided with many small pockets of gas (e.g. includes gas-filled nanovoids), it may take significantly less energy to compress the gas in the voids than to compress the solid polymer material.

Nanovoids may allow the stress-strain relationship of the material to be adjusted, for example, for more precise control over how much the material compresses in response to a given electric field. For some applications, an ideal actuator will reproducibly compress the same amount in response to a given electric field. In a real device, the device response may deviate from this ideal and depend on the recent actuation history, such as whether the actuator is expanding or compressing.

In some examples, a polymer actuator is filled with voids at an initial state, and the actuator may be sealed so the amount of gas is fixed. Some gas occupies the voids, and some gas is absorbed into the solid polymer. The actuator may compress or expand to reach a new state. In the short term, the gas trapped in the voids may behave like an ideal gas and change its pressure inversely to the volume change in the void. On a longer timescale, the gas may redistribute itself between the voids and the amount absorbed into solid polymer so that an equilibrium is reached.

If the voids are relatively large (e.g., millimeter scale or larger), then the gas exchange between a void and solid polymer may occur on a much slower timescale than the actuation motion. After moving the actuator (e.g., from an uncompressed state to a compressed state, induced by an electric field), the pressure in the gas in the voids may quickly change based on the volume change from the actuator movement. This pressure might not be stable over time as gas slowly moves from the void into or out of the polymer solid. However, if the nanovoids are configured to be sufficiently small (e.g., having a diameter or analogous dimension of less than 1 micron), then the gas interchange between voids and surrounding polymer matrix may occur nearly instantaneously. The relative smallness of void size scale may enable the design and fabrication of polymer actuators that are not susceptible to hysteresis and creep effects caused by gradual absorption of gas into the polymer (or desorption of gas out of the polymer).

Hysteresis in actuators has long been a problem. There are many causes of hysteresis, and some of the examples described herein address issues related to the physical phenomenon of gas absorption into a void-filled polymer. Methods of reducing hysteresis include attempting to compensate for hysteresis based on altering the input signal. This approach attempts to mitigate one of the physical mechanisms that can cause hysteresis. For this application, the actuator operates on the expansion and contraction of a voided polymer in a confined space, and it is useful to eliminate the above-mentioned form of hysteresis.

An actuator may include a mechanical component which moves in response to an input signal, such as an electrical signal provided by a controller. The degree of actuation (e.g., the amount of movement, deformation such as compression, or other physical change) may be based on the amplitude of the input signal. Ideally, the degree of actuation is a predictable function of the input signal magnitude. However, the degree of actuation may be susceptible to creep and/or hysteresis. Creep may include, for example, a time-dependent change in the degree of actuation, for example, in response to a given load. Hysteresis may include a dependence of the degree of actuation (e.g., for a given input signa) on the history of previous loading conditions of the actuator.

There may be many causes of hysteresis. In some examples, when an actuator is held in one state, the gas in the voids may be partially absorbed into the polymer, in equilibrium with this state. If the actuator is then rapidly moved to another state, it is possible for the pressure in the voids to have a lagging response in achieving a new equilibrium at the new state.

A nanovoid may be a hole (void) in a solid polymer that is filled with air or an inert gas. A "nanovoid" may be a void having a diameter or other dimension that is less than approximately 1 micrometer. Nanovoids may have a diameter or other dimension that is greater than, for example, 1 nanometer (nm), such as great than 10 nm. A nanovoided polymer may have a void fraction, which may be defined as the volume fraction of the nanovoided polymer (e.g., for an actuator in its original uncompressed state) that is occupied by air or an inert gas.

Voids, such as nanovoids, may include a non-self-reacting gas, which may be gas that does not exhibit strong reactions or molecular interactions with itself. Such a gas may exhibit a relation involving pressure, temperature, and volume that is close to the ideal gas law. Many different equations of state have been proposed as alternatives to the ideal gas law including Peng-Robinson, Redlich-Kwong, Van der Waals, or a virial expansion. The model used for the equation of state may be considered irrelevant, only that the behavior of the gas is sufficiently close to the ideal gas approximation, which will occur if the gas molecules do not exhibit strong molecular interactions.

In some examples, a nanovoided polymer has a "sufficiently thin" wall thickness, where, for example, the gas occupying the voids is in equilibrium with the gas absorbed in the polymer. In some examples, any of the following relationships may be used for "sufficiently thin": a wall thickness of less than 1 micron; a characteristic diffusion time of less than 1 millisecond; or a characteristic diffusion time that is 10 times (or, in some examples, 100 times) shorter than the actuator's movement time.

A device, such as a polymer actuator, may include one or more nanovoided polymer elements. A nanovoided polymer may include one or more polymers, such as a silicone polymer (e.g., polydimethylpolysiloxane, or PDMS), or an acrylate polymer. The nanovoided polymer may include an elastomer, and may include nanovoids (holes) including a gas, such as air or an inert gas. The nanovoids may occupy a relatively large volume fraction of the polymer, for example, more than 30% of the volume, such as more than 50%, and in some examples more than 70%. In some examples, the volume fraction of nanovoids may be in the range of approximately 50% to approximately 80%. A high void fraction may be chosen so that the nanovoided polymer may show a greater electroactive response (e.g., electroconstriction) for a given electric field strength, compared with a solid polymer. The greater electroactive response may arise due to the relative ease of compressing the gas in the voids, compared with the solid polymer.

Example nanovoided polymers with small (e.g., nanoscale) voids may show remarkable and surprising improvements in performance, if the exchange of gas into the solid polymer occurs on a faster timescale than the actuator motion. If this condition holds, then the absorption of gas into the polymer may be considered as effectively instantaneous. In some examples, the performance improvement may not be associated with any specific shape of the nanovoids, as long as the wall thickness of polymer separating the voids is less than a certain length, which may depend on the material properties of the polymer as described in the analysis that follows. Physical criteria are described below that facilitate the fabrication of sufficiently small nanovoids so as to reap the benefits of reduced hysteresis and creep that arise from fast gas exchange between the nanovoids and the polymer.

In some examples, voids may be sufficiently small so that gas diffusion occurs faster than the actuator movement. In some examples, "sufficiently small" may include one or more of the following conditions: a void diameter or similar internal dimension of less than 1 micron; a polymer wall thickness (e.g., between neighboring voids) of less than 1 micron; a characteristic diffusion time of less than 1 ms; or a characteristic diffusion time that is 10 times (in some examples, 100 times) shorter than the actuator's movement time. The wall thickness may be influenced by a combination of both the mean void size and the void fraction. In general, if the mean void size is held constant, then the walls may be thinner if void fraction is increased, as there is more void volume (gas) and less solid in the nanovoided polymer. In some examples, a wall thickness may be sufficiently thin if it is less than approximately 5 microns, for example, less than approximately 2 microns, for example, less than approximately 1 micron.

In some examples, the characteristic diffusion time may satisfy the requirement below (Equation 1):

$$\left(\frac{\text{Wall thickness}}{2}\right) \le 2\sqrt{D * \text{Characteristic diffusion time}}$$

where D is the diffusion coefficient for gas in the polymer used for the solid in the actuator.

The diffusion of gas in a polymer follows Fick's Law of Diffusion (Equation 2):

$$\frac{\partial C}{\partial t} = D\frac{\partial^2 C}{\partial x^2}$$

where:
C=concentration of air or inert gas
D=diffusion coefficient, determined from literature
t=time
x=position The classical solution to this diffusion equation in one dimension, with a gas (such as air) at a fixed concentration on one boundary, shows that the gas moves through the polymer with a characteristic diffusion length proportional to the square root of time (Equation 3):

$$\text{Diffusion Length} \approx 2\sqrt{Dt}$$

Thus, in various embodiments, a gas may diffuse into the polymer walls much faster than the response time of an actuator (e.g., a response time of an actuator to a control signal). In some examples, a characteristic diffusion time may be 10 times faster, or one order of magnitude faster, than a device response time, such as an actuation time. In some examples, the characteristic diffusion time may be 100 times faster than the device response time. The diffusion length in this example may be half of the wall thickness, because gas may enter the polymer wall from both sides. The wall thickness in the polymer actuator may vary from point to point. Wall thickness can be estimated using one or more of the following approaches: as the average (mean) wall thickness; the median wall thickness; the wall thickness at the thickest point; or an average of representative thickest and thinnest wall thicknesses.

If the criterion is satisfied for the thicker estimate of the wall thickness, it is also satisfied for any criterion that results in a smaller wall thickness estimate. Assuming, for example, that this time is less than one-tenth of the actuator response time gives the following expression (Equation 4):

$$(\text{Wall thickness}/2) < 2\sqrt{D * \frac{\text{Actuator movement time}}{10}}$$

FIG. 1A shows a portion of a polymer element 100 having an arrangement of voids 104 within a polymer matrix 102. The figure shows a uniform arrangement of spherical voids. The illustrated portion may repeat in all directions.

Figure 1B:
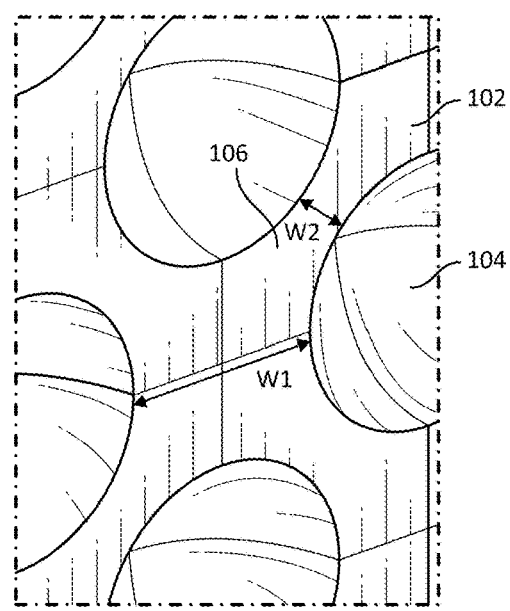

FIG. 1B shows a detailed view showing that the use of spherical voids 104 may lead to a high variation in the thickness of walls (such as wall 106) formed between neighboring voids by the polymer matrix 102. Walls may have relatively thick portions (e.g., of width W1) and thin portions (e.g., of width W2), as shown.

Examples of a nanovoided polymer, including PDMS with air-filled voids, are now considered. In some examples, the thickest portion of the wall may be in the range 40 nm-100 nm, such as 50 nm-80 nm. However, the NVP properties may not depend on the dimensions of the thickest portion.

Air includes, primarily, oxygen and nitrogen. The diffusion coefficients D for oxygen and nitrogen in PDMS are both assumed to be approximately $3.4 \times 10^{-5}$ cm$^2$/s.

The diffusion length for air in PDMS is given by Equation 3, discussed above, namely:

Diffusion Length$\approx 2\sqrt{Dt}$

The time scale of actuator motion may be on the order of tens of milliseconds, so if air diffuses in 1 ms or faster this may satisfy the criterion that the time scale for gas diffusion is much faster than the actuation time. In this time, air in PDMS can diffuse a length of:

$2\sqrt{Dt} = 3.7$ microns

As long as the wall half-thickness is less than 3.7 microns, the rapid air exchange assumption holds true for PDMS actuators. Hence, in some examples, an improved actuator may include a nanovoided polymer element in which the wall half-thickness is less than approximately 3.7 microns, and in some examples the wall half-thickness may be less than approximately 1 micron, and may be less than approximately 500 nm. In some examples, an improved actuator includes a nanovoided polymer element in which the wall thickness is less than approximately 7.5 microns, and in some examples, the wall thickness may be less than approximately 2 microns, and in some examples may be less than approximately 1 micron.

Figure 2:
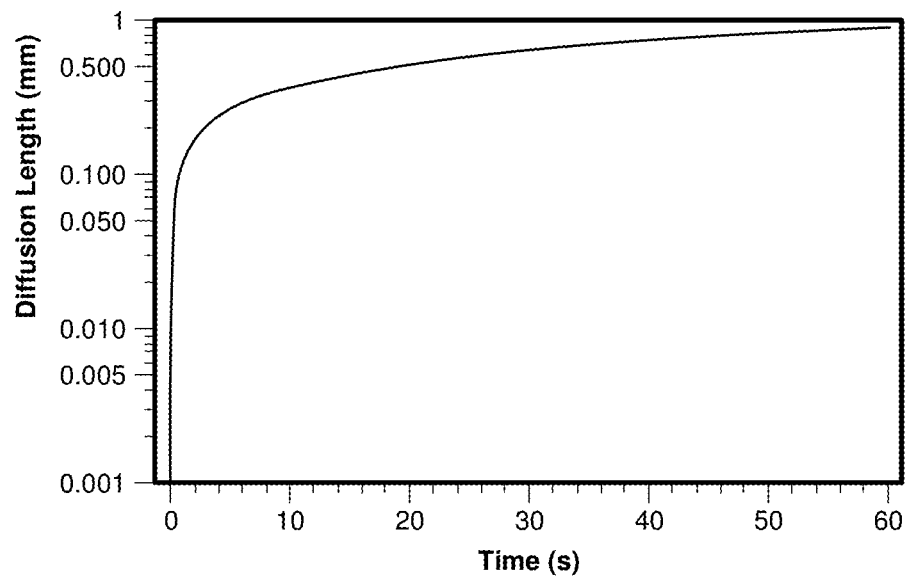
FIG. 2 depicts the characteristic diffusion length for air in polydimethylsiloxane (PDMS) versus time in accordance with some embodiments.

FIG. 2 shows the characteristic diffusion length for air in PDMS (polydimethylsiloxane) versus time.

Figure 3:
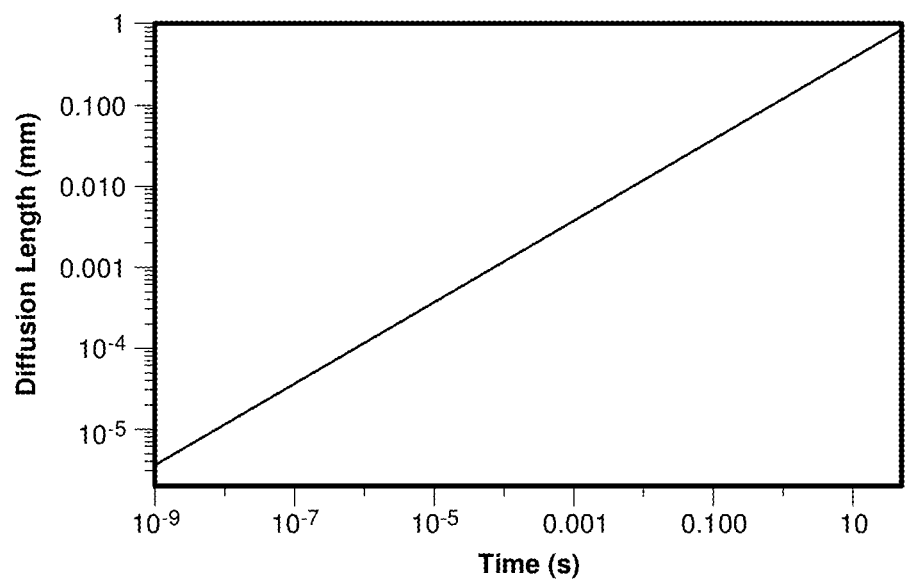
FIG. 3 depicts an equivalent curve using a log-log scale in accordance with some embodiments.

FIG. 3 shows similar data as FIG. 2, plotting the data on a log-log scale so that the behavior at sub-millisecond time scales is more apparent. The figure shows that the characteristic diffusion length is proportional to the square root of time. If the wall half-thickness were 100 microns, it would take air about 1 second to diffuse through. An example actuator may have an actuation time measured in tens of milliseconds, so in this case the 1 second diffusion time is much slower than the actuation time. Therefore, it is desirable that the characteristic diffusion time is on the order of milliseconds. The characteristic diffusion time may be less than the device response time (e.g., actuation time) if the polymer walls have a sub-micron thickness.

The diffusion coefficient D is higher for air in PDMS than air in many other polymers. A brief survey of nitrogen diffusion in various elastomers suggest that for many other candidate materials, the diffusion coefficient D may be 10-100 times lower than for PDMS, in some examples 100-1000 times lower, or in some examples 1000-10000 times lower. If D is 100 times smaller, the diffusion length varies with the square root of D, which is 10 times smaller. In this example, a wall half-thickness of 370 nm (corresponding to a wall thickness of 740 nm) between voids may be sufficiently small (which may also be referred to as sufficiently thin), for example, for a material with a diffusion coefficient D that is 100 times smaller than for PDMS.

Figure 4:
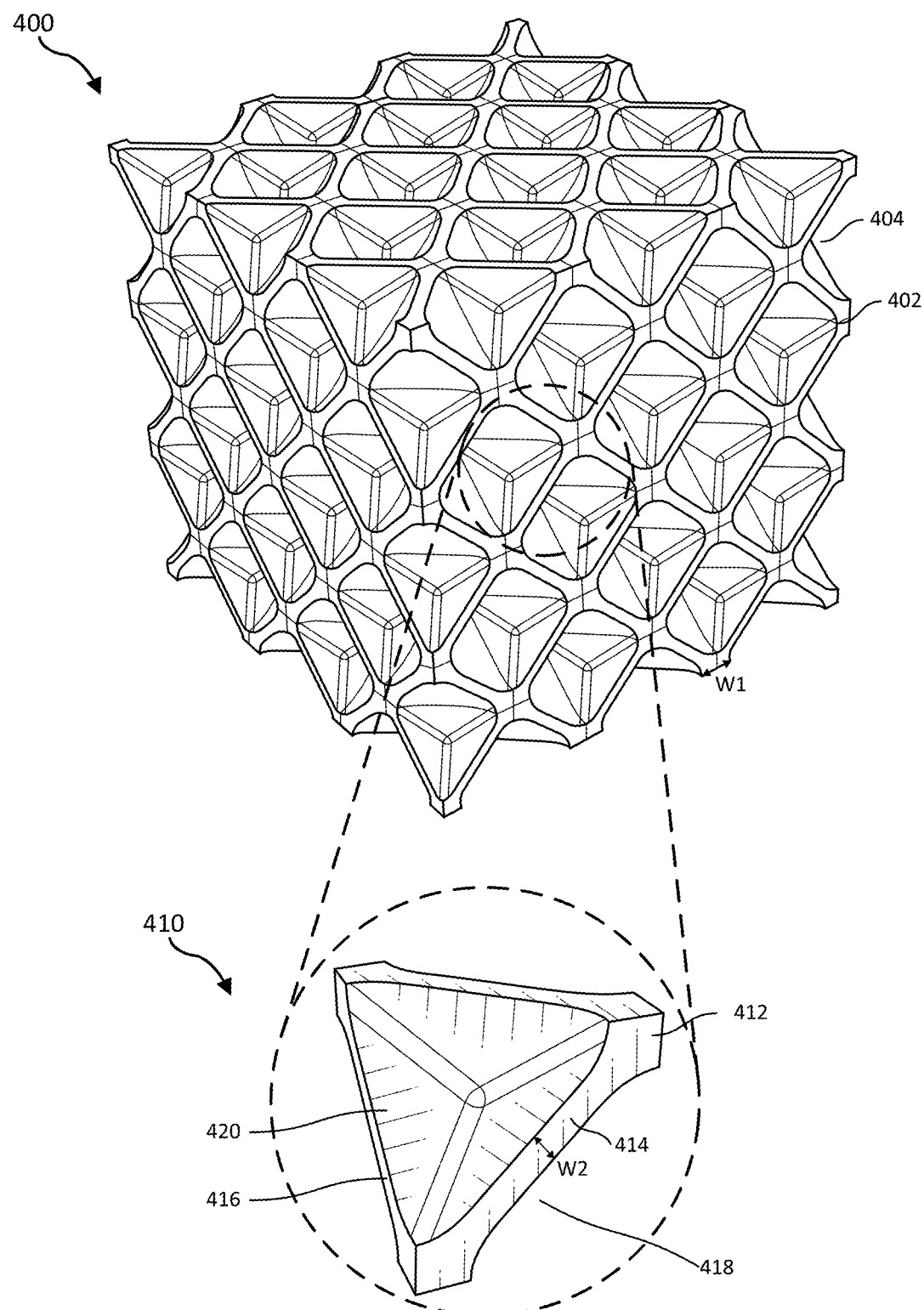
FIG. 4 depicts an example nanovoided polymer with a thickest wall of 33 nm and a thinnest wall of 10 nm, in accordance with some embodiments.

FIG. 4 shows a portion of an example nanovoided polymer 400, including voids 404 within a polymer matrix 402. The detailed inset shows a detailed portion 410 showing portions of neighboring voids 418 and 420 separated by walls, such as wall 414 and wall 416. In the detailed portion, walls are provided by polymer matrix 412. The width of the detailed portion shown may be approximately 70 nm. In some examples, a nanovoided polymer may be configured with a thickest wall (shown at W1) of approximately 33 nm and a thinnest wall (shown at W2 in the detailed portion) of approximately 10 nm. The example nanovoided polymer is modeled in the figures discussed below. The dimensions described were used in simulations (e.g., as described below), but examples are not limited to any of the given representative dimensions.

Figure 5:
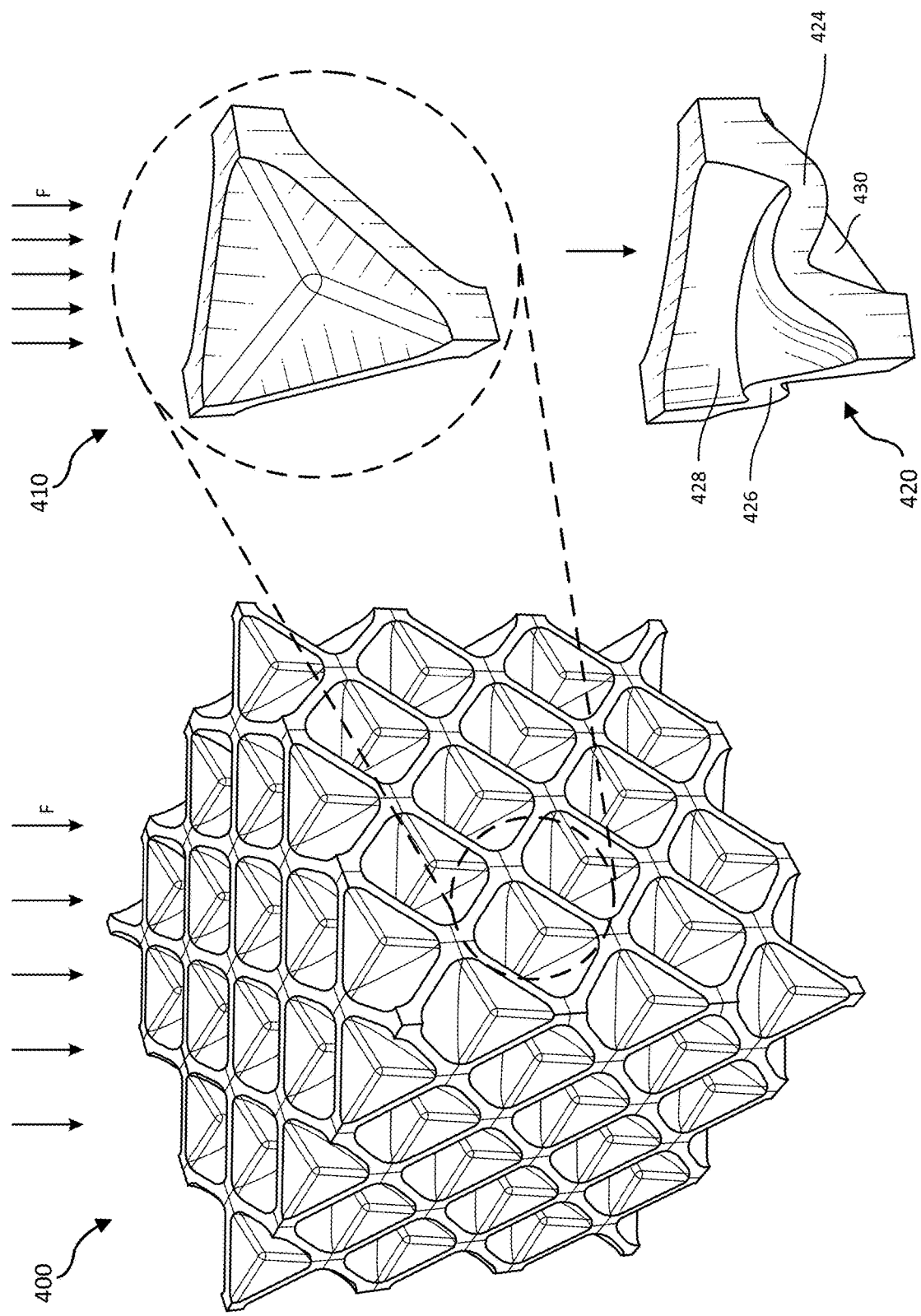
FIG. 5 depicts a nanovoided polymer under compression in accordance with some embodiments.

FIG. 5 illustrates the effect of compression on the nanovoided polymer 400, discussed above in relation to FIG. 4. The downward arrows (labeled F) represent a downwards compressive force exerted on the nanovoided polymer 400, which may result from a mechanical compression (e.g., in a sensor application) or result from electroconstriction induced by an applied electric field, and the compression direction may be parallel to the direction of the applied electric field. The detailed inset shows a detailed view 410, discussed above in relation to FIG. 4. The effect of the compressive force (shown by the arrows labeled F) is to compress the nanovoided polymer vertically, as illustrated.

A compressed detailed portion 420 is shown in a second inset. In this example, the compression induces buckling of wall 424 between void 428 and void 430, and also buckling in the wall 426.

Figure 6A:
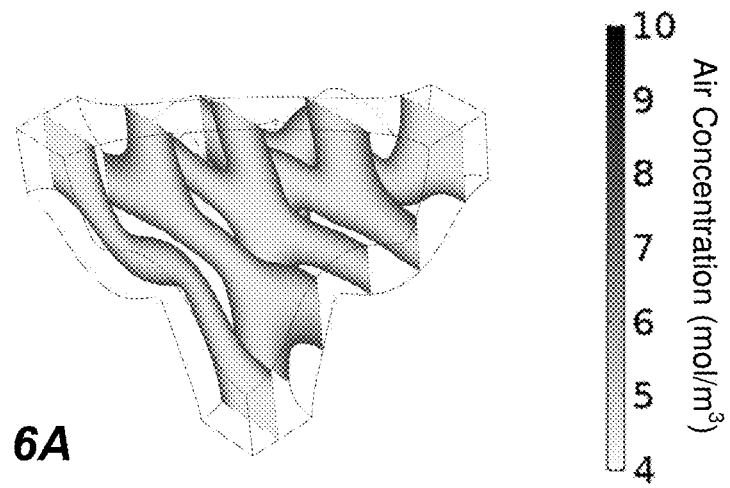
FIGS. 6A-6C depict simulation results for air concentration within the polymer matrix of an example NVP, in accordance with some embodiments.
Figure 6B:
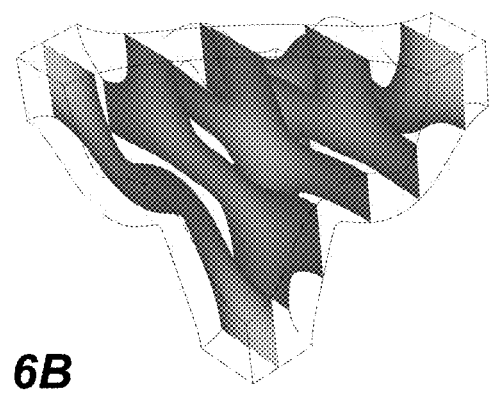
Figure 6C:
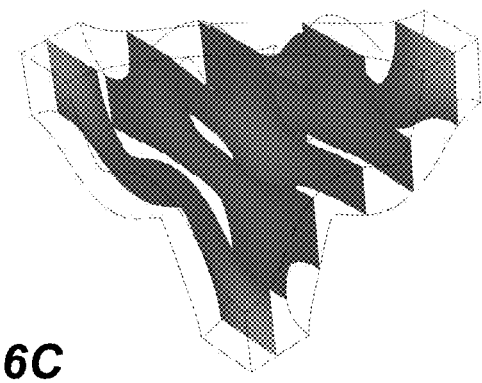

FIGS. 6A-6C show simulation results for gas diffusion, computed using finite element analysis. FIG. 6A illustrates the spatial distribution of air concentration (in mol/m$^3$) within the polymer matrix at a time of 1 ns after application of a compression to an NVP. An air concentration gray scale (for air concentration in mol/m$^3$) is shown on the right of FIG. 6A, and the same scale is used for all of FIGS. 6A-6C. FIG. 6B shows the spatial distribution of air concentration at 10 ns after the compression, and FIG. 6C shows the spatial distribution at 20 ns after the compression.

In this example, an actuator initially at 1 atm (at time t=0) is compressed so that the new air pressure within the voids would be 1.7 atm, if the walls were solid and air could not absorb through the material. The boundary condition of this simulation sets air at a concentration consistent with 1.7 atm on the wall surfaces, adjusting for the relative solubility of air in PDMS, using a representative relative solubility value of 0.118. This value is not limiting. A relative solubility value of 0.1 (or greater) indicates excellent gas solubility, and the solubility of air in silicone polymers such as PDMS is excellent. Higher values of relative solubility (e.g., greater than approximately 0.001, such as greater than approximately 0.01, for example, greater than approximately 0.1) may allow improved electroactive device performance, such as improved actuator response times or sensor response times (e.g., improved sensor time resolution), and/or reduced hysteresis or creep. The visualization shows a unit cell that can be reflected symmetrically to obtain the full 3D structure. The air concentration in PDMS increases from ambient 4.8 mol/m$^3$ to new equilibrium of 1.7*4.8=8.2 mol/m$^3$.

FIGS. 6A-6C show that air absorbs through the thinnest part of the walls (10 nm, as discussed above in relation to FIG. 4) in under 10 ns. Air absorbs through the thick part of the walls (33 nm) in about 20 ns. The results are comparable to the theoretical prediction from Equation 3 (Diffusion Length≈2√Dt), where the diffusion length is half the wall thickness, even though this shape is more complicated.

There are various advantages and benefits of rapid gas exchange between gas in the voids and gas dissolved in the polymer matrix. If gas exchange occurs much faster than the actuation motion, then the internal pressure of gas in a nanovoid equilibrates quickly in response to compression or expansion of the polymer. If gas exchange did not occur much faster than the actuation motion, then the gas would slowly enter or leave the polymer over a longer timescale and therefore the pressure in the nanovoids would depend on the previous history of the actuator.

FIG. 7 shows a portion of a nanovoided polymer 700, having anisotropic voids, under compression. Before compression under force F (which may arise from electroconstriction of an electroactive polymer under an electric field), the nanovoided polymer 700 includes anisotropic voids 704 within a polymer matrix 702. The analogous portion of the compressed nanovoided polymer 710 include vertically compressed voids 714 within a vertically compressed polymer matrix 712.

A formula was derived that demonstrates the benefit obtained from making the nanovoids small, as described herein. The gas pressure within a nanovoid is computed as a function of deformation, both with and without taking gas absorption into account. An example nanovoided polymer may be modeled using the following approach. The periodic cell has an initial volume fraction ($\epsilon$) of gas and volume fraction ($1-\epsilon$) of polymer. The initial conditions at 0% deformation are 1 atm gas pressure in voids and equilibrium concentration of gas at 1 atm absorbed into polymer. However, the initial pressure does not, in general, need to be 1 atm. Results for a different initial pressure condition may scale proportionally to the initial pressure. In this example, the gas is modeled as an ideal gas with temperature 25° C. The temperature, in this example, is relevant for scaling the solubility of the gas to a physical value. The ideal gas law equation of state is not important. The formula may be applicable to any gas that does not strongly self-interact. Deformation results from the reduction of gas volume in the voids, while keeping the polymer volume approximately unchanged. Gas absorption reaches an equilibrium on a time scale that is much faster than the actuation time scale, as further discussed above. This assumption allows our results for a given void fraction (c) to be independent of the void shape.

The following parameters were used in the pressure analytic formula;

$\epsilon$=void fraction (% gas), d=deformation (bulk compression), k=relative solubility of gas in polymer (renormalized solubility S), and $$k = S\left(\frac{cm^3(STP)}{cm^3 \cdot atm}\right) \cdot \frac{T(K)}{273.15} = 0.118$$

for air in PDMS, 25° C.

For convenience, the intermediate variables were defined as follows;

$\bar{n}_0$=conserved number of moles of gas in a unit volume, where $$\bar{n}_0 = \frac{n_0}{V} = \epsilon\frac{P}{RT} + (1-\epsilon)k\frac{P}{RT}, P = 1 \text{ atm},$$

and c=volume compression factor in a gas void compared to zero deformation, where $$c = \frac{V_{air}}{V_{0,air}}$$

Suppose that the fraction ($\epsilon$) of the volume in gas voids shrinks by a factor c while the fraction ($1-\epsilon$) of polymer (in this example, PDMS) volume is essentially incompressible, and does not change. Polymers may be compressible, but have a very high bulk modulus so that such compression requires a much larger amount of force compared to the force needed to compress gas. Hence, any change in the volume of the polymer can be neglected. Using this approach, a relationship was found for the deformation.

The deformation (e.g., the fractional decrease in volume from an original volume) is given as follows (Equation 5):

$$d = 1 - \left(\frac{\epsilon}{c} + (1-\epsilon)\right) = \epsilon\frac{c-1}{c}$$

If we neglect gas absorption, then:

$$P_{noabsorb} = c$$

To obtain the pressure in the presence of gas absorption, the mass balance equation was used, namely: Gas in Voids+ Gas in Polymer=Total Moles of Gas, as follows (Equation 6):

$$\frac{\epsilon}{c}\frac{P}{RT} + (1-\epsilon)k\frac{P}{RT} = n_0$$

These expressions were reduced to their simplest terms in d, c, and k to arrive at the following expressions.

The pressure if gas absorption is slower than mechanical actuation is given by (Equation 7):

$$P_{no\ absorb}(\text{atm}) = \frac{\epsilon}{\epsilon - d}$$

The pressure if gas absorption is very fast relative to mechanical actuation is given by (Equation 8):

$$P_{absorb}(\text{atm}) = \frac{k(1-\epsilon) + \epsilon}{k(1-\epsilon) + \epsilon - d}$$

If the voids are sufficiently small, the pressure within the voids can be computed as a function of the void fraction (c), gas relative solubility k, and bulk compression d. The pressure does not depend on the shape of the voids. The gas pressure within the voids for an actuator that is being compressed is lower than it would be if gas could not absorb into the polymer, or if the gas is absorbed on a time scale that is slower than the actuator motion.

FIG. 8 shows gas pressure as a function of bulk compression, for various void fractions, assuming air as the gas, and using a linear scale representation of air pressure.

FIG. 9 shows a further representation of the data shown in FIG. 8, using a log scale representation of air pressure.

The air pressure within the voids for an actuator under compression is generally lower (for a particular compression) where the void fraction is higher, and where the gas is absorbed by the polymer matrix. This effect is particularly notable when the bulk compression approaches the void fraction. In this case, the nanovoids are being squeezed nearly flat. If the gas (e.g., air) cannot exchange quickly between the nanovoids and the polymer, then the gas pressure may increase rapidly as the nanovoid volume is reduced towards nearly zero. However, if the gas can absorb into the polymer to equilibrate the pressure between the nanovoid and the gas dissolved in the polymer, then excess pressure within the nanovoids may be reduced, as gas exchange occurs between the nanovoids and the surrounding polymer matrix.

It follows from the above equations that the void fraction may have a great influence on the operation of example polymer actuators. Below are some example embodiments of polymer actuators at different void fractions.

Figure 10:
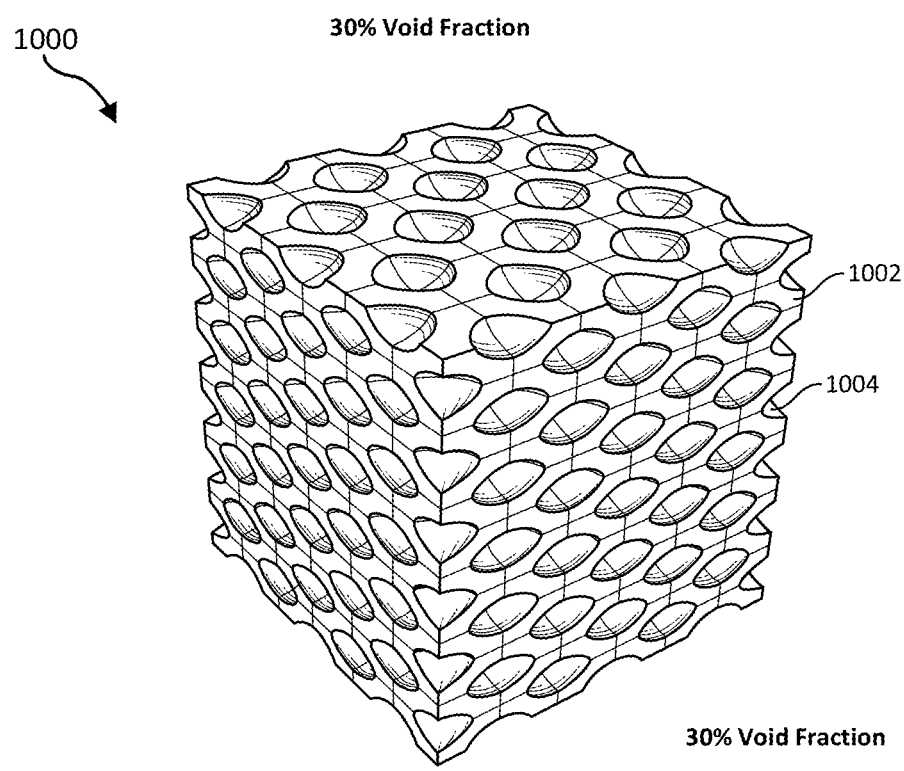
FIG. 10 depicts a nanovoided polymer with a 30% void fraction in accordance with some embodiments.

FIG. 10 shows a nanovoided polymer 1000 with a 30% void fraction, having voids 1004 within a polymer matrix 1002.

Figure 11:
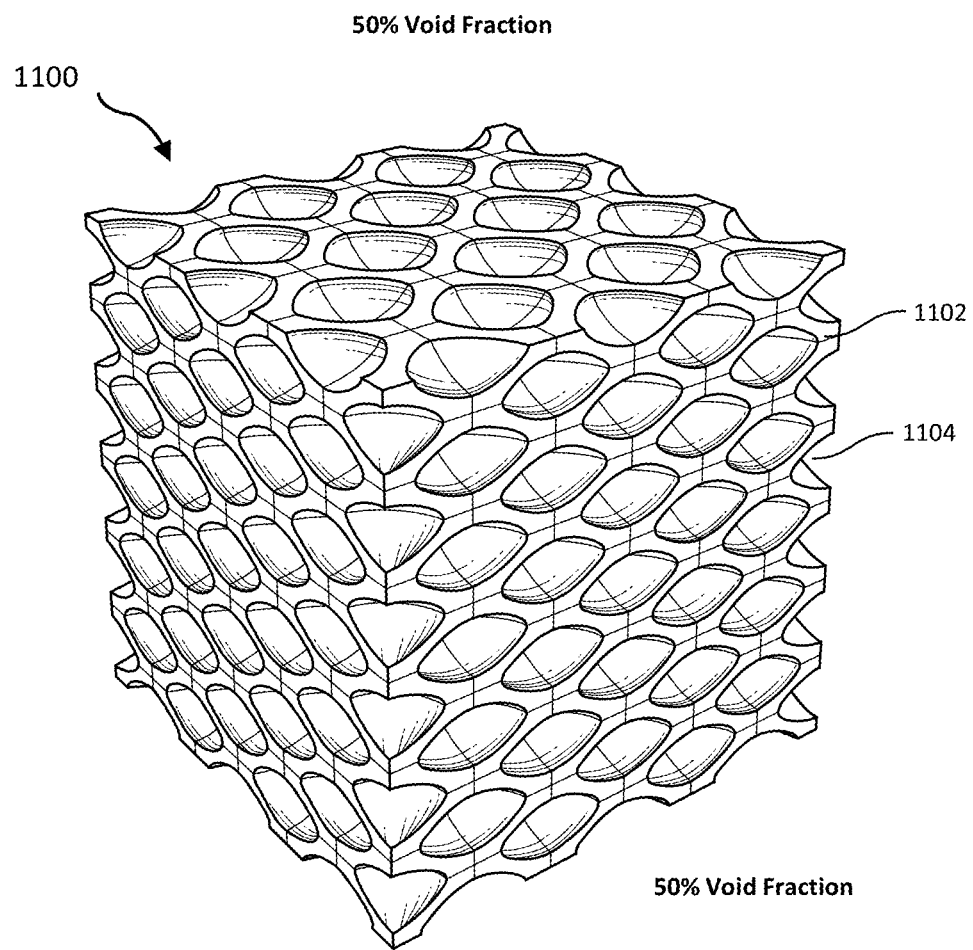
FIG. 11 depicts a nanovoided polymer with a 50% void fraction in accordance with some embodiments.

FIG. 11 shows a nanovoided polymer 1100 with a 50% void fraction, having voids 1104 within a polymer matrix 1102.

Figure 12:
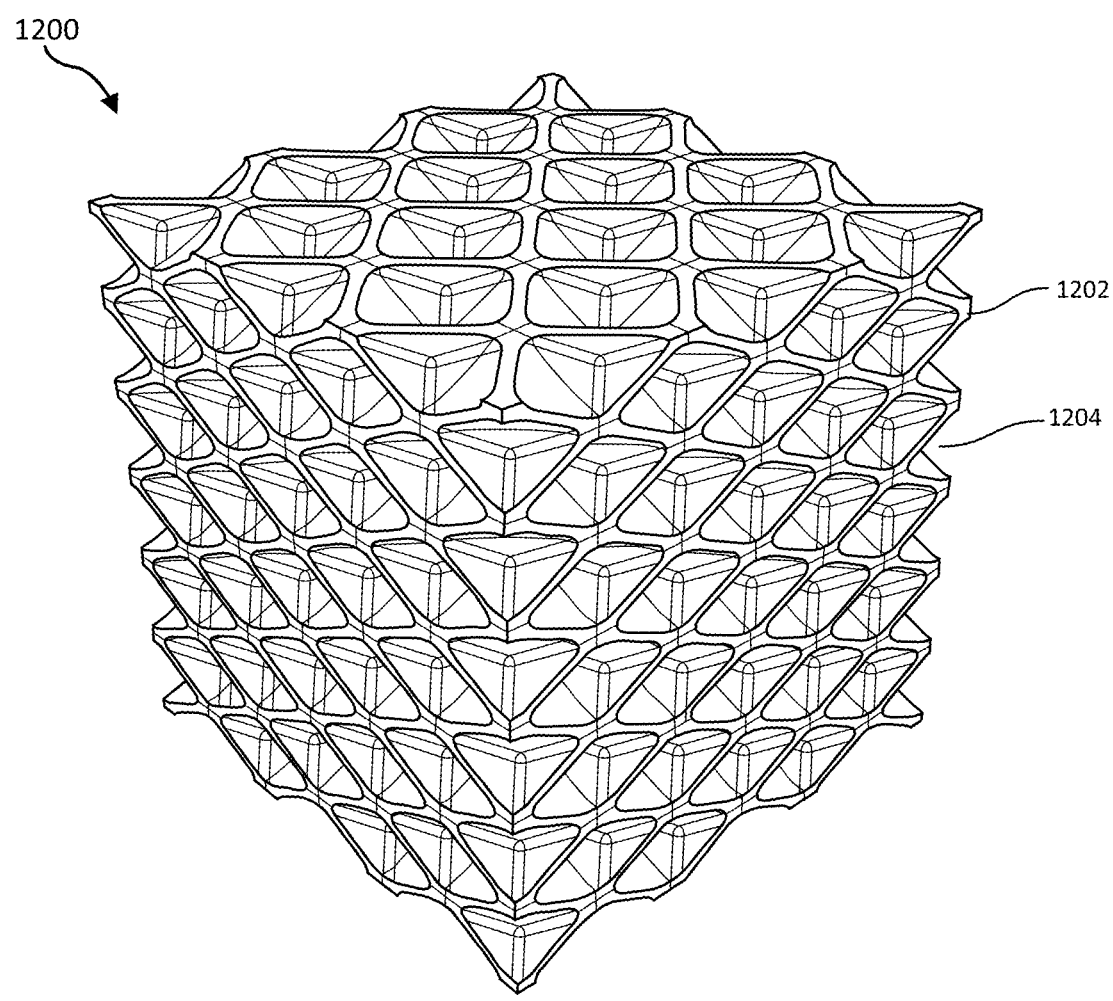
FIG. 12 depicts a nanovoided polymer with a 70% void fraction in accordance with some embodiments.

FIG. 12 shows a nanovoided polymer 1200 with a 70% void fraction, having voids 1204 within a polymer matrix 1202.

Further examples are now discussed, in relation to the effects of creep and hysteresis.

Figure 13:
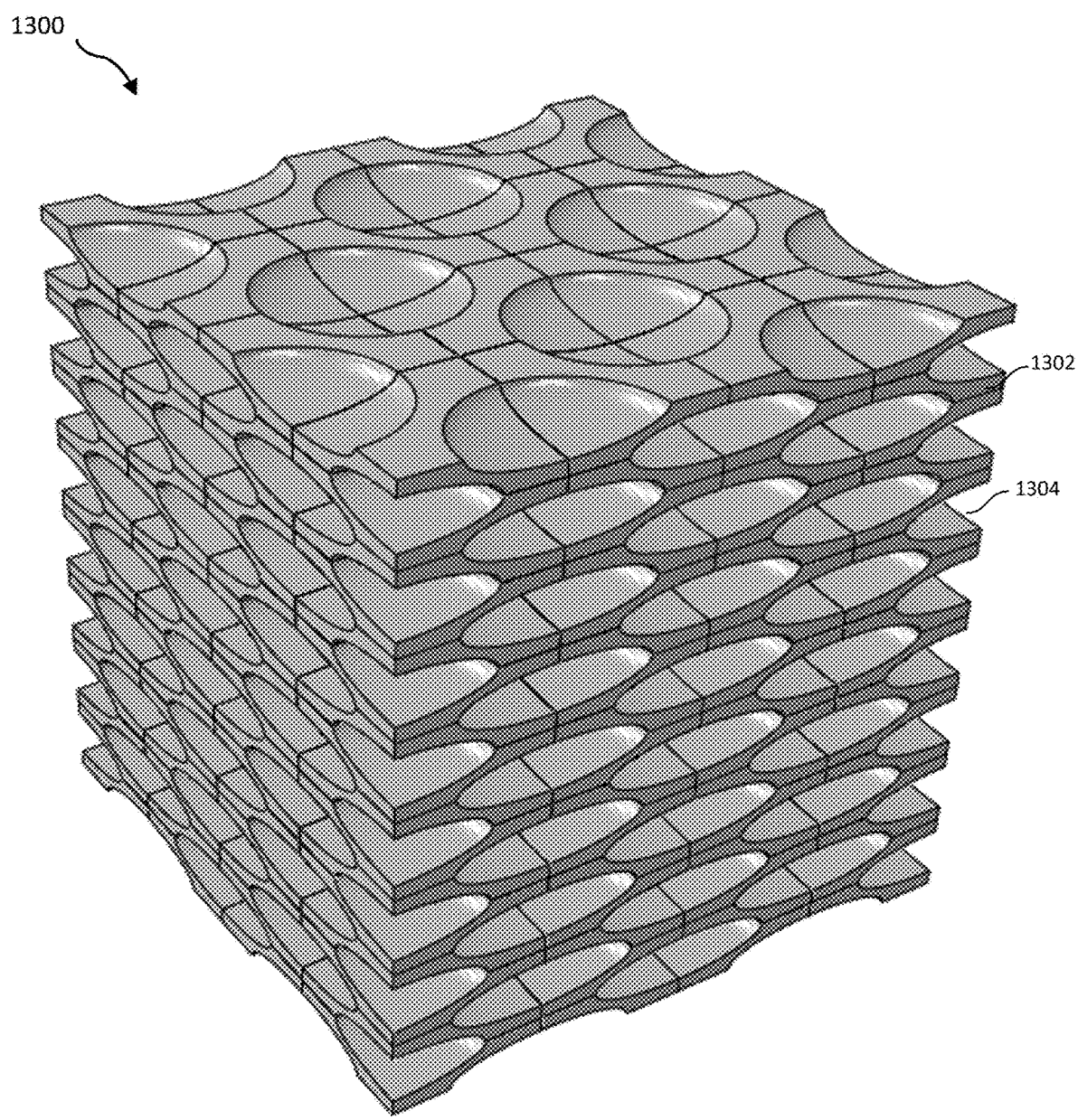
FIG. 13 depicts a representative embodiment for which simulations are performed in accordance with some embodiments.

FIG. 13 shows a representative embodiment for which simulations were performed. The figure shows a nanovoided polymer 1300 including voids 1304 within a polymer matrix 1302. In this example, the nanovoided polymer 1300 includes air-filled nanovoids having the shape of oblate spheroids. The nanovoids have a diameter of 140 nm, a height of 35 nm, and are embedded in a PDMS (polydimethylsiloxane) polymer matrix. The portion shown may be repeated further in all dimensions. The void fraction for this embodiment is 50%. The actuator is compressed in the vertical direction (as illustrated).

Figure 14A:
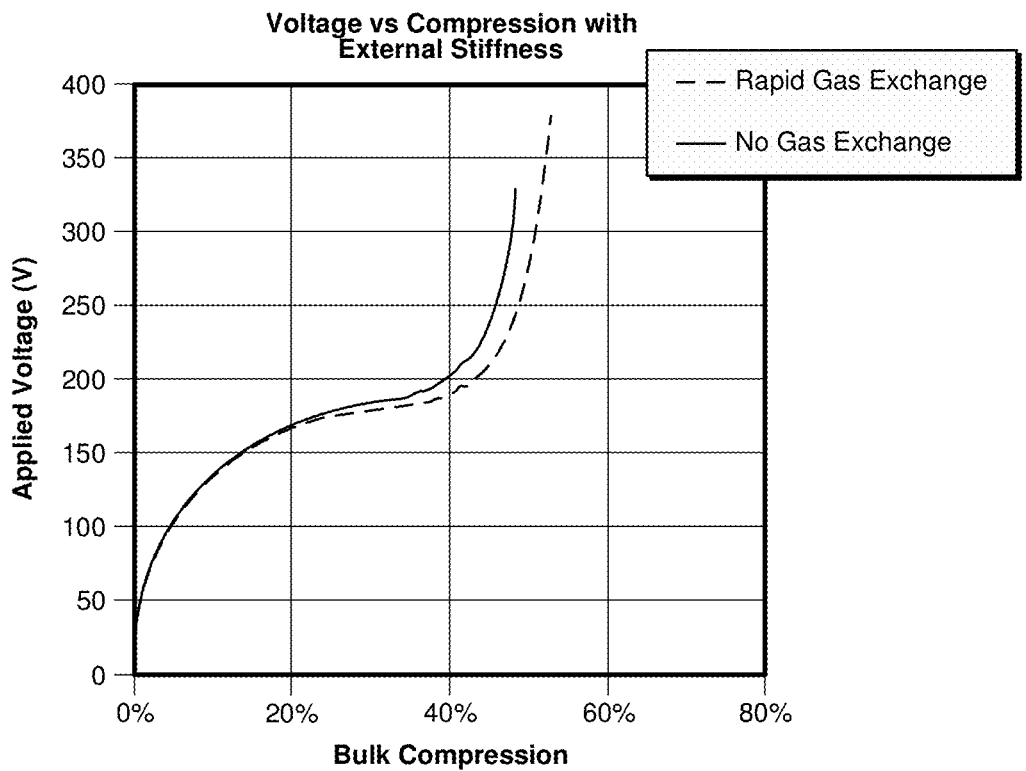
FIGS. 14A-14G depict nanovoided polymers and bulk compression as a function of applied voltage, in accordance with some embodiments.

FIG. 14A show the bulk compression as a function of applied voltage both for an example actuator which satisfies rapid gas exchange between the voids and absorbed gas in the polymer (in this case, rapid air exchange between the voids and PDMS), and a comparative version of the actuator, which does not allow gas to absorb into, or be released from, the walls.

FIG. 14A shows that, at small bulk compressions, there is little difference between the voltage-compression curves for the actuator with rapid gas exchange and the actuator with no gas exchange. However, for bulk compression beyond 20%, the curves diverge. A polymer actuator with sufficiently small walls that satisfies rapid gas exchange may follow the lower curve.

Figure 14B:
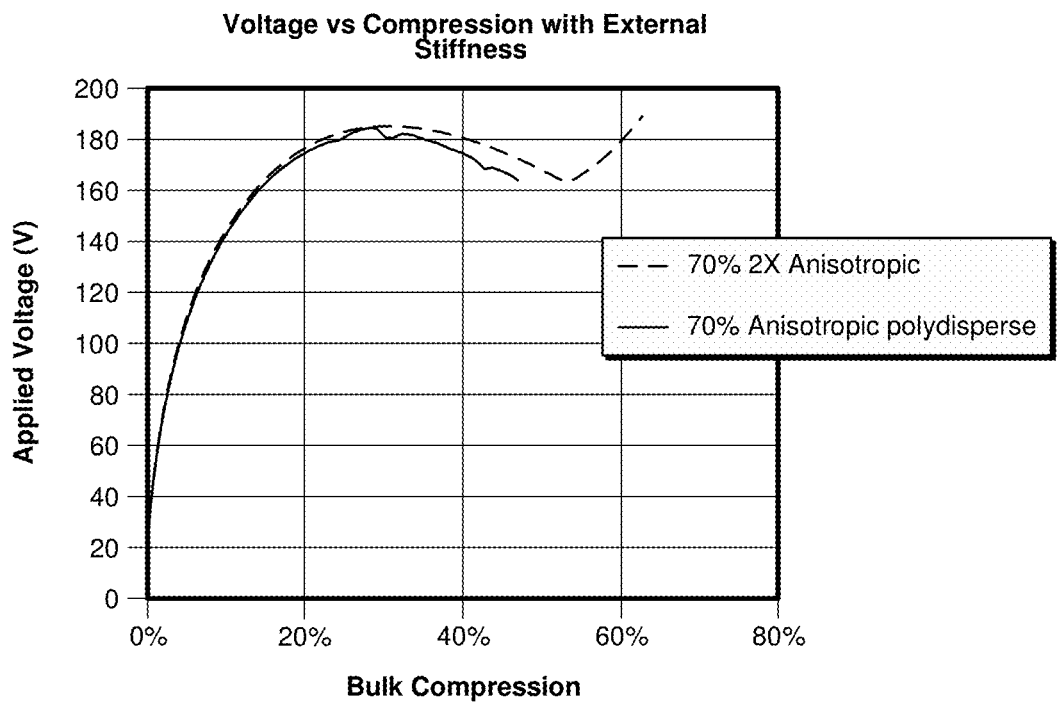
Figure 14C:
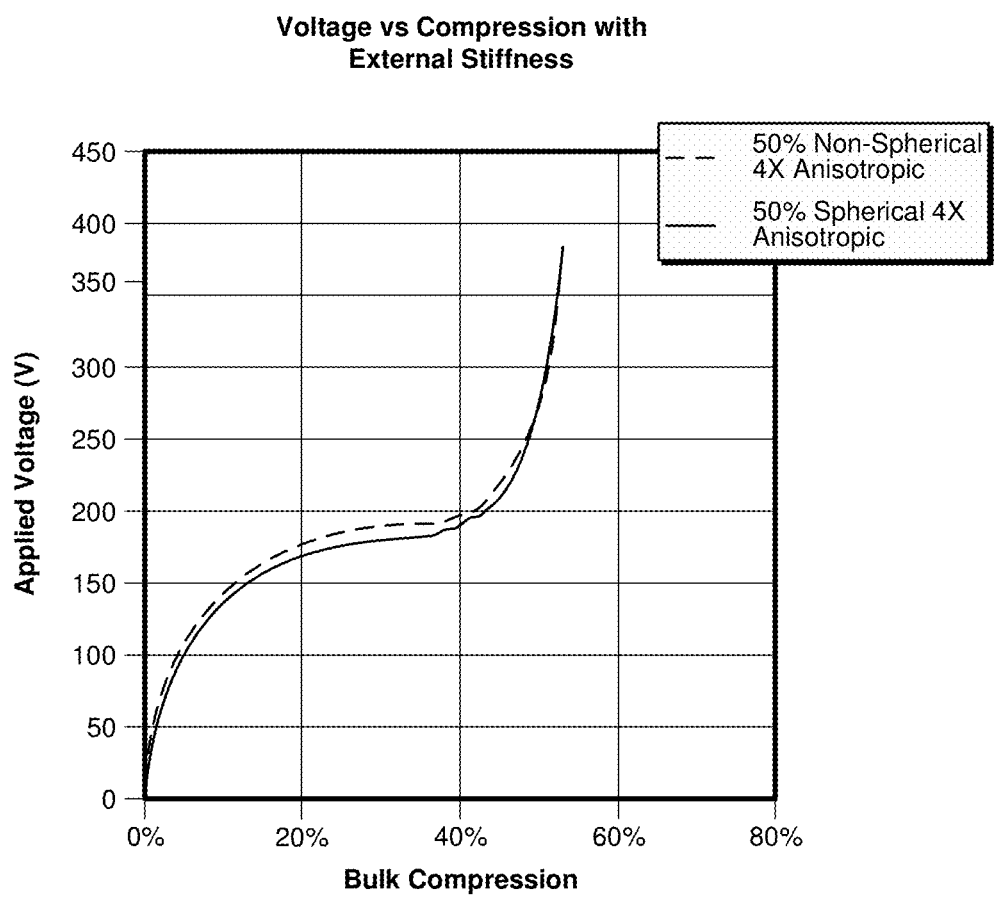
Figure 14D:
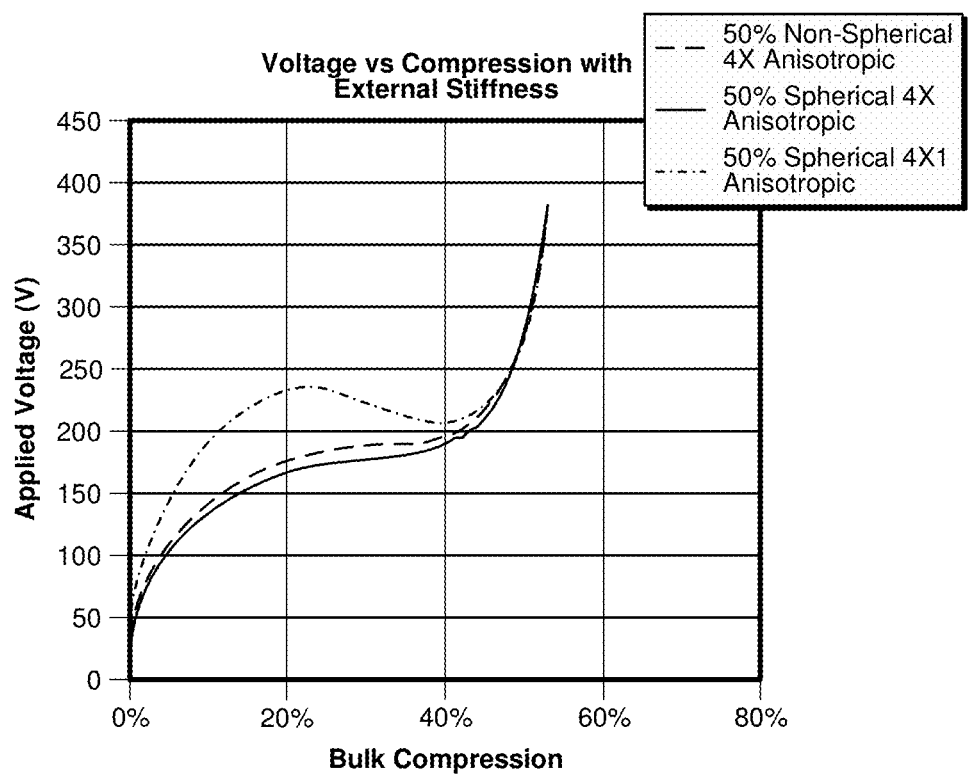

FIGS. 14B-14D show further simulations that demonstrate that variations in the shape of the voids may not have a strong effect on performance as long as the average anisotropy is accounted for. These figures show that there is surprisingly little effect from void polydispersity.

FIG. 14B shows the bulk compression (which may also be termed actuation) versus applied voltage for a 70% void fraction anisotropic NVP, and a 70% void fraction NVP with polydisperse void sizes. FIG. 14B suggests that variations in void shape due to polydispersity may have little effect on performance. FIG. 14B includes of simulations of the voltage versus compression curve for the embodiment shown in FIG. 12, and a variant of the embodiment shown in FIG. 12 where neighboring voids have random shape variations but retain the same average anisotropy.

Figure 14E:
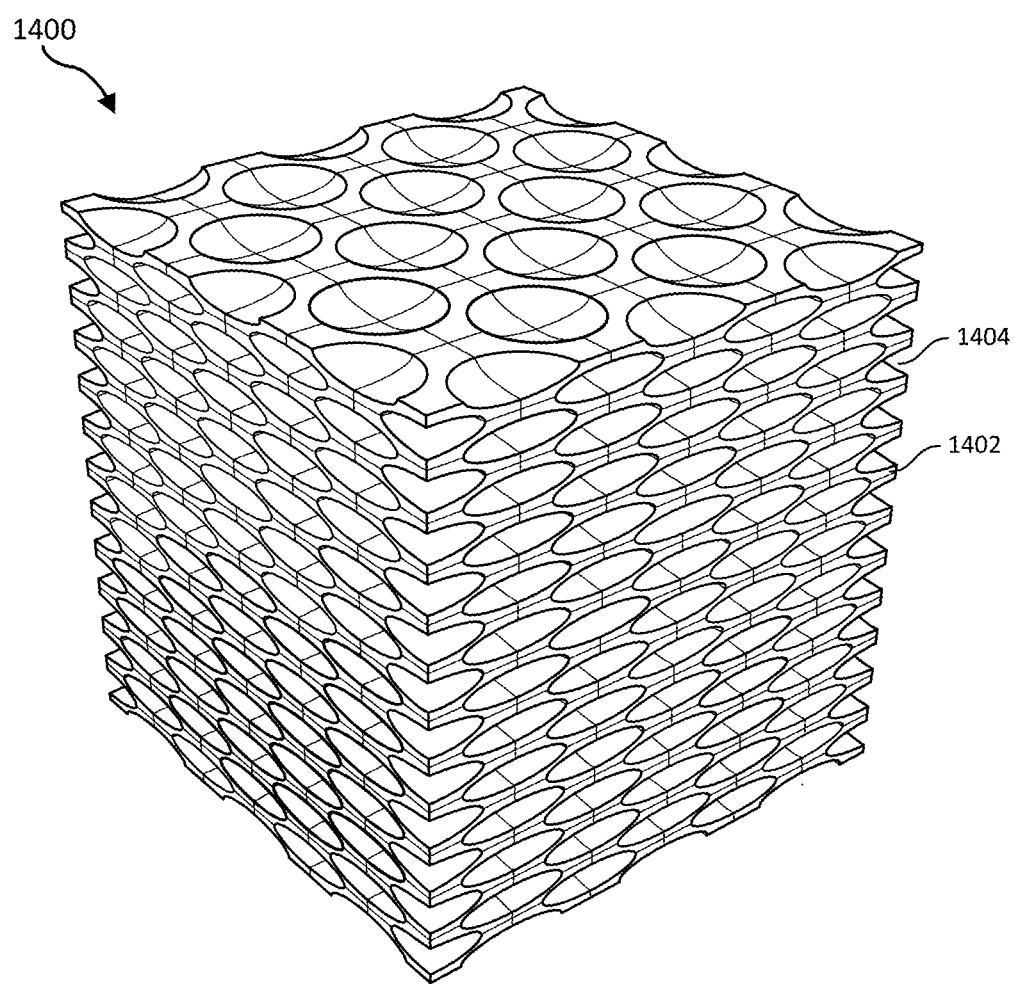

FIG. 14C show the bulk compression versus applied voltage for a 50% void fraction anisotropic NVP, and a 50% void fraction NVP with polydisperse void sizes. The voltage-compression curves for the polydisperse and non-polydisperse NVPs are similar. The simulated data of FIGS. 14B and 14C show that the NVP performance depends on void fraction, but is not greatly affected by polydispersity. The figure shows that a change in shape does not greatly affect the device performance as long as the average anisotropy is preserved. FIG. 14C shows only a small difference in performance between an oblate spheroid shape, as shown in FIG. 14E, and a form-fitting shape shown in FIG. 14F, as long as the ratio of the average void length perpendicular to the direction of compression to the ratio of the average void length in the direction of compression (i.e. the average anisotropy) is the same. In this example the void fraction is 50%, but the void fraction is not essential to this example.

FIG. 14D show the bulk compression versus applied voltage for various 50% void fraction anisotropic NVPs, showing data for three NVP configurations as discussed below in relation to FIGS. 14E-14G. The NVP configurations all have a void fraction of 50%. FIG. 14D further illustrates the relationship between performance and average anisotropy by including an example that exhibits anisotropy with respect the direction of compression and one of the two remaining orthogonal in-plane directions, but not the other. FIG. 14D shows the results discussed above in relation to FIG. 14C, plus a new embodiment show in FIG. 14G which has a performance difference from the embodiments used in FIG. 14C. The new embodiment (labeled "50% Non-Spherical 4×1 Anisotropic") has anisotropy in only one of the two orthogonal directions that are perpendicular to the direction of compression (i.e. a prolate spheroid instead of an oblate spheroid). In this case, the average anisotropy is not the same for the embodiment in FIG. 14G so this does not perform identically to the embodiments in FIGS. 14E and 14F. In this example the void fraction is 50%, but the void fraction is not essential to this example.

FIG. 14E shows the "50% Spherical 4× Anisotropic" NVP (1400), including polymer matrix 1402 and voids 1404, for which data is shown in FIG. 14C and FIG. 14D. The term "spherical", in this context, refers to voids, for example, that are oblate spheroids.

Figure 14F:
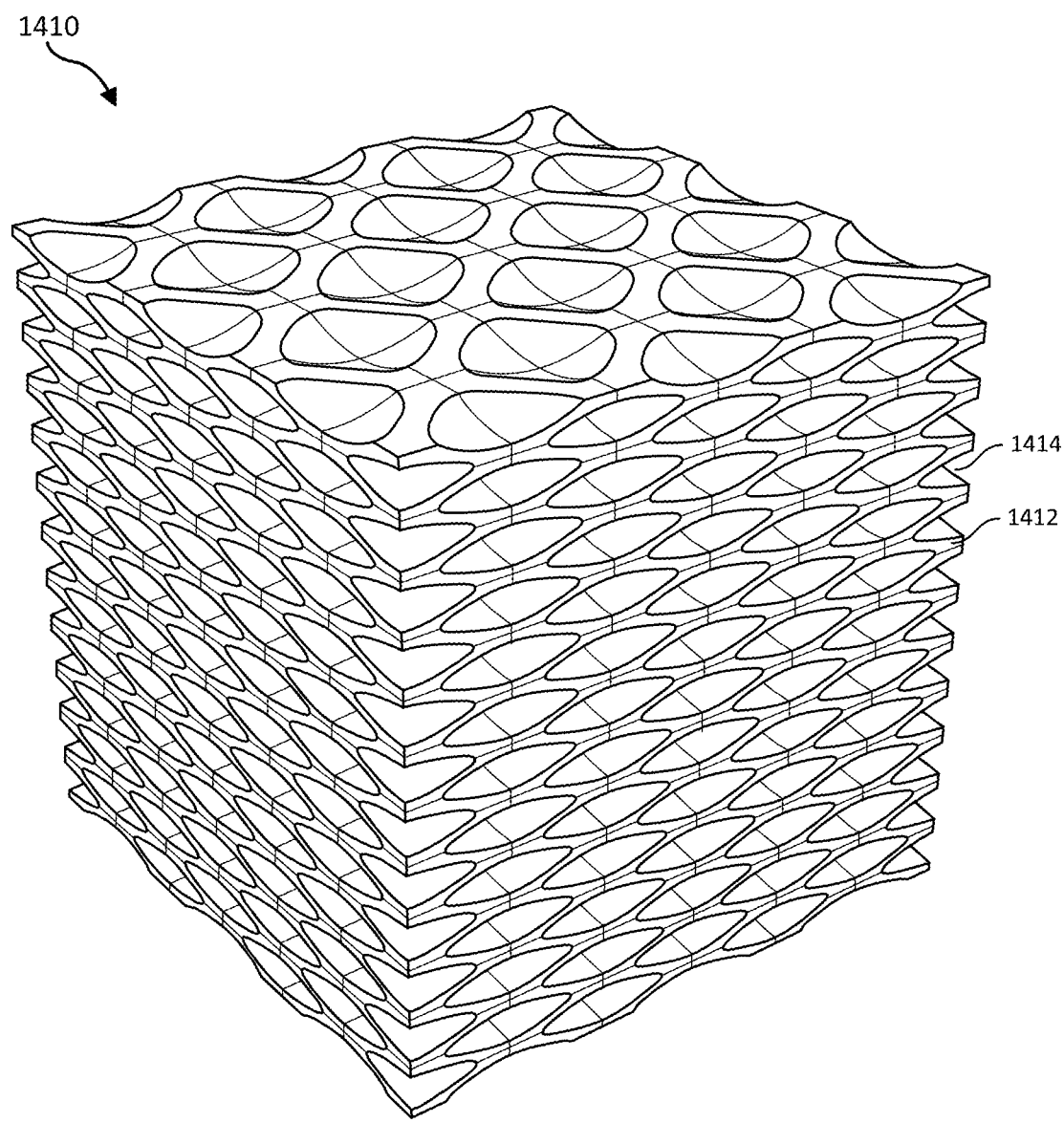

FIG. 14F shows the "50% Non-Spherical 4× Anisotropic" NVP (1410), including polymer matrix 1412 and voids 1414, for which data is shown in FIG. 14C and FIG. 14D. The term "non-spherical", in this context, refers to, for example, voids that have a non-circular equatorial cross-section.

Figure 14G:
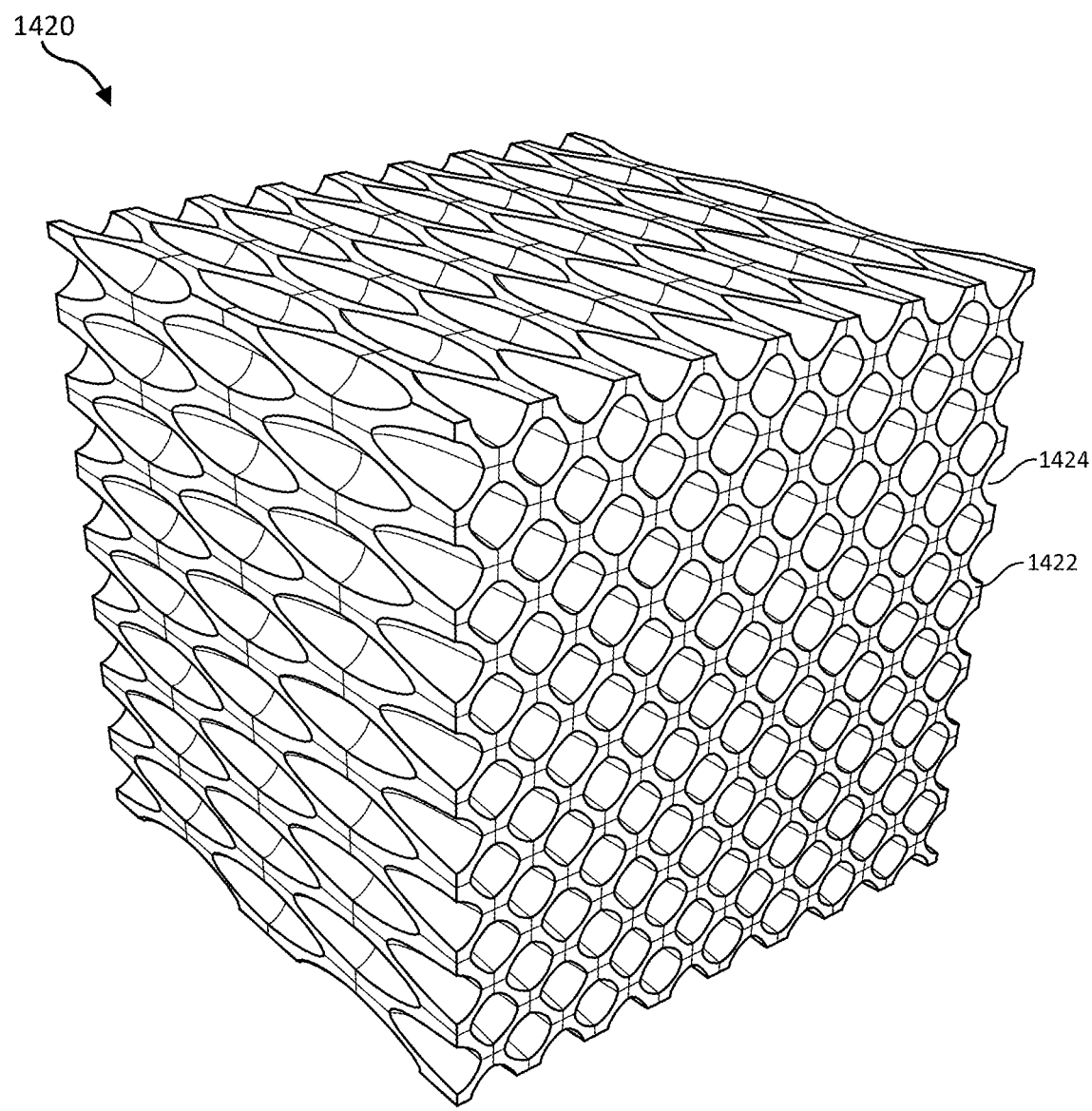

FIG. 14G shows the "50% Non-Spherical 4×1 Anisotropic" NVP (1420), including polymer matrix 1422 and voids 1424, for which data is shown in FIG. 14D. In this example, the voids have an anisotropy ratio of 4 between the direction of compression and one orthogonal direction, but an anisotropy ratio of 1 between the direction of compression and the other mutually orthogonal direction. Such voids may be considered as being approximately prolate voids. Referring again to FIG. 14D, this configuration had a partially non-monotonic response, having a portion in which the compression decreased as the applied voltage increased.

If the dimensions of the polymer actuator are scaled up so that the walls are no longer thin and therefore gas exchange is slower compared to actuator movement time, a polymer actuator may initially follow the simulated curve. If the applied voltage is held constant, the compression in the actuator with slow gas exchange may gradually move from the no gas exchange curve to the rapid gas exchange curve. This movement over time may be referred to as creep.

FIG. 15 illustrates simulated creep data for an example NVP having a 50% void fraction, as discussed above. In this example, the voids are filled with air, and the polymer matrix is PDMS. The voids had a mean wall thickness of 200 microns, with a characteristic gas diffusion time of about 1 second. In this example, the actuator is rapidly brought to 46% bulk compression in a time of 100 ms or less, so that the gas in the voids does not have time to absorb into the polymer. The compressive force needed to enact the motion in this example is about 2 MPa. The actuator compressive force is held at 2 MPa, and over the next few seconds, the gas in the voids then exchanges with (and reaches equilibrium with) the gas absorbed in the PDMS polymer. This gas exchange process reduces the pressure in the voids, and changes the amount of bulk compression that may be achieved with a given force. The time-varying response shown to a constant input is an example of creep. In this example, the compression initially increases due to the fall in pressure of gas within the voids, before levelling off once the gas pressure is in equilibrium.

If a high voltage is applied to an actuator with a relatively slow gas exchange, the pressure inside the voids may initially rise to a high value. As the voltage is held for a duration, the pressure may then fall with time as the gas is absorbed into the polymer. If the voltage then returns to the starting (e.g., low or zero) value, the return path of the actuator depends on the duration, and may not follow the same dependency as when the voltage was increased. This path dependence is an example of hysteresis. In this context, a relatively slow gas exchange is slow in relation to the time dependence of a voltage signal applied to the actuator.

FIG. 16 shows a typical example of undesirable hysteresis (path dependence) due to the air pressure in the voids. In this example, the NVP has a 50% void fraction and wall thicknesses which are not sufficiently small. The mean wall thickness is 200 microns, which leads to a diffusion timescale of about 1 second. An actuator initially at zero bulk compression is compressed quickly to a 47% bulk compression in 100 milliseconds (or less). The actuator is then unloaded back to zero compression where at least one of the following is true: an amount of time has passed that is greater than the diffusion time scale (here a couple of seconds), or the unloading occurs at a rate that is slower time scale than the diffusion timescale. The unloading curve is then different when the actuator material is uncompressed back to its original length. As the gas pressure in the voids falls due to exchange with the gas absorbed in the polymer, the compression obtained for a given compression force is greater on the return path, shown as a solid line.

FIG. 17 shows a similar curve for an actuator that satisfies the rapid air pressure equilibrium criterion. In this case, the loading and unloading curves are essentially superimposed, and essentially no hysteresis is observed. In many applications, this is highly desirable behavior for an actuator. This is in contrast to FIG. 16, which shows hysteresis arising from the history-dependent gas pressure in the voids for cases where the gas is slow to exchange between the voids and the gas absorbed in the polymer.

In some examples, hysteresis may also arise from other sources including stiction or van der Waals forces among contacting surfaces in the compressed polymer. However, there are great operational advantages to eliminating hysteresis arising from gas pressure variations in the voids.

FIG. 18A shows an example in which a nanovoided polymer may be used in a diffusion switch. The diffusion switch 1800 includes a nanovoided polymer 1808, including nanovoids 1806, with at least a portion of the nanovoided polymer 1808 located between two opposed electrodes 1802 and 1804.

FIG. 18B shows a diffusion switch 1810 demonstrating compression of the nanovoided polymer, by a control signal such as an electric signal applied between the electrodes, where the compressed nanovoided polymer 1812 includes compressed and flattened voids 1814. The compressed nanovoided polymer 1812 only allows relatively slow diffusion (e.g., for gas), compared with the uncompressed NVP 1808 shown in FIG. 18A.

In some examples, an NVP can act as a switch for either liquid, ion, or gas flow. The porosity of the NVP may provide a material with high diffusivity for one or more of a variety of species, for example, liquids, ions, and/or gases. However, when the voids are collapsed under the application of electrical field and/or mechanical stress, the diffusivity through the material decreases. Therefore, the NVP can act as an electromechanical switch (i.e., a valve) for fluid conductivity. The dynamic range of the achievable fluid conductivity switching through actuation can be controlled by factors including but not limited to: nanovoid shape, nanovoid interconnectedness, polymer permeability (diffusion through the homogeneous non-nanovoided polymer), nanovoid size, nanovoid packing structure, nanovoid density/volume percentage, and applied electric field. These devices may have use in a variety of applications, including (but not limited to) microfluidics, fuel cells, gas storage, batteries, supercapacitors, pneumatics, ion sensors, and hydraulics. An example fluid switch includes a nanovoided polymer element located (at least in part) between a pair of electrodes, the nanovoided polymer element having a first state allowing diffusion, and a second state that blocks diffusion, relative to the first state. In some examples, the first state may be an uncompressed state, and the second state may be a compressed state obtained by applying an electrical potential between the pair electrodes. Other electrode configurations are possible.

Actuation, for example, by applying an electric field across a least a portion of an electroactive nanovoided polymer element, induces constriction of voids and reduces fluid flow through the voids. In some examples, the NVP may have an open void structure. In some examples, voids may be elongated or in some cases tubular (e.g., partially, mostly, or entirely tubular). A tubular void may have an anisotropy parameter of over 20, and in some examples over 100. Actuation induces a constriction of a cross-section of a tubular void to restrict flow therethrough. Different fluids (e.g., gases and/or liquids) may pass through different portions of an NVP, for example, in examples of tubular voids being generally parallel to each other, and in some examples isolated from each other.

FIG. 19 shows an example method of operating a device (1900), including: applying an electric field between the electrodes of an electroactive device (1910), such as an actuator, for example, including an anisotropic nanovoided polymer; electrically inducing actuation (e.g., compression) of the anisotropic nanovoided polymer (1920), and obtaining a creep and/or hysteresis response using a rapid gas exchange (1930). In this context, rapid gas exchange may refer to equilibrium between gas pressure in the nanovoids and gas absorbed in the polymer matrix of the anisotropic polymer matrix, with a characteristic time scale that is more rapid than the actuation time of the device.

In some examples, a method of operation of a device, for example, an electroactive device such as an actuator including a first electrode, a second electrode, and an anisotropic nanovoided polymer located, at least in part, between the first electrode and the second electrode, may include: applying an electric field between a first electrode and a second electrode to switch an actuator from a first state to a second state, wherein the actuator includes a nanovoided polymer located between the first electrode and the second electrode, the nanovoided polymer includes nanovoids enclosing a gas separated by polymer walls, the second state is compressed parallel to the electric field, relative to the first state, and the characteristic diffusion time of the gas through the polymer walls is less than the response time of the actuator. In some examples, the second state is at least 50% compressed along a direction of the electric field, relative to a generally uncompressed state. In some examples, the response time of the actuator may be 1 millisecond or less.

In some examples, anisotropic voids may be fabricated through processes such as pre-stretching or pre-tensioning a polymer element (such as an actuator element), for example, using an extrusion process, or a drawing process, or other process including a mechanical deformation such as stretching, pressing, or the like. Anisotropy can be locked in after stretching, for example, by further (e.g., complete) polymerization, cross-linking, curing, or other process.

Buckling may reduce the mechanical properties of a sensor or actuator application of the NVP. For example, wall buckling may lead to effectively discontinuous changes in sensor or actuator response (to applied deformations or applied electric fields), and may lead to non-reversible stress-strain properties of the NVP. The polymer walls may begin to fold in on themselves in a way that makes the degree of compression difficult to control, for example, through an external electric field. The deformation at higher compressions may include substantial buckling and may generally be unstable and susceptible to collapsing further than intended or predicted. For example, buckling may reduce the reproducibility of an actuator, and/or the accuracy of a sensor, that uses such an arrangement of voids.

An improved nanovoided polymer may include voids with a form-fitting void shape that improves the uniformity of the wall thicknesses. In this example, the void shape is non-spherical, and is configured such that the wall thickness is more uniform across all surfaces.

The three-dimensional space may be divided into repeating cells, which may be identical, that fill the space. A cell may fill a three-dimensional space when the cell is repeated in all directions. In some examples, the same cell shape may fill the entire three-dimensional volume (e.g., of an NVP element) when the cell is repeated in all directions, but, in general, the cells do not need to have identical shapes. A form-fitting cell shape may be created using any appropriate method, such as the method described herein.

An arrangement including an example void shape may be referred to as isotropic, if the shape dimensions are the same as measured along orthogonal directions.

However, the observed buckling instability that occurred with isotropic voids may be greatly reduced, and in some examples may be substantially eliminated, using an anisotropic void shape. In some examples, an anisotropic void shape may have an internal dimension (e.g., along a direction parallel to that along which an electric field may be applied) that is appreciably less than along an orthogonal dimension (e.g., along orthogonal directions that are perpendicular to a direction along which an electric field may be applied).

The ratio between a first dimension A1 divided by an orthogonal dimension A2 may be termed the anisotropy ratio. In some examples, A1 may represent the long axis of the void shape, and A2 may represent the short axis of the void shape. In some examples, the void interior dimension may be determined in at least one direction perpendicular to the direction of an applied electric field (or for sensor applications, the direction of compression), and may be at least 1.5 times, for example, at least twice that measured along a direction parallel to the direction of an applied field and/or a compression.

In some examples, A2 may be parallel to the direction of an applied electric field, and/or parallel to a direction of compression, and A1 (and A3) may be perpendicular to an applied electric field, or a direction of compression. In some examples, A1 and A3 may be approximately equal, and the void may be an oblate spheroid. In some examples, a void having an oblate spheroid shape may be considered a flattened or pancake void, and the void shape may be similar to a spherical shape flattened along, for example, the direction of an applied electric field or a direction of an applied compression. In some examples, the electric field may be assumed to be substantially uniform between parallel electrodes. In this example, A2 may be termed the short axis of the void shape, and A1 may be termed the long axis of the void shape.

The void shape may be configured so that the wall thickness between a void and neighboring voids may be generally uniform, or at least appreciably more uniform than for an NVP including spherical voids. Finite element simulations of the compression of example nanovoided polymer elements suggest that an anisotropic design may be less susceptible to buckling.

For many applications, a smooth, regular, and/or reproducible behavior of the voltage-compression curve may be desired. Using anisotropic voids, the bulk compression may increase monotonically with applied voltage, as desired for improved actuator performance. Anisotropy ratios greater than 1.5, such as greater than 2, may lead to excellent actuator performances that may be reliably controlled.

Simulations indicated that void polydispersity does not greatly change the operational characteristics of a device using an anisotropic NVP. Actuator performance, as may be represented by a voltage-deformation plot, may not appreciably change for local variations in the void shape. In simulations, the voltage-deformation curves for anisotropic voids with uniform and non-uniform (polydisperse) shapes were approximately identical. NVP properties may be modified using measurable quantities that may be averaged over the entire polymer element, such as the average void anisotropy and the void fraction.

NVPs with anisotropic void configurations may provide significant improvements, compared with NVPs with spherical voids, as they may provide a highly reproducible and precise degree of actuation in response to a given applied voltage.

In some examples, a method of fabricating an anisotropic voided polymer (such as an anisotropic NVP) includes depositing a nanovoided polymer, or a material layer including a polymer precursor, using a deposition process. Examples described herein may refer to nanovoided polymers, but examples may also include voided polymers. A deposition process may include one or more of the following: spin coating, printing, chemical vapor deposition, vapor coating, transfer of a prefabricated polymer layer, dipping, or spraying. The method may further include deforming the nanovoided polymer element (or a material layer that provides an NVP precursor) to form the anisotropic nanovoided polymer element by at least one of the following methods: stretching or tensioning (e.g., using an extrusion process); stretching or tensioning a substrate on which the nanovoided polymer material is deposited; pressing the material; deforming a fluid-based phase (such as emulsions or lyotropic phases) by varying chemical composition, temperature, salt or other component concentration, flow rate, shear rate, agitation, external fields (such as ultrasound, electrical, electromagnetic fields such as optical or UV, or magnetic fields); using shaped nanoparticles that may later be removed (e.g., shaped sacrificial particles); using spherical particles that may be reshaped using temperature or pressure or mechanical stretching/tensioning or a combination thereof, where the particles may include solid polymer nanospheres that may later be removed, and/or where the particles include gas-filled polymer nanospheres that may either later be removed or left within the material. In some examples, the material after deposition and prior to void deformation is partially polymerized (e.g., precured) to a certain degree via polymerization, cross-linking, curing, or some other process using a source of actinic radiation.

In some examples, the anisotropy of the voids may be formed by a process including heating the material prior to and/or during stretching or tensioning. In some examples, the formation of anisotropic voids includes irradiation of the material using one or more radiation sources, such as curing sources, such as UV and/or visible radiation sources.

In some examples, after the anisotropy of the voids is formed, the anisotropy may be "locked in" by one or more further processes, such as a process including further (e.g., complete) polymerization, cross-linking, curing, or some other process. In some examples, "locking in" of void anisotropy may include rendering the void anisotropy substantially permanent, for example, after removing an external factor (e.g., an external field or mechanical input) that induces the void anisotropy. Examples may include irradiating the material layer using UV or visible light, for example, using a source of actinic radiation.

In some examples, an NVP element includes shaped voids, for example, voids having a shape that is changed from the original form of the void when the void was formed. In some examples, after the deformation of the original shape, the aspect ratio (or anisotropy ratio) of the anisotropic voids may be at least about 1.5 times (e.g., at least twice, such as at least 3 times, alternatively about 5 times) the original aspect ratio (or anisotropy ratio) of the material.

In some examples, an anisotropic nanovoided polymer includes a bulk polymer including an arrangement of nanoscale gas-filled voids. The shapes of the voids may be anisotropic, or may be a combination of spherical and anisotropic shapes. In some examples, void shape may vary throughout the material.

In some examples, the deposited material may include one or more of the following: a monomer, polymer, solvent, porogen, surfactant, or emulsifier. In some examples, the deposited material may include nanoparticles, such as polymer nanoparticles, such as polymer nanospheres. Nanoparticles may be solid, hollow, or may include different shell and core materials.

Examples include methods of fabricating anisotropic voids in a polymer. In some examples, voids may be extended arbitrarily along a direction, so that the voids are elongated shaped tubes, which may have, for example, an anisotropic or circular cross-section.

In some examples, anisotropic voids can be generated through mechanical deformation of the polymer in one or two directions (e.g., two orthogonal directions). Mechanical deformation may include one or more processes, such as stretching, pressing, or the like. In some examples, the stretching may include a deformation along at least one direction of at least approximately 1.5X, such as at least approximately 2X, for example, at least approximately 3X, for example, at least approximately 5X. In this context, the "X" may refer to, for example, the ratio of a stretched dimension to the original dimensions of the material. A deformation of 2X may correspond to doubling a dimension along an example direction. There may be an approximately corresponding decrease in at least one direction orthogonal to the stretching direction.

Embodiments of the instant disclosure may include actuators, optical elements (which may include actuators), sensors, and combinations thereof. In some examples, a nanovoided polymer element includes shaped voids in a polymeric matrix. Example applications include nanovoided polymer devices, such as actuators, sensors, and optical elements.

In some examples, a device, such as a polymer actuator, includes nanovoids having generally non-spherical shapes. The nanovoid shapes may be configured to suppress buckling in the material and allow the material to be greatly compressed from its original shape in a controllable manner. The nanovoids may be filled with a fluid (such as a gas, such as air, nitrogen, a dielectric gas, other gas, or other fluid). A functional material may include a nanovoided polymer where the voids are anisotropic in shape. Example anisotropic shapes include prolate shapes (e.g., elongated spheroids), elongate shapes such as cylinders (e.g., with rounded ends), oblate shapes (e.g., flattened spheroids), flattened shapes such as disks, and other geometric shapes. In some examples, a short axis of the void shape is aligned with the direction of compression of the NVP layer. The voids may be distributed periodically throughout the polymer layer, or in some examples may have no long-range periodicity. In some examples, a functional material is constrained to prevent expansion or contraction in one or more directions. In some examples, a nanovoided polymer is used as the dielectric layer in an electrostatic actuator, for example, an actuator that operates via mechanical actuation. The nanovoided polymer material may include one or more polymer components, such as a silicone-based polymer, or an acrylic polymer. The nanovoided polymer element may include an elastomer, and/or a thermoset polymer. The nanovoided polymer material may be actuated through compression or tension in one or more dimensions. For example, the nanovoided polymer material may be actuated through compression or tension in two dimensions.

In some examples, interior surfaces of the polymer matrix (e.g., enclosing the voids) may have a surface layer, such as a coating configured to reduce interactions (e.g., sticking) if interior surfaces come into contact, for example, after compression. A surface layer may include a surfactant, a fluorinated compound such as a fluoropolymer, or other coating.

In some examples, an NVP may be pre-tensioned and/or pre-stretched, for example, before inclusion in a device, such as an actuator and/or a sensor. In some examples, the NVP may be deposited on a substrate, and the substrate may be pre-stretched.

Examples may include polymer devices, such as a polymer actuator. An example actuator includes a long thin block of material, which may include a polymer. A polymer actuator may compress in response to an applied electrical field. The degree of compression may be controlled by controlling the magnitude (e.g., the root mean square (rms) value) of the applied electric field. The actuator may take on a desired configuration and may exert a force on an adjacent surface. In some examples, the actuator may be used to modify an optical element (e.g., adjust the focal length of a flexible lens), or provide haptic feedback.

In example applications, several polymer actuators can be positioned along the rim of a pair of glasses including a flexible lens, such as a lens filled with a liquid. An electric field can be used to move the actuators so that they exert a force on the lens and change the focal point of the lens. Actuators may be configured to move an adjacent surface, for example, by distances up to 1 cm. The electrode separation may be of millimeter or sub-millimeter order to maintain reasonable voltage requirements for the actuator (e.g., less than 1 kV).

An actuator in compression may expand laterally, unless the actuator is laterally constrained, for example, by sidewalls. If the electroactive element of the actuator is constrained so that it cannot expand laterally, the force required to compress a solid electroactive element may be high, particularly if the electroactive element polymer material is close to incompressible. A nanovoided polymer material includes many small pockets of air (nanovoids). An NVP is useful as an electroactive element, as it takes less force to compress the NVP than a similarly sized solid polymer element. In some examples, compression of air in the voids requires one or more orders of magnitude less force than that required to compress a solid block of material. Further, the components of air (e.g., nitrogen, oxygen) may dissolve in the polymer under compression, further facilitating compression of the NVP.

Nanovoids may also help enable more precise control over how much the electroactive element deforms in response to a given electric field. In many applications, an ideal actuator may compress gradually as more voltage is applied, whereas an actuator with a (non-ideal) unstable performance may show instability above a given voltage, for example, where the structure may rapidly collapse to a highly compressed state. An unstable actuator may no longer have a predictable voltage-actuation curve. The voltage-actuation curve may no longer be a monotonic function, and in some examples may show appreciable hysteresis. These effects may be reduced or substantially eliminated using a nanovoided polymer element.

In some examples, a device (such as an actuator and/or a sensor) may include an NVP having voids with a non-spherical shape. Voids may be arranged in a regular lattice, in a random arrangement, or in some other arrangement. The arrangement of voids in the polymer may include one or more of the following. An NVP may include a lattice-like arrangement of voids, such as close-packed, cubic, face-centered cubic, or other arrangement; an arrangement of spheres and/or other non-spherical shapes; anisotropic voids having uniaxial or biaxial orientation; a polymer having the form of a fiber or fiber bundle; an extruded fiber such as an "islands-in-the-sea" microfiber; an extruded form, such as a layer; and/or a 3D printed form.

Improved polymer-based transducers may include non-spherically shaped voids. Examples may include voids having form-fitting shapes which result in increased uniformity of wall thickness compared to spherical voids. Also, configurations include anisotropic may improve the performance of the transducer. An improved NVP-based device may include one or both of anisotropic voids or more uniform wall thicknesses.

In some examples, an NVP element, or a device including an NVP element, may include an NVP having non-spherical voids, such as a form-fitting void shape that results in more uniform wall thicknesses. In some examples, an NVP element, or a device including an NVP element, may include an NVP having anisotropic voids, such as anisotropic voids that provide a monotonic and/or reversible voltage-actuation response. uniform wall thicknesses.

In some examples, an actuator may have one or more of the following properties. An actuator may have a predictable and repeatable actuation response to a specified level of electric voltage. For example, the voltage-actuation response may be generally independent of the actuation history (e.g., whether actuation is increasing or decreasing). In some examples, the voltage-actuation response may be generally monotonic, and may be generally reversible. The actuation mechanism may survive many cycles of extending and retracting. The actuator response time can be sufficiently fast. This depends on applications, but example actuators may have a response time of less than 1 second, for example, from zero to maximum actuation, and in some examples, the response time may be less than 100 msec. In some examples, actuators may achieve a maximum bulk compression of 50% or more.

In some embodiments, nanovoided polymers may be created with spherical nanovoids. In some manufacturing processes, spheres may be the relatively simplest shape to create. Arranging spherical voids for a high void fraction, configurations such as face-centered cubic (fcc) or body-centered cubic (bcc) may be used. However, using a spherical shape may lead, in some examples, to problems. For example, it may not be mathematically possible to fabricate an NVP having spherical nanovoids with a void fraction of over approximately 74%, as this is the packing limit for spherical voids (either in periodic or non-periodic arrangements). In some examples, NVPs having spherical voids and having a void fraction close to a theoretical maximum have very thin walls in some locations and relatively thick walls elsewhere. Also, since the thickness of solid material between voids (wall thickness) can be highly variable with spherical voids, this may encourage a buckling response as the material is compressed. Buckling of the material may lead to a rapid collapse that makes it difficult to control the actuation response with a high degree of precision.

In some examples, an NVP may include an arrangement of voids and have a void fraction greater than 74%, while, in some examples, maintaining generally uniform wall thicknesses.

Example actuators may provide a mechanical component which moves in response to an input electrical signal. Anisotropic voids have spatial non-uniformity that differs in one direction from another direction. Anisotropy may be determined for orthogonal directions, for example, parallel to the plane of the electrodes and normal to the plane of the electrodes. Anisotropy may be determined for directions perpendicular to an electrical field and parallel to an electric field. For example, the mean thickness of an air void may be shorter in the height direction (perpendicular to an electrode) than in the length or width direction (parallel to the electrodes, for the case of parallel electrodes).

Actuation may be measured as a bulk compression. Compression may be measured in absolute units (e.g., a length unit) or as a fraction, for example, the fraction of the deformation relative to an original undeformed dimension of the actuator. For example, if the actuator is compressed and the thickness after compression is 70% of the original uncompressed thickness, then the bulk compression is 30%. In some applications, a monotonic voltage-actuation relationship is desirable. However, the voltage-actuation curve may show unstable and non-monotonic behavior due to buckling, for example, of polymer walls separating neighboring voids. Buckling is a usually undesirable behavior where part of a structure, such as a wall, bends and folds over itself when a load is applied. Buckling is an often undesirable instability that may trigger large deformations, and may greatly reduce in the load driving capacity of the device, such as an actuator.

Nanovoids may include a hole or pore (void) in the solid polymer, and may be filled with air, or an inert gas. A nanovoid may have a diameter or other analogous dimension less than 1 micron, for example, in the range 1 nanometer (nm)-1 micron, such as 10 nm-1000 nm. The void fraction is the fraction of volume of the actuator (when in its original state with 0% bulk compression) occupied by voids, for example, by air or an inert gas.

Example applications of the concepts described herein include an electroactive device, such as an actuator, with nanovoids having a non-spherical shape. In some examples, the voids have a form-fitting shape that may result in more uniform wall thicknesses, and may result in a higher void fraction. Increasing the void fraction may be desirable, as compression of gases in the voids may require significantly less energy than that required to compress the material of the polymer matrix. Hence, increasing the void fraction may allow greater actuations (for a given voltage) and/or measurement of greater deformations.

An improved nanovoided polymer element was designed having a form-fitting void shape, resulting in a more uniform wall thickness. A non-spherical void shape was designed such that the wall thickness may be more uniform across all surfaces.

There are a number of possible approaches to determine a void shape that results in a more uniform wall thickness. In some examples, the polymer may be divided into partitions based on distance to the nearest void, for example, using a Voronoi tessellation. A form-fitting shape may then be designed for each partition using one or more of any of the following methods: subtracting a rescaled smaller version of the partition shape; rounding off the corners of the partition shape with a fillet, possibly after rescaling; or creating an approximation to the partition shape using a technique such as Catmull-Clark subdivision, loop subdivision, or a B-spline.

More uniform wall thicknesses may also be obtained using random packing or a periodic lattice arrangement of a 3D space with non-spherical shapes through one or more of any the following approaches: using the same void shape repeatedly, with a random or periodic arrangement; adding random distortions to a base void shape, with a random or periodic arrangement; either of the above, with the void shape scaled to a distribution of different sizes; or any of the above, for example, using a mixture of two or more different void shapes.

An example nanovoided polymer element has voids having an anisotropic shape. Including anisotropic voids may improve the nanovoided polymer element, for example, by reducing the buckling instability, for example, during a deformation of the NVP. A flattened void shape, such as an oblate spheroid shaped void, such as a "pancake" shaped void, may be obtained by stretching the void shape in one dimension relative to the others.

In some examples, the void shapes may be form fitted to an approximate unit cell shape to obtain more uniform wall thicknesses. Voids may be anisotropic (e.g., having different dimensions in plane vs out of plane, where the plane may be perpendicular to the direction of an applied electric field and/or compression). Diameters, or analogous dimensions, along different directions may be configured to bias the voids towards the desired deformation, for example, make the compression less unstable, and to avoid buckling. This may result in a more precise and smooth compression with respect to an applied voltage and/or force. The use of anisotropic voids allows NVP compression that may have improved consistency (e.g., repeatability) for a given applied voltage and/or force. The anisotropy ratio (e.g., a dimension ratio along orthogonal directions) may be greater than 1.5, for example, in the range 1.5-10. Example fabrication approaches may include extrusion (e.g., of a precursor material, such as an NVP with a lower anisotropy ratio) and/or compression (e.g., of a precursor material, e.g., compression along a direction along which an electric field may later be applied in a fabricated device). In some examples, anisotropy may be induced in a non-polymerized material (e.g., an emulsion of fluid droplets within a medium including a polymerizable material such as a monomer), or a partially polymerized material (e.g., including fluid droplets within a medium including a partially polymerized material such as an incompletely polymerized monomer). After (or during) generation of the anisotropy, the anisotropy may be made permanent (or "locked in") by further polymerization of the polymerizable or partially polymerized material. Further polymerization may include taking a polymerization reaction to effective completion, and/or cross-linking. For example, anisotropy may be locked in during or soon after extrusion, compression, or other anisotropy-inducing deformation of a material. In some examples, an NVP may be pre-stretched before inclusion in a device. Relaxation of the pre-stretch may be resisted mechanically, for example, by mechanically preventing expansion of the NVP along one or more directions. In some examples, a device may include a multi-layer structure, for example, including one or more NVP layers, electrode layers, or other layers. Examples described herein may also reduce hysteresis in the properties of fabricated devices. Advantages of anisotropic voids include a smoother actuation curve (for actuator applications) or sensor response curve (for sensor applications), and may not require repeated identical shapes. Other advantages of anisotropic voids may include more rapid gas absorption from the voids into the polymer matrix. For example, the polymer matrix surface area enclosing a particular void volume may be minimized by using a spherical void shape, so that non-spherical void shapes, and in particular anisotropic void shapes, allow faster gas absorption from the void into the polymer matrix, increasing, for example, the speed of a device response (e.g., actuation speed, or sensor response time). In some examples, the polymer matrix may have additional porosity beyond that provided by the voids, for example, including channels between voids, for example, to allow gas to migrate through the NVP as the NVP is compressed. In some examples, an NVP may include multimodal voids, which may have differing shapes, anisotropy, and the like. An NVP may include some random and/or added non-uniformity without significantly affecting the general device performance. In some examples, device performance may be improved by introducing some degree of anisotropy, for example, an average degree of anisotropy, for example, an average anisotropy ratio between 1.5 and 10 (or other range, such as other anisotropy ranges described herein.)

In some examples, heating the polymer film before and/or during mechanical stretching may increase the maximum achievable amount of stretching. In some examples, an elevated temperature may be used to heat a polymer component of the material above the glass transition temperature of the polymer component. In some examples, a multilayer substrate may be used, for example, having a layer that adheres both to a support surface, and to the material.

In some examples, a nanovoided polymer element includes an arrangement of voids in a polymer. The arrangement of voids may have polymer walls, having a wall thickness, between neighboring voids. In some examples, the wall thickness may be less than approximately 5 microns. The voids may contain a gas, and the gas may diffuse into and out of the polymer walls with a characteristic diffusion time. In some examples, the characteristic diffusion time is less than approximately one millisecond.

The nanovoided polymer element may be an electroactive polymer element (e.g., as a component of an electroactive device) having a response time. In some examples, the characteristic diffusion time may be less than the response time. In some examples, the characteristic diffusion time may be less than one tenth of the response time. In some examples, the wall thickness between voids may be less than approximately four times the square root of the product of the diffusion coefficient and the response time.

A device, including a nanovoided polymer element, may further include a first electrode and a second electrode. The nanovoided polymer element may be located at least in part between the first electrode and the second electrode. In some examples, the arrangement of voids may be configured so that polymer wall thicknesses between neighboring voids are generally uniform, for example, substantially more uniform than for an arrangement of spherical voids.

The device may be an actuator, sensor, any electroactive transducer, an electrically adjustable optical element (e.g., including one or more of a mirror, a lens, a prism, a grating, a phase plate, a diffuser, a holographic element, a beam splitter, a beam combiner, or an optical filter), or other device. A device may be a spatially addressable actuator, for example, including a plurality of electrodes, which may include first and second electrodes. A device may further include a control circuit configured to apply an electrical potential between at least the first electrode and the second electrode.

In some examples, a device may be an electroactive device such as an actuator, and application of an electrical signal between the first electrode and the second electrode may induce a deformation of the nanovoided polymer element with the response time. In some examples, the device includes a nanovoided polymer element, including an arrangement of voids in a polymer, the voids including a gas and having polymer walls therebetween, the polymer walls having a polymer wall thickness, where the device is an electroactive device having a response time, and the nanovoided polymer element has at least one characteristic selected from one or more of the following: the polymer has characteristic diffusion time for the gas of less than approximately one millisecond, the polymer wall thickness (e.g., the mean polymer wall thickness) is less than 10 microns, the characteristic diffusion time is less than one-tenth of the response time, or the wall thickness is less than four times the square root of the product of the diffusion coefficient and the response time. In some examples, an NVP may include one or more polymers, such as one or more of an acrylic polymer and/or a silicon-containing polymer (such as a silicone polymer). In some examples, a device may be flexible, and may conform to an underlying substrate.

In some examples, a computer-implemented method includes applying an electrical signal between the first electrode and the second electrode of an electroactive device, such as an electroactive device including an NVP, to obtain a desired deformation (e.g., a surface deformation) of the electroactive device. An example system may include: at least one physical processor; and physical memory including computer-executable instructions that, when executed by the physical processor, cause the physical processor to: apply electrical signals to an electroactive device, for example, to obtain actuation of the electroactive device, for example, to obtain a surface deformation. In some examples, computer-executable instructions may, when executed by the physical processor, cause the physical processor to receive electrical signals from an electroactive device, for example, to receive sensor signals from an electroactive sensor. In some examples, a system may include a haptic device, the surface deformation being induced within the haptic device.

In some examples, a non-transitory computer-readable medium includes one or more computer-executable instructions that, when executed by at least one processor of a computing device, cause the device to apply electrical signals between electrodes, such as the first and second electrodes, of the device to obtain a desired actuation of the device.

In some examples, a method of fabricating a nanovoided polymer element includes depositing a nanovoided polymer deposited using a process including at least one of spin coating, printing, chemical vapor deposition, vapor coating, transfer of a prefabricated polymer layer, dipping, or spraying. Example methods may further include deforming the nanovoided polymer element by at least one of stretching, extruding, or pressing to form the nanovoided polymer element. Electrodes, such as a first electrode and a second electrode, may be formed on the nanovoided polymer element, so that at least part of the nanovoided polymer element is located between the first electrode and the second electrode.

In some examples, anisotropic voids may be fabricated through processes such as pre-stretching or pre-tensioning a polymer element (such as an actuator element), for example, using an extrusion process, or a drawing process, or other process including a mechanical deformation such as stretching, pressing, or the like. Anisotropy can be locked in after stretching, for example, by further (e.g., complete) polymerization, cross-linking, curing, or other process.

Shaped voids may be formed using shaped particles that may later be removed (e.g., shaped sacrificial particles), distortion of emulsions or lyotropic phases as a function of chemical composition, temperature, salt or other component concentration, flow rate, agitation, external fields (such as ultrasound, electrical, electromagnetic such as optical or UV, or magnetic fields). In some examples, voids may be extended arbitrarily along a direction, such as a direction parallel to an electrode, so that the voids are elongated shaped tubes with, for example, an anisotropic cross-section.

Example devices include actuators, for example, having electrically-controllable compression, curvature, pressure on skin, texture, vibration, or other haptic function. Devices may be stacked to increase actuation. Example devices may be used to control optical elements, such as focal length or positional adjustments of lenses, mirrors, or other optical elements. In an example actuator device, an electrical voltage may be applied between two electrodes, where at least a part the NVP is between the two electrodes.

Applications may also include improved autofocus and adaptive optics applications, such as in imaging devices. Applications may also include wave-front correction of optical or other electromagnetic fields, for example, in projection systems. Examples include fine control actuators that can be combined with a coarser control actuator for extended actuation range. In some examples, actuators may be stacked to obtain enhanced actuation range. Examples also include sensors responsive to, for example, pressure (e.g., touch, acoustic signals), temperature, and the like. Anisotropic voids may allow a more reproducible deformation under pressure and improved sensor operation. A sensor circuit may determine the magnitude of a mechanical input from a capacitance changes. Example device structures described herein may also provide improved capacitance-deformation curves and improved sensor accuracy. Devices, such as sensors and actuators, may be curved, flexible. or otherwise conformal to an underlying substrate. Examples also include optical elements, such as gratings, holographic elements, lenses, mirrors, and the like. Electrodes may be transmissive or reflective. A device with reflective or transmissive electrodes may be an electrically-controllable optical element. In some examples, electrodes may be stretchable allowing bending. An example device may function both as an actuator and a touch sensor, and may also be reflective and/or optically transparent. Examples also include actuators configured to control a flexible lens (e.g., a liquid lens), flexible mirror, grating, prism, fiber, holographic element, or other optical element.

An electroactive device may include any device that either converts electrical energy to mechanical energy, or the reverse, or both, such as a sensor and/or an actuator. Electroactive devices may be used as haptic devices, optical elements, and other applications.

A nanovoided polymer may include a polymer material having voids therein. The voids may have a typical dimension of between 10 and 500 nm, such as between 50 and 200 nm. The voids may be closed cell (in which gas phase regions are isolated and surrounded by polymer) or open cell (in which gas phase regions are connected to each other).

Materials, for example, used in one or more components of an NVP-based device, may include one or more of the following: acrylates, halogenated polymers such as fluoropolymers including polyvinylidene difluoride (PVDF, polytetrafluoroethylene), copolymers of PVDF including PVDF:TrFE (poly(vinylidene fluoride-trifluoroethylene), other fluorinated polyethylenes, other fluorinated polymers, other polymers, or blends or derivatives thereof. Materials may include nanoparticles to increase dielectric constant, such as inorganic particles such as: titanates (including barium titanate or barium strontium titanate ($BaSrTiO_3$); oxides such as titanium dioxide ($TiO_2$), tantalum oxide ($Ta_2O_3$), aluminum oxide ($Al_2O_3$), or cerium oxide ($CeO_2$); other metal oxides such as other transition metal oxides, other non-metal oxides, or other compounds such as $PbLaZrTiO_3$, $PbMgNbO_3 + PbTiO_3$. In some examples, mixtures of curable monomers with cured polymers may also be used.

In some examples, a controller may be configured to apply of electrical signals to a plurality of electrodes of an electroactive device, for example, to obtain a desired surface deformation of an actuator and in some examples of an optical element including an actuator, such as a lens or mirror.

In some examples, a spatially addressable electroactive device includes: a nanovoided polymer element having a first and second surface; a first electrode supported by the NVP element, and a second electrode supported on the second surface. Example devices include a spatially addressable electroactive device such as an actuator, an optical element such as a transmissive or reflective optical element, or a sensor.

In some example devices, electrodes may be stretchable. In some example devices, an electrode may be disposed on a substrate, which may be a flexible and/or stretchable substrate. In some example devices, an NVP may support a plurality of electrodes (e.g., including the first electrode in examples above), and the second electrode may be a common electrode, such as a ground. In some examples, electrodes may include an array of electrical conductors of a pre-defined shape arranged in a pre-defined pattern.

In some examples, an electroactive device may be spatially addressable and provide the ability to apply and/or read different signals at different spatial locations on the device. In some examples, multiplexing schemes can be used to apply electrical signals. In some examples, electrode pairs may be provided by the intersection of electrode stripes on each side of the NVP, for example, between orthogonal electrode stripes.

Example devices may be used in a range of applications. For example, a spatially addressed nanovoided polymer can be locally actuated. Actuation may be controlled by the size and arrangement of the electrodes at that location, and the amount of voltage applied at those electrodes. Example devices can be used as an optical element, a touch sensor, a thermal sensor, a pressure sensor, or a haptic element in a wearable device.

In some examples, a device may further include a control circuit, the control circuit being configured to apply an electrical potential between the first electrode and the second electrode. A control circuit may be further configured to determine a physical deformation between the first electrode and the second electrode, for example, based on a capacitance determination. A device may be generally transparent, for example, including a nanovoided polymer that is generally transparent, and transparent electrodes (e.g., transparent conductive oxide electrodes such as tin oxide, indium tin oxide, and the like). A first electrode (and/or a second electrode) may be generally transparent, or in some examples may be generally reflective. A device may be flexible, and in some examples transparent and flexible.

In some examples, a device may include a spatially addressable actuator. Application of an electrical signal between the first electrode and the second electrode, and/or between other electrodes of the device, may induce a two-dimensional and/or three-dimensional conformational change of the nanovoided polymer element.

In some examples, a device may include an electrically controllable optical element, which may include one or more of a mirror, a lens, a prism, a grating, a phase place, a diffuser, a holographic element, a beam splitter, a beam combiner, or an optical filter. In some examples, the device may include a sensor, such as a touch sensor. An actuator may be controlled by an electrical potential between the first electrode and the second electrode, and a sensor responsive to a capacitance between the first electrode and the second electrode may be used to determine a degree of actuation (such as a displacement, relative displacement, or other deformation parameter).

In some examples, a computer-implemented method includes application of electrical signals to a plurality of electrodes to obtain a desired surface deformation of an actuator, wherein the surface of the actuator optionally supports a planarization layer on which the plurality of electrodes is disposed.

In some examples, a non-transitory computer-readable medium includes one or more computer-executable instructions that, when executed by at least one processor of a computing device, cause the computing device to control application of electrical signals to a plurality of electrodes to obtain a desired surface deformation of an actuator by application of electrical signals to electrodes. In some examples, signals of the same polarity may be applied to proximate electrodes to generate electrostatic repulsion and, for example, an increase in electrode separation.

In some examples, a nanovoided polymer includes anisotropic voids. Isotropic (spherical) voids may lead to non-uniform wall thicknesses and unstable buckling under compression. Anisotropic voids may provide more uniform wall thicknesses, and smoother and more reproducible electroactive response curves. Voids may be appreciably wider (e.g., in the plane of the electrodes) than tall, and the dimension ratio may range from, for example, at least 1.5, such as at least 1.7, for example, at least 2, up to, for example, 10. This anisotropy favors compression in a direction normal to the plane of the electrodes. Similar approaches may be used with larger size scales, such as microscale voids. However, actuator response times may be longer with larger voids, particularly for closed void configurations, and may depend on the oxygen or air solubility of the polymer used. In some examples, the relative gas solubility (e.g., the relative air solubility) in the polymer may be greater than 0.001, such as greater than 0.01, for example, greater than 0.1. A higher relative gas solubility may allow improved response times (e.g., an actuator response time, a sensor response time, or other electroactive device response time), and/or reduced hysteresis or creep. Example polymers may be elastomers, may include, for example, silicone or acrylic polymers, and may be thermoset or otherwise cured.

Example nanovoided polymers (NVPs) may include the polymerization of one or more monomers. The term polymerization may include co-polymerization. A nanovoided polymer may be formed using one or more monomers such as: acrylates (e.g., ethyl acrylate, butyl acrylate, octyl acrylate, ethyethoxy ethyl acrylate, chloromethyl acrylate, methacrylic acid, other acrylates, or some combination thereof), ethers (such as 2-chloroethyl vinyl ether, allyl glycidyl ether, other ethers, or some combination thereof), acrylamides (such as N-methylol acrylamide), amides, styrenes, other vinyl polymers, epoxides, isocyanates, and mixtures thereof. One or more monomers may be combined with a curing agent, such as polyamines, higher fatty acids or their esters, or sulfur may be used. Manufacturing approaches may include extrusion, compression, stretching, phase separation, partial void collapse under solvent removal (e.g., to give disk-shaped voids), some combination thereof, and the like. Applications include actuators, which may be relatively tolerant of random variations in void properties.

In some examples, electroactive devices may be fabricated by nanovoided a process including depositing a curable material (e.g., a monomer such as an acrylate or a silicone) and a solvent for the curable material onto a substrate, heating the curable material with at least a portion of the solvent remaining with the cured monomer, and removing the solvent from the cured monomer. Using this process, voids such as nanovoids may be formed in the electroactive element. In some embodiments, a flowable material (e.g., a solvent) may be combined with the curable materials (e.g., monomers and conductive materials) to create a flowable mixture that may be used for producing electroactive polymers with nanovoids. The monomers may be monofunctional or polyfunctional, or mixtures thereof. Polyfunctional monomers may be used as crosslinking agents to add rigidity or to form elastomers. Polyfunctional monomers may include difunctional materials such as bisphenol fluorene (EO) diacrylate, trifunctional materials such as trimethylolpropane triacrylate (TMPTA), and/or higher functional materials. Other types of monomers may be used, including, for example, isocyanates, and these may be mixed with monomers with different curing mechanisms.

In some examples, a method of generating a nanovoided polymer for use in connection with an electroactive device (such as electroactive devices described variously herein) may include co-depositing a monomer or mixture of monomers, a surfactant, and a nonsolvent material associated with the monomer(s) which is compatible with the surfactant. In various examples, the monomer(s) may include, but not be limited to, ethyl acrylate, butyl acrylate, octyl acrylate, ethoxy ethyl acrylate, 2-chloroethyl vinyl ether, chloromethyl acrylate, methacrylic acid, allyl glycidyl ether, and/or N-methylol acrylamide. Other curing agents such as polyamines, higher fatty acids or their esters, and/or sulfur may be used as the monomer(s). In some aspects, the surfactant may be ionic or non-ionic (e.g., sorbitan monooleate). In some examples, the non-solvent material may include organic and/or inorganic non-solvent materials. For instance, the non-solvent material may include water or a hydrocarbon or may include a highly polar organic compound such as ethylene glycol. The monomer(s), non-solvent, and surfactant material(s) may be co-deposited. Alternatively, the monomer(s), non-solvent, and/or surfactant may be deposited sequentially. In some examples, a substrate temperature may be controlled to generate and control one or more properties of, for example, an emulsion generated by co-depositing or sequentially depositing the materials. The substrate may be treated to prevent destabilization of the emulsion. For example, a metal layer, such as an aluminum layer, may be coated with a thin polymer layer formed by depositing a monomer, followed by curing the monomer.

In some examples, a device includes a nanovoided polymer element, including an arrangement of voids; a first electrode; and a second electrode, wherein the nanovoided polymer element is located at least in part between the first electrode and the second electrode, and the arrangement of voids includes anisotropic voids, the anisotropic voids having a first dimension greater than a second dimension. The voids may have an anisotropy parameter determined by a ratio of a first dimension measured parallel to the first electrode divided by a second dimension measured perpendicular to the first electrode. Voids with an anisotropy parameter of one may be termed isotropic voids. In some examples, the anisotropy parameter is in the range 1.5-10, for example, in the range 1.7-10, such as in the range 2-10, for example, the range 2-8, for example, in the range 4-8. In some examples, ranges are inclusive and/or may be approximate. In some examples, the anisotropy parameter is at least 1.5. In some examples, the anisotropy parameter is at least 2. The anisotropy parameter (or other parameter, such as wall thickness or void dimension) may be determined as an average, such as a median or mean, for a portion of the nanovoided polymer element. The arrangement of voids may be configured so that polymer wall thicknesses between neighboring voids are generally uniform. For example, a thickest portion of the polymer walls may be no greater than 50% larger than a thinnest portion. This ratio may be determined by sectioning the nanovoided polymer element and determining an average (such as a median or mean) for a portion of the element. The portion may include, for example, approximately 20 voids. In some examples, a device includes a nanovoided polymer element, having an arrangement of voids therein; a first electrode; and a second electrode, wherein the nanovoided polymer element is located at least in part between the first electrode and the second electrode, and the arrangement of voids is configured so that polymer wall thicknesses between neighboring voids are generally uniform. A void shape may be designed to increase the uniformity of polymer walls. The arrangement of voids may include anisotropic voids that are configured to increase polymer wall thickness uniformity, with the anisotropic voids having a first dimension greater than a second dimension. In some examples, the device may be (or include) an actuator. In some examples, a device may include a polymer having anisotropic nanovoids, the nanovoids have an anisotropy ratio determined by a ratio of a first dimension measured along a first direction, and a second dimension measured along a second direction perpendicular to the first direction. In some examples, the anisotropy ratio may be at least approximately 2, for example, when the anisotropic nanovoided polymer is in a generally uncompressed state. For example, a generally uncompressed state may be state in which no electrical field is applied between the electrodes of an actuator, or a generally uncompressed state may include a state in which a device (e.g., a sensor) is not subject to an appreciable mechanical deformation. In some examples, compression of a device (e.g., mechanical deformation and/or electroconstriction) may further increase the anisotropy ratio.

In some examples, a device may further include a control circuit, wherein the control circuit is configured to apply an electrical potential between the first electrode and the second electrode. The device may be a spatially addressable actuator and may be a component of a haptic device. The device may be flexible, for example, the device may have optional flexible substrates, on which flexible electrodes are disposed, sandwiching a flexible nanovoided polymer layer. Application of an electrical signal between the first electrode and the second electrode may induce a deformation of the nanovoided polymer element, a pressure on a neighboring element, or movement of a neighboring element.

In some examples, a device may be (or include) an electrically controllable optical element, such as an electrically adjustable mirror or lens, and may be a component of a virtual reality or augmented reality system, a camera (such as a phone camera, video camera, self-contained camera), a projection system, telescope, binoculars, a portable electronic device, computer, or any other electronic device or optical device, such as any autofocus system. The device may include one or more of a mirror, a lens, a prism, a grating, a phase plate, a diffuser, a holographic element, a beam splitter, a beam combiner, or an optical filter. The device may be (or include) a sensor. Examples include sensors (including touch sensors and any transducers) having greatly improved performance, particularly for relatively large mechanical inputs that induce significant mechanical compression (e.g., over 20%).

An example computer-implemented method includes applying an electrical signal between the first electrode and the second electrode of a device to obtain a desired surface deformation of the electroactive device. An example system includes at least one physical processor and physical memory including computer-executable instructions that, when executed by the physical processor, cause the physical processor to control application of electrical signals to a device to obtain an actuation of the device, and/or receive electrical signals from the device to obtain a sensor determination, for example, a touch detection or other sensor input. An example system includes a haptic device, with a desired surface deformation being induced within the haptic device to provide haptic feedback to a user. An example system includes an optical element, with the desired surface deformation being induced within the optical element, and/or inducing a movement or deformation of an optical element such as a lens or mirror. An optical element may be a component of an augmented reality and/or virtual reality system, for example, a headset, glasses, glove or other AR/VR system or component thereof. An example non-transitory computer-readable medium includes one or more computer-executable instructions that, when executed by at least one processor of a computing device, cause the computing device to apply electrical signals to a device, for example, between the first and second electrodes of a device to obtain a desired actuation of the device, or a desired actuation of an optical element, or receive to receive sensor signals from a device.

In some examples, a method of fabricating an anisotropic nanovoided polymer element includes depositing a nanovoided polymer using a process including at least one of: spin coating, printing, chemical vapor deposition, vapor coating, transfer of a prefabricated polymer layer, dipping, or spraying; and deforming the nanovoided polymer element by at least one of stretching, extruding, or pressing, to form the anisotropic nanovoided polymer element. A fabrication method may further include forming electrodes, such as a first electrode and a second electrode on the anisotropic nanovoided polymer element so that at least part of the anisotropic nanovoided polymer element is located between the first electrode and the second electrode.

In some examples, a computer-readable medium may include one or more computer-executable instructions that, when executed by at least one processor of a computing device, may cause the computing device to apply electrical signals to a plurality of electrodes of an electroactive device including a nanovoided polymer element, to obtain a desired surface deformation of the electroactive device.

A method of operating a device may include applying an electric field between the first electrode and the second electrode of the device; inducing a contraction of the anisotropic nanovoided polymer, where the contraction may include an electroconstriction along a direction of the electric field; and (optionally) mechanically coupling the contraction to a haptic output. In some examples, the device may be a haptic device. In some examples, an actuator may be used to control a mechanical, electrical, or optical element, such as a moveable element (such as a position adjuster for a supported component), a variable electrical component (such as a tunable capacitor or other adjustable component), or to control the optical properties of an adjustable optical component (such as a lens, mirror, diffractive component, or holographic element). In some examples, the contraction of the nanovoided polymer along the electric field may include a deformation of anisotropic voids, which may be elongated in at least one direction perpendicular to the electric field. For example, the anisotropic voids may have an oblate spheroid shape (even with no electric field applied), and may be elongated within a plane perpendicular to the electric field (or, elongated within a plane parallel to the plane of at least one electrode, such as the first electrode). In some examples, the anisotropy of the voids (e.g., an anisotropy ratio) may increase as the electric field is increased.

Application of an electric field to an anisotropic NVP may induce contraction, through electro-constriction of an electroactive polymer matrix. A control circuit may be used to modulate the electro-constriction, for example, through the application of voltage pulses between the electrodes. In some examples, an oscillatory mechanical vibration may be electrically induced in the actuator.

FIG. 20 illustrates an example method 2000 of forming a voided polymer element, such as a nanovoided polymer element, or of making an electroactive device including one or more such elements. Example methods may include, for example, forming an emulsion including fluid droplets within a liquid medium (2010). The method may further include partially polymerizing the liquid medium to form fluid droplets in a (partially polymerized) material layer (2020); deforming the material layer to form anisotropic fluid droplets within the material layer (2030); and polymerizing the material layer to form anisotropic voids in a polymer element (2040). In this example, the term "anisotropic voids" may include anisotropic fluid droplets (e.g., in a polymer matrix), and the term "anisotropic voided polymer" may include a polymer including anisotropic voids. In some examples, the term void may not necessarily refer to the absence of material, and may refer to a non-solid portion of a solid matrix. For example, fluid-filled regions of a polymer matrix may be referred to as voids. Example methods may optionally further include removing the one or more liquid components from the polymer element, for example, to replace a fluid with another fluid, such as another gas or liquid. Example methods include methods of forming an anisotropic voided polymer element, for example, including anisotropic voids within a polymer matrix. The voids may include nanovoids. Examples may further include depositing a pair of electrodes on the anisotropic voided polymer element, so that at least a portion of the anisotropic voided polymer element is located between the pair of electrodes. The pair of electrodes may be part of a larger plurality of electrodes. Example methods may further include fabrication of an actuator and/or sensor device using the anisotropic voided polymer element, for example, using the pair of electrodes to apply an electric field to an anisotropic nanovoided polymer element, or to receive electrical signals from the pair of electrodes in response to a deformation of the anisotropic nanovoided polymer element.

In some examples, an example method of forming a voided polymer element, such as a nanovoided polymer element, or an electroactive device including one or more such elements, may include, for example, forming voids in a polymer matrix (e.g., as an array or irregular arrangement of voids). The example method may further include deforming the polymer matrix to form anisotropic voids in a polymer matrix. This may be termed an anisotropic voided polymer. The example method may also optionally include depositing electrodes on an anisotropic voided polymer, so that, for example, at least a portion of the anisotropic voided polymer is located between a pair of electrodes. Electrodes may be formed directly on a surface of the anisotropic voided polymer or may be formed on one or more intermediate layers disposed thereon.

Figure 21A:
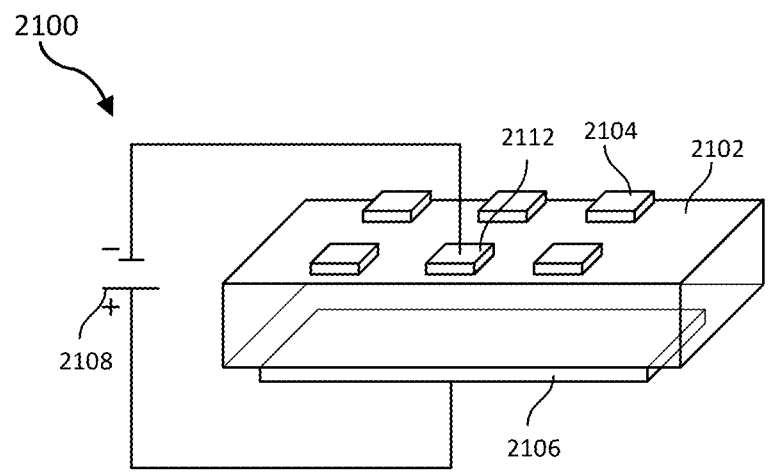
FIG. 21A-21B depict exemplary NVP elements having electrodes disposed thereon, in accordance with some embodiments.
Figure 21B:
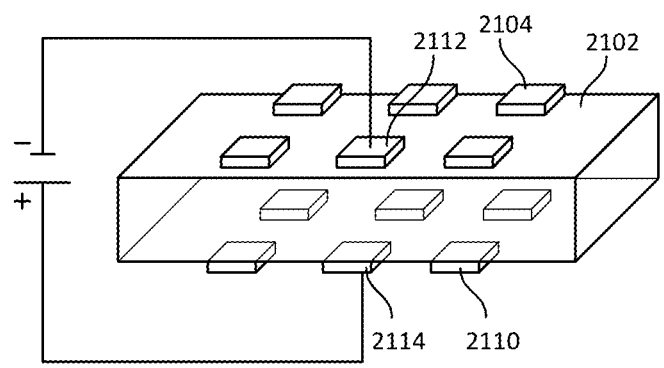

FIGS. 21A-21B show example configurations (e.g., arrangements and shapes) of first and second electrodes on a nanovoided polymer element. In these examples, the NVP element is shown as a rectangular block, which may represent an nanovoided polymer element having anisotropic voids. FIG. 21A shows an arrangement of upper electrodes and a common lower electrode. FIG. 21B shows application of an electric field to opposed electrodes.

FIG. 21A shows a device 2100 including a nanovoided polymer (NVP) element 2102 having a first plurality of electrodes (such as electrodes 2104 and 2112) on a first surface and a second common electrode 2106 on a second surface of the NVP element. The second electrode may act as ground plane electrode for some or all of the first plurality of electrodes. A voltage source 2108 allows application of electrical signals between electrodes. For clarity, only electrical connections to electrodes 2112 and 2106 are shown. In some examples, a control circuit with a plurality of electrical connections may be used to apply electrical signals to some or all of the plurality of electrodes, and/or the common electrode. Applied electrical signals may include alternating voltages and/or direct voltages.

FIG. 21B shows a first plurality of electrodes (such as electrodes 2104 and 2112) disposed on an NVP element, in a similar manner to that shown in FIG. 21A. In this example, the second surface of the NVP element supports a second plurality of electrodes (such as electrodes 2110 and 2114). In this example, the first and second pluralities of electrodes (in this case, first and second electrode arrays) are positionally aligned with respect to each other. For example, electrode 2112 (of the first plurality of electrodes) is located in positional registration with electrode 2114 (of the second plurality of electrodes). An electric field applied between electrode 2112 and electrode 2114 may be generally normal to the surfaces of the NVP element on which the electrodes are deposited. In some examples, anisotropic voids may be elongated along at least one direction parallel to the direction of the applied electric field.

In some examples, an NVP element may have an array of stripe electrodes on one surface, and an orthogonal array of stripe electrodes on the opposite surface. Electrical signals may be applied between opposite portions of the electrodes using a multiplexing approach.

Segmental actuation and/or segmented sensor signals may be determined by the size of the stimulated electrode pair, for example, the area of one or both electrodes, and their separation. Each electrode element may be physically and/or electrically separated from one another to limit electrical cross-talk between neighboring electrode element, such as between pixels of a pixelated electrode array.

Figure 22A:
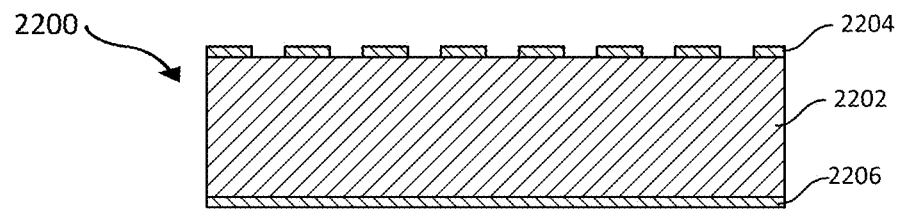
FIGS. 22A-22C depict exemplary actuators in accordance with some embodiments.
Figure 22B:
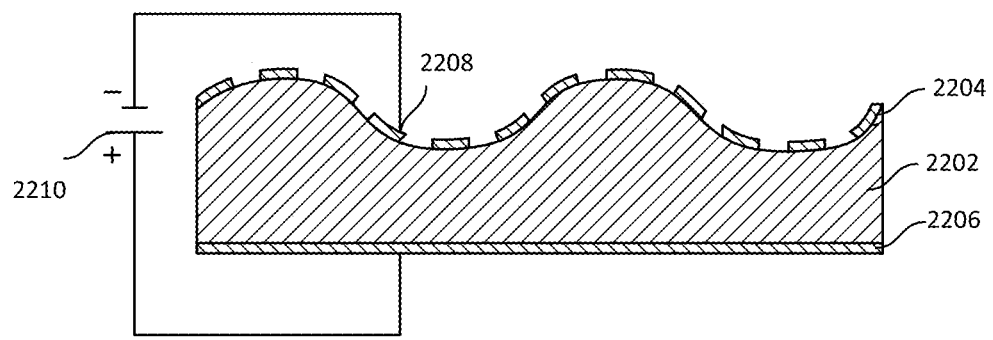
Figure 22C:
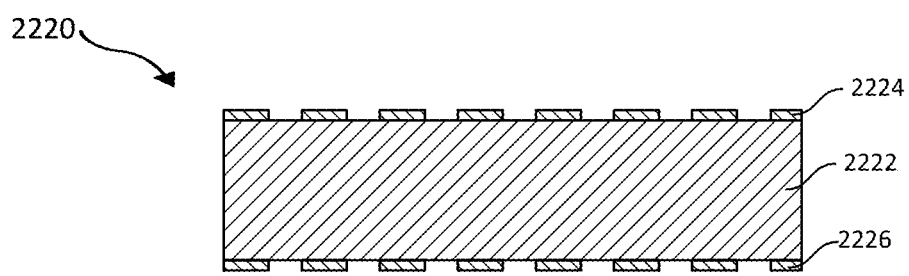

FIGS. 22A-22C show cross-sectional views of electrode arrangements and the corresponding actuated states of example electroactive devices. FIG. 22A shows a device 2200 including a nanovoided polymer (NVP) element 2202, a plurality of electrodes on a first surface of the NVP element, including electrode 2204 and a common electrode 2206 disposed on a second surface of the NVP element. In some examples, a control circuit may be used to apply variable voltages to one or more of the plurality of electrodes on the upper surface of the NVP element. The figure shows an undeformed structure. In some examples, an NVP element may be formed having an irregular structure, such as having an undulating surface, which may be effectively planarized or otherwise deformed using appropriate electrical signals applied, for example, to electrodes of the plurality of electrodes as a function of position.

FIG. 22B shows a spatially varying deformation of the NVP element 2202 that may be induced by applying different voltages to each of the plurality of electrodes. The figure shows a voltage source 2210 that may be used to apply voltage between one or more electrodes of the plurality of electrodes and the common electrode. For illustrative clarity, only an electrical connection to an electrode 2208, of the plurality of electrodes, and common electrode 2206 is shown. In some examples, a control circuit with a plurality of electrical connections may be used to apply voltages between, for example, each of the plurality of electrodes (such as electrodes 2204 and 2208) and the common electrode (2206). In some examples, the voltage applied to each of the electrodes of the first plurality of electrodes may have a repeating variation, such as an approximation to a sinusoidal, square-wave, or triangular wave variation. This may be used to obtain, for example, a corresponding periodically repeating deformation of the NVP element. In other examples, the deformation may not have a periodic variation, and may include a non-periodic undulation, concave deformation, convex deformation, parabolic deformation, or other form of repeating or non-repeating spatial variation. Example approaches may be used to obtain electrically-controllable diffractive, reflective, refractive, holographic, or other forms of optical elements.

The degree of deformation (e.g., electrically-induced constriction) between the electrodes may be controlled by adjusting the voltage between one or more of the plurality of electrodes and the common electrode, for example, as a function of the position of the electrodes. In some examples, the upper surface of the NVP element may have an electrically controllable curved surface, which may be used for example, in an electrically-controlled optical element, such as an electrically-controlled lens or mirror. For example, a smooth concave or convex upper surface may be obtained by applying electric signals having a magnitude (e.g., DC voltage, or RMS voltage) that is an appropriate function of position.

In FIGS. 22A-22B, the common electrode 2206 may be a rigid electrode, or may be deposited on a rigid substrate. In some examples, the deformation occurs mostly on the first surface (the top surface, as illustrated) and may be controlled, for example, by varying the applied voltage to each electrode as a function of position. The surface deformation may include, for example, one or more of: an undulating structure, a parabolic or other curved structure (e.g., either convex or concave), an oblique structure (e.g., a tilted surface formed by an approximately linear degree of deformation as a function of position), or other structure.

Electrical potentials may be applied between each electrode (or between selected electrodes) of a plurality of electrodes and a common electrode may be used to obtain a desired surface deformation, for example, an undulating pattern, a curved deformation (such as a concave or convex mirror), a tilt, and the like. This approach may be used to generate a desired haptic feedback, texture, or optical property (e.g., a diffraction grating, or spatially variable phase delays, for example, to create interference fringes). The root mean square (RMS) magnitude and time dependence of applied fields may be varied to obtained desired dynamic (time-varying) properties. For example, the applied electrical signal may be modulated to obtain a tactile sensation. In FIG. 22B, the lower surface of the NVP does not distort, for example, due to a relatively rigid underlying substrate (not shown). In some examples, such as discussed elsewhere, both surfaces of the NVP (and any attached flexible substrates) may distort. In some examples, the thickness of the NVP layer may vary laterally, for example, having alternating relatively narrow and relatively thicker regions. For example, the thickness variation may be oscillatory, tapered, or otherwise varying. In some examples, a sinuous distortion may be obtained. Reflective, refractive, and/or diffractive optical elements may be obtained using this approach.

FIG. 22C shows another example configuration, in which each of the first and second opposed surfaces of the NVP element support a plurality of electrodes. The figure shows a device 2220 including an NVP element 2222 having a first plurality of electrodes (such as electrode 2224) on one surface, and a second plurality of electrodes (such as electrode 2226) on the second surface.

In some examples, a control circuit with a plurality of electrical connections may be used to apply voltages between, for example, each of a first plurality of electrodes on a first surface and a corresponding (e.g., opposed) electrode of a second plurality of electrodes on a second surface, or between some other combination of electrodes. In some examples, the thickness of the NVP element may vary with position based on the magnitude of electric signals applied between different pairs of electrodes. In some examples, the NVP may take on an undulating configuration, for example, based in part on voltages applied between laterally offset electrodes on opposed surfaces. In some examples, the deformation of the NVP element may include a spatially varying thickness and a spatially varying undulation.

The degree of deformation (e.g., electrically-induced constriction) between the electrodes may be controlled by adjusting the voltage between one or more of the corresponding pairs of opposite electrodes, for example, as a function of the position of the electrodes. In some examples, the upper surface and/or the lower surface of the NVP element may have an electrically controllable curved surface, which may be used for example, in an electrically-controlled optical element, such as an electrically-controlled lens or mirror.

In some examples, the actuator may be in contact with another flexible and conformal substrate. The actuation can generate a force or displacement of that substrate. It can also generate changes in capacitance, resistance, and optical properties such as refractive index or optical phase of the nanovoided polymer. The nanovoided polymer under individual electrode can be switched using an active matrix backplane or a passive matrix backplane. Flexible backplanes made from organic thin film transistors and stretchable interconnects may also be used. For sensing, the perturbations can be in the form of mechanical or thermal inputs that can be sensed by this sensor.

In some examples, a nanovoided polymer element may be used as a transmissive optical element where the actuated state of the device may be a lens or a grating. In some examples, both the first and second electrodes are transparent. In some examples, an optical element may be driven by a transparent active matrix such as transparent nanowire transistor circuitry. In some examples, a device may include a reflective optical element. In such cases, the NVP (or the electrodes) need not be transparent, for example, if the reflective element (e.g., a mirror) is on the outer surface so that light does not pass through the NVP element. In some examples, one electrode may be transparent and/or may be stretchable, and the other electrode may be reflective.

In some examples, an electric field may be applied between laterally offset electrodes, which may provide a lateral component to the electrical field and hence electroactive constriction along a direction, for example, parallel to the surfaces of the NVP on which electrodes are supported. In some examples, bending may be obtained. In some examples, lateral fields may be applied between electrodes on the same surface. Electrodes may be arranged in any desired arrangement, such as a 1D or 2D array, a sinuous pattern, irregular pattern, and the like. In some cases, an electrode may be elongated, for example, disposed on the surface as a stripe electrode. Electrode stripes may be straight (e.g., a highly elongated rectangular shape), wiggly, or wavy.

Figure 23:
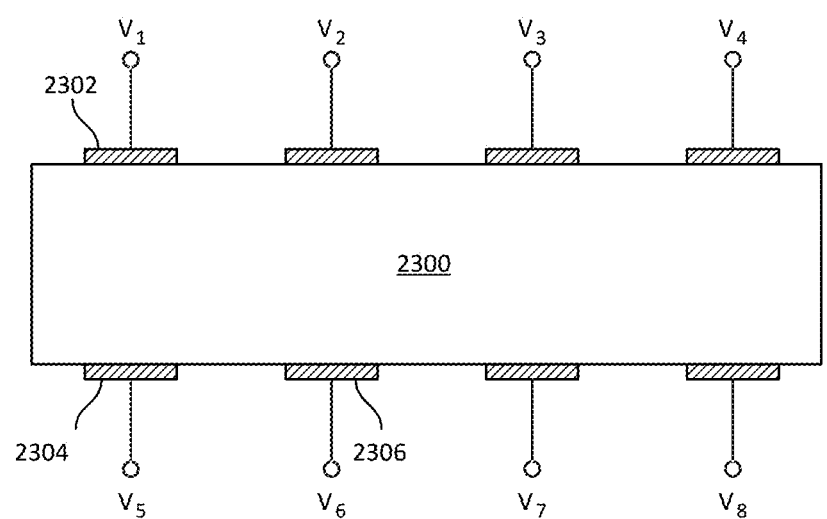
FIG. 23 depicts an exemplary electrode arrangement, in accordance with some embodiments.

FIG. 23 depicts an exemplary electrode arrangement in accordance with some embodiments. As shown in this figure, a device may include an NVP element 2300 having a plurality of electrodes (such as electrode 2302) on a first surface, and a second plurality of electrodes (such as electrodes 2304 and 2306) on a second surface. A control circuit (not shown) may be used to apply voltages $V_1 \ldots V_8$ to each (or some) of the various illustrated electrodes. For example, there may be electrical potential differences (voltages) between various electrodes, for example, between $V_1$ and $V_5$, $V_2$ and $V_6$, $V_3$ and $V_7$, and/or between electrodes $V_4$ and $V_8$. Selective compression of an end portion may be achieved by applying an electrical potential across an end portion, for example, between electrode 2302 (at potential $V_1$) and electrode 2304 (at potential $V_5$), or between potentials $V_4$ and $V_8$. For compression of a central region, an electrical potential may be applied between opposed electrodes within the central portion, for example, by applying differing electrical potentials at $V_2$ and $V_6$, and/or between $V_3$ and $V_7$. It is also possible to obtain a component of in-plane electrical field (and hence in-plane compression) by applying an electrical potential between laterally offset electrodes, for example, using a potential difference between $V_1$ and either $V_6$, $V_7$, or $V_8$. Other electrodes may float (e.g., be electrically isolated), be grounded, or have some other electrical potential applied to them.

Furthermore, a control circuit may be used to dynamically adjust electric potentials to provide vibratory or other oscillatory deformations, which may be used to provide haptic feedback.

FIG. 24 shows a voided polymer material including a periodic array of voids. FIG. 15 shows a voided polymer material 2400, including a periodic array of anisotropic voids 2420 in a polymer matrix 2410. In this example, as illustrated, the anisotropic voids 2420, shown in cross-section, have an internal horizontal dimension that is appreciably greater than the internal vertical dimension, and hence have appreciable anisotropic shape. In some examples, the voids may have a generally prolate spheroid shape. In some examples, voids may have a generally oblate spheroid shape, or another shape having the illustrated cross-section. In some examples, the voids may include nanovoids having an internal dimension of less than approximately 1 micron.

In some examples, voids, such as nanovoids, may be arranged in a regular array, with periodic variations in one, two, or three orthogonal directions. However, in some examples, there may be no regularity to the arrangement of voids in the polymer matrix.

In some examples, shaped voids may be formed using shaped particles that may be added to the material. Sacrificial particles may then be later be removed from the material. For example, anisotropic sacrificial particles may be added to a material, and then removed to leave anisotropic voids in the material. In some examples, particles may include hollow particles, such as anisotropic hollow particles. For example, hollow particles may include nanoballoons that may be added to a material, and may remain in an anisotropic nanovoided polymer. In some examples, the interior of a hollow anisotropic particle, such as the interior of a nanoballoon, may provide the anisotropic void. In some examples, particles may be initially spherical, and may then be deformed to form anisotropic particles by any appropriate method, such as the methods described herein for forming anisotropic voids. Example methods may include heating a material to facilitate deformation of particles into anisotropic particles. For example, hollow particles such as nanoballoons may be deformed at an elevated temperature. In some examples, particles may include polymer particles, such as hollow polymer particles. In some examples, particles may be heated above a glass transition temperature of a polymer component of a particle.

Shaped voids may also be formed using deformations of emulsions, lyotropic phases, or other soft matter phases, using applied fields, such as electrical or magnetic fields, and these may be applied in sequence with or concurrently with other deformations such as stretching, or as one or more material components are polymerized.

In some examples, spatial variation in material properties may be introduced, for example, by introducing variations (e.g., temporal and/or spatial variation) in one or more of the following: chemical composition, temperature of the material, salt or other component concentration, flow rate, agitation, vibrational amplitude, or external field strength (e.g., of ultrasound, electrical, or electromagnetic fields, such as optical or UV, or magnetic fields).

In some examples, shaped voids may be generated through nanopatterning using phase masks on photosensitive elastomers. Shaped voids may also be formed using a gas-diffusion expansion process.

Nonuniform void shape distributions may be achieved by applying a gradient in intensity of the radiation source throughout the partial polymerization. In regions subject to greater radiation intensity (and/or greater irradiation time, or other measure of effectiveness such as wavelength), polymerization may advance further. This may lead to a spatial variation in the Young's modulus of the material. When the material is stretched, a region with a lower Young's modulus may stretch more, and voids in those regions may have a larger anisotropy after stretching, compared to voids in regions having a higher Young's modulus.

In some examples, a deposition process (e.g., a printing process, such as ink jet printing) may allow deposition of a material having a spatially variable composition. For example, there may be a spatial variation in one or more of the following: concentration of crosslinker, material composition (e.g., monomer composition), and the like. After full or partial polymerization, there may be a spatial variation in a material property, such as Young's modulus, allowing a spatially varying anisotropy of voids.

In some examples, the Poisson ratio of the polymer emulsion may determine the aspect ratio of the voids after the stretching of the film. The Poisson ratio relates, for example, the amount of compression (or other deformation along a certain direction) to a certain amount of deformation in a transverse direction.

When the material is used for dielectric applications, pre-stretching may have beneficial effects on the dielectric performance. Pre-stretching the film may increase the pressure inside of the material, for example, pushing volatiles out of the voids, and thereby increasing the breakdown voltage.

In some examples, a device includes an anisotropic nanovoided polymer including anisotropic nanovoids in a polymer matrix, a first electrode, and a second electrode. At least a portion of the anisotropic nanovoided polymer may be located between the first electrode and the second electrode. The anisotropic nanovoids may include oblate voids, such as oblate nanovoids. In some examples, an oblate nanovoid may be a nanovoid having an internal dimension of less than 1 micron. In some examples, an oblate nanovoid may have a generally oblate spheroidal shape, having an equatorial diameter greater than an (orthogonal) polar diameter. In some examples, an anisotropic nanovoided polymer may include prolate nanovoids, for example, nanovoids having a generally prolate spheroidal shape (e.g., having a polar diameter greater than an equatorial diameter). In some examples, a pair of electrodes may be spaced apart and generally parallel to each other, and the anisotropic nanovoided polymer may be a layer located at least in part between the pair of electrodes. The pair of electrodes may be part of a plurality of electrodes. In some examples, the equatorial plane of oblate spheroids may be generally parallel with the plane of one or more electrodes. For example, the oblate nanovoids may have a dimension parallel to the electrodes that is appreciably greater than a dimension perpendicular to the electrodes. In some examples, prolate nanovoids may have a dimension parallel to the electrodes that is greater than a dimension perpendicular to the electrodes. In some examples, an anisotropy ratio may be defined as the magnitude of a ratio of a dimension parallel to the electrodes to a dimension perpendicular to the electrodes. The anisotropy ratio may be at least approximately 1.5, and in some examples, may be at least approximately 2.

In some examples, a device includes a nanovoided polymer element (including an arrangement of voids), a first electrode, and a second electrode, where the nanovoided polymer element is located at least in part between the first electrode and the second electrode, and the arrangement of voids includes anisotropic voids, the anisotropic voids having a first dimension greater than a second dimension. The first dimension may be measured along a first direction, and the second dimension may be measured along a second direction. For example, the first and second directions may be orthogonal. In some examples, a device may further include a control circuit configured to apply an electrical field between the first and second electrodes. In some examples, the electrical field may be applied generally parallel to the second direction.

In some examples, a nanovoided polymer has void dimensions and polymer wall thicknesses that are sufficiently small such that gas exchange between the voids and polymer walls is rapid compared to device actuation times. Example NVPs may have voids with a dimension less than 1 micron. Actuator response times may be reduced, and available compression ratios increased, relative to NVPs with larger voids or NVPs formed from polymers that do not absorb gases. Effectively instantaneous gas exchange between the voids and polymer walls reduces (and may substantially eliminate) hysteresis and creep. A maximum desired wall thickness may be determined from the actuator response time and the gas diffusion coefficient of the polymer. Example polymers may be elastomers. A polymer may include, for example, a silicone or an acrylic polymer, and the polymer may be thermoset, cured, or otherwise polymerized. Manufacturing approaches may include extrusion, compression, stretching, phase separation, partial void collapse under solvent removal (e.g. to give disk-shaped voids), some combination thereof, and the like. In some examples, void interior surfaces have a coating (such as a surfactant or fluoropolymer) that reduces any tendency of the interior walls to stick to each other. Applications include devices such as actuators and sensors, which may be relatively tolerant of random variations in void properties. In some examples, actuators are fabricated in a pre-tensioned state (e.g. an initial stretch of 20-30%) and may have a negative spring constant over part of the deformation response.

Example Embodiments

Example 1

A device, including: a first electrode; a second electrode; and an anisotropic nanovoided polymer including anisotropic nanovoids within a polymer matrix, the anisotropic nanovoids separated from each other by polymer walls having a mean wall thickness, the anisotropic nanovoids including a gas, where: at least a portion of the anisotropic nanovoided polymer is located between the first electrode and the second electrode; the gas has a characteristic diffusion time to diffuse half the mean wall thickness through the polymer walls; the device is an electroactive device having a response time for a transition from a first state to a second state; and the characteristic diffusion time is less than the response time.

Example 2

The device of Example 1, where the mean thickness of the polymer walls is sufficiently thin so that the gas can diffuse through the polymer walls during the response time.

Example 3

The device of any of Examples 1 and 2, where the characteristic diffusion time for the gas is less than approximately one millisecond.

Example 4

The device of any of Examples 1-3, where the device is an actuator, and the response time is an actuation time for the transition from the first state to the second state in response to an electric field applied between the first electrode and the second electrode.

Example 5

The device of any of Examples 1-4, where the first state is a generally uncompressed state.

Example 6

The device of any of Examples 1-5, where the second state is compressed by at least 50%, relative to the first state, along a compression direction parallel to the electric field.

Example 7

The device of any of Examples 1-6, where the anisotropic nanovoids in a generally uncompressed state are elongated along at least one direction perpendicular to the compression direction.

Example 8

The device of any of Examples 1-7, where the mean wall thickness of the polymer walls is less than 1 micron.

Example 9

The device of any of Examples 1-8, where the response time is less than approximately 1 millisecond.

Example 10

The device of any of Examples 1-9, where the response time is at least ten times greater than the characteristic diffusion time.

Example 11

The device of any of Examples 1-10, where the polymer matrix includes an electroactive polymer.

Example 12

The device of any of Examples 1-11, where the electroactive polymer shows appreciable electroconstriction when an electric field is applied between the first electrode and the second electrode.

Example 13

The device of any of Examples 11-12, where the electroactive polymer includes a silicone polymer.

Example 14

The device of any of Examples 1-13, where the silicone polymer is polydimethylsiloxane, or a derivative thereof.

Example 15

The device of any of Examples 1-14, where the gas includes air.

Example 16

The device of any of Examples 1-15, where the anisotropic nanovoids have an anisotropy ratio determined by a ratio of a first dimension measured along a first direction, and a second dimension measured along a second direction perpendicular to the first direction, where the anisotropy ratio is at least approximately 2 when the anisotropic nanovoided polymer is in a generally uncompressed state.

Example 17

The device of any of Examples 1-16, where the device is sensor, and the response time is a deformation time for a mechanically-induced transition from the first state to the second state.

Example 18

A method, including: applying an electric field between a first electrode and a second electrode to switch an actuator from a first state to a second state, where the actuator includes a nanovoided polymer located between the first electrode and the second electrode, the nanovoided polymer including nanovoids enclosing a gas separated by polymer walls, the second state is compressed parallel to the electric field relative to the first state, and a characteristic diffusion time of the gas through the polymer walls is less than a response time of the actuator.

Example 19

The method of Example 18, where the second state is at least 50% compressed along a compression direction of the electric field, relative to a generally uncompressed state.

Example 20

The method of any of Examples 18 and 19, where the response time of the actuator is 1 millisecond or less.

FIG. 25 shows an example near-eye display system such as an augmented reality system. The system 2500 may include a near-eye display (NED) 2510 and a control system 2520, which may be communicatively coupled to each other. The near-eye display 2510 may include lenses 2512, electroactive devices 2514, displays 2516, and a sensor 2518. Control system 2520 may include a control element 2522, a force lookup table 2524, and augmented reality logic 2526.

Augmented reality logic 2526 may determine what virtual objects are to be displayed and real-world positions onto which the virtual objects are to be projected. Accordingly, augmented reality logic 2526 may generate an image stream 2528 that is displayed by displays 2516 in such a way that alignment of right- and left-side images displayed in displays 2516 results in ocular vergence toward a desired real-world position.

The control system 2522 may be configured to control one or more adjustable lenses, for example, a fluid element located within a near-eye display. Lens adjustment may be based on the desired perceived distance to a virtual object (this may, for example, include augmented reality image elements).

Control element 2522 may use the same positioning information determined by augmented reality logic 2526, in combination with force lookup table (LUT) 2524, to determine an amount of force to be applied by electroactive devices 2514 (e.g., actuators), as described herein, to lenses 2512. Electroactive devices 2514 may, responsive to control element 2522, apply appropriate forces to lenses 2512 to adjust the apparent accommodation distance of virtual images displayed in displays 2516 to match the apparent vergence distance of the virtual images, thereby reducing or eliminating vergence-accommodation conflict. Control element 2522 may be in communication with sensor 2518, which may measure a state of the adjustable lens. Based on data received from sensor 2518, the control element 2522 may adjust electroactive devices 2514 (e.g., as a closed-loop control system).

In some embodiments, display system 2500 may display multiple virtual objects at once and may determine which virtual object a user is viewing (or is likely to be viewing) to identify a virtual object for which to correct the apparent accommodation distance. For example, the system may include an eye-tracking system (not shown) that provides information to control element 2522 to enable control element 2522 to select the position of the relevant virtual object.

Additionally or alternatively, augmented reality logic 2526 may provide information about which virtual object is the most important and/or most likely to draw the attention of the user (e.g., based on spatial or temporal proximity, movement, and/or a semantic importance metric attached to the virtual object). In some embodiments, the augmented reality logic 2526 may identify multiple potentially important virtual objects and select an apparent accommodation distance that approximates the virtual distance of a group of the potentially important virtual objects.

Control system 2520 may represent any suitable hardware, software, or combination thereof for managing adjustments to adjustable lenses 2512. In some embodiments, control system 2520 may represent a system on a chip (SOC). As such, one or more portions of control system 2520 may include one or more hardware modules. Additionally or alternatively, one or more portions of control system 2520 may include one or more software modules that perform one or more of the tasks described herein when stored in the memory of a computing device and executed by a hardware processor of the computing device.

Control system 2520 may generally represent any suitable system for providing display data, augmented reality data, and/or augmented reality logic for a head-mounted display. In some embodiments, a control system 2520 may include a graphics processing unit (GPU) and/or any other type of hardware accelerator designed to optimize graphics processing.

Control system 2520 may be implemented in various types of systems, such as augmented reality glasses, which may further include one or more adjustable focus lenses coupled to a frame (e.g., using an eyewire). In some embodiments, a control system may be integrated into a frame of an eyewear device. Alternatively, all or a portion of control system may be in a system remote from the eyewear, and, for example, configured to control electroactive devices (e.g., actuators) in the eyewear via wired or wireless communication.

The control system, which in some examples may also be referred to as a controller, may control the operations of the light source and, in some cases, the optics system, which may include control of one or more fluid lenses. In some embodiments, the controller may be the graphics processing unit (GPU) of a display device. In some embodiments, the controller may include one or more different or additional processors. The operations performed by the controller may include taking content for display and dividing the content into discrete sections. The controller may instruct the light source to sequentially present the discrete sections using light emitters corresponding to a respective row in an image ultimately displayed to the user. The controller may instruct the optics system to adjust the light. For example, the controller may control the optics system to scan the presented discrete sections to different areas of a coupling element of the output waveguide. Accordingly, at the exit pupil of the output waveguide, each discrete portion may be presented in a different location. While each discrete section is presented at different times, the presentation and scanning of the discrete sections may occur fast enough such that a user's eye integrates the different sections into a single image or series of images. The controller may also provide scanning instructions to the light source that include an address corresponding to an individual source element of the light source and/or an electrical bias applied to the individual source element.

A controller may include an image processing unit. The controller, or component image processing unit, may include a general-purpose processor and/or one or more application-specific circuits that are dedicated to performing the features described herein. In one embodiment, a general-purpose processor may be coupled to a memory device to execute software instructions that cause the processor to perform certain processes described herein. In some embodiments, the image processing unit may include one or more circuits that are dedicated to performing certain features. The image processing unit may be a stand-alone unit that is separate from the controller and the driver circuit, but in some embodiments the image processing unit may be a sub-unit of the controller or the driver circuit. In other words, in those embodiments, the controller or the driver circuit performs various image processing procedures of the image processing unit. The image processing unit may also be referred to as an image processing circuit.

Ophthalmic applications of the devices described herein include spectacles with a flat front (or other curved) substrate and an adjustable eye-side concave or convex membrane surface. Applications include optics, and other applications of fluid lenses, including augmented reality or virtual reality headsets.

Embodiments of the present disclosure may include or be implemented in conjunction with various types of artificial reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs). Other artificial reality systems may include an NED that also provides visibility into the real world (e.g., augmented-reality system 2600 in FIG. 26) or that visually immerses a user in an artificial reality (e.g., virtual-reality system 2700 in FIG. 27). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 26:
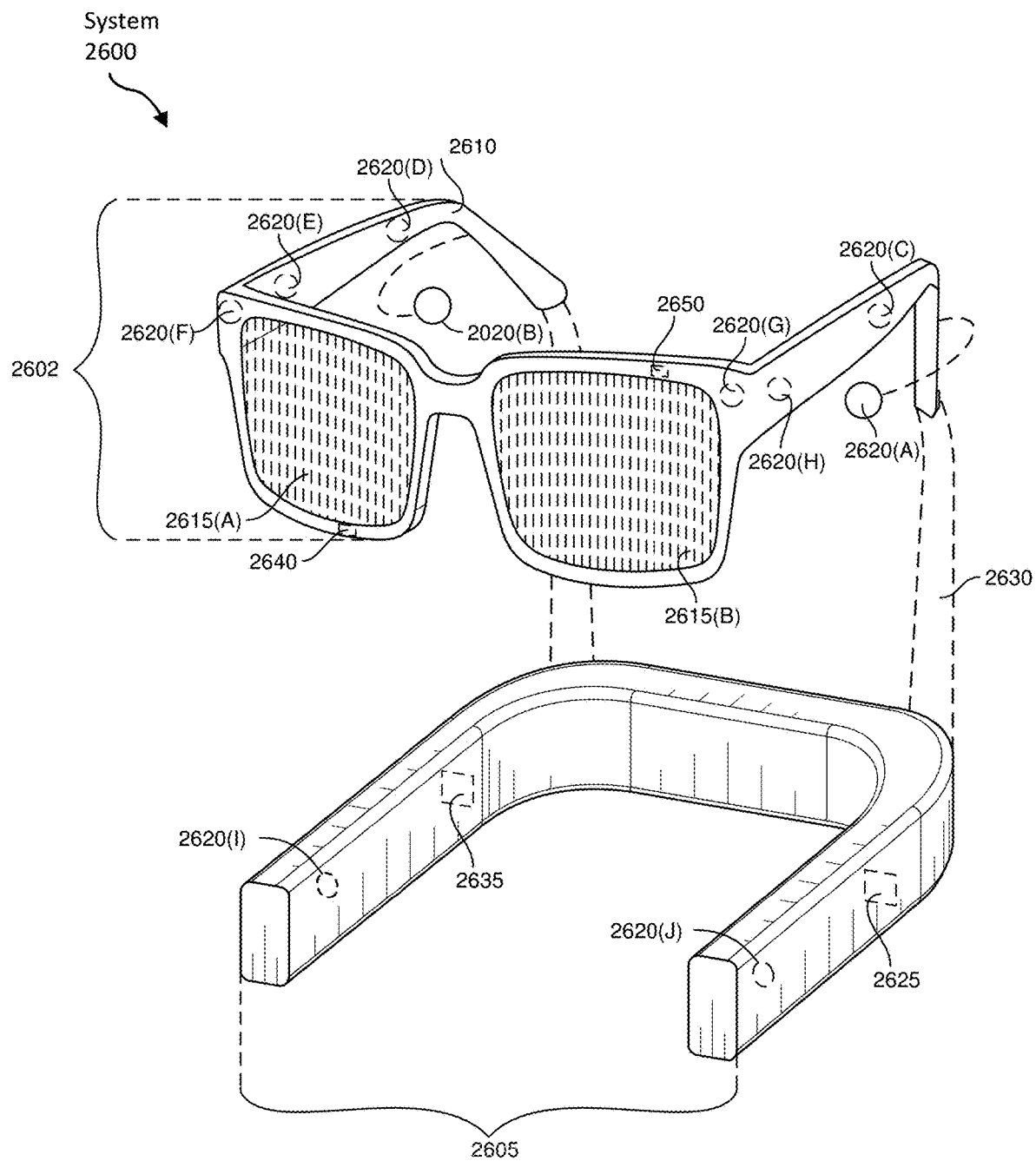
FIG. 26 is an illustration of exemplary augmented-reality glasses that may be used in connection with embodiments of this disclosure.

Turning to FIG. 26, augmented-reality system 2600 may include an eyewear device 2602 with a frame 2610 configured to hold a left display device 2615(A) and a right display device 2615(B) in front of a user's eyes. Display devices 2615(A) and 2615(B) may act together or independently to present an image or series of images to a user. While augmented-reality system 2600 includes two displays, embodiments of this disclosure may be implemented in augmented-reality systems with a single NED or more than two NEDs.

In some embodiments, augmented-reality system 2600 may include one or more sensors, such as sensor 2640. Sensor 2640 may generate measurement signals in response to motion of augmented-reality system 2600 and may be located on substantially any portion of frame 2610. Sensor 2640 may represent a position sensor, an inertial measurement unit (IMU), a depth camera assembly, a structured light emitter and/or detector, or any combination thereof. In some embodiments, augmented-reality system 2600 may or may not include sensor 2640 or may include more than one sensor. In embodiments in which sensor 2640 includes an IMU, the IMU may generate calibration data based on measurement signals from sensor 2640. Examples of sensor 2640 may include, without limitation, accelerometers, gyroscopes, magnetometers, other suitable types of sensors that detect motion, sensors used for error correction of the IMU, or some combination thereof.

Augmented-reality system 2600 may also include a microphone array with a plurality of acoustic transducers 2620(A)-2020(J), referred to collectively as acoustic transducers 2620. Acoustic transducers 2620 may be transducers that detect air pressure variations induced by sound waves. Each acoustic transducer 2620 may be configured to detect sound and convert the detected sound into an electronic format (e.g., an analog or digital format). The microphone array in FIG. 2 may include, for example, ten acoustic transducers: 2620(A) and 2620(B), which may be designed to be placed inside a corresponding ear of the user, acoustic transducers 2620(C), 2620(D), 2620(E), 2620(F), 2620(G), and 2620(H), which may be positioned at various locations on frame 2610, and/or acoustic transducers 2620(I) and 2620(J), which may be positioned on a corresponding neckband 2605.

In some embodiments, one or more of acoustic transducers 2620(A)-(F) may be used as output transducers (e.g., speakers). For example, acoustic transducers 2620(A) and/or 2620(B) may be earbuds or any other suitable type of headphone or speaker.

The configuration of acoustic transducers 2620 of the microphone array may vary. While augmented-reality system 2600 is shown in FIG. 26 as having ten acoustic transducers 2620, the number of acoustic transducers 2620 may be greater or less than ten. In some embodiments, using higher numbers of acoustic transducers 2620 may increase the amount of audio information collected and/or the sensitivity and accuracy of the audio information. In contrast, using a lower number of acoustic transducers 2620 may decrease the computing power required by an associated controller 2650 to process the collected audio information. In addition, the position of each acoustic transducer 2620 of the microphone array may vary. For example, the position of an acoustic transducer 2620 may include a defined position on the user, a defined coordinate on frame 2610, an orientation associated with each acoustic transducer 2620, or some combination thereof.

Acoustic transducers 2620(A) and 2620(B) may be positioned on different parts of the user's ear, such as behind the pinna, behind the tragus, and/or within the auricle or fossa. Or, there may be additional acoustic transducers 2620 on or surrounding the ear in addition to acoustic transducers 2620 inside the ear canal. Having an acoustic transducer 2620 positioned next to an ear canal of a user may enable the microphone array to collect information on how sounds arrive at the ear canal. By positioning at least two of acoustic transducers 2620 on either side of a user's head (e.g., as binaural microphones), augmented-reality device 2600 may simulate binaural hearing and capture a 3D stereo sound field around about a user's head. In some embodiments, acoustic transducers 2620(A) and 2620(B) may be connected to augmented-reality system 2600 via a wired connection 2630, and in other embodiments acoustic transducers 2620(A) and 2620(B) may be connected to augmented-reality system 2600 via a wireless connection (e.g., a Bluetooth connection). In still other embodiments, acoustic transducers 2620(A) and 2620(B) may not be used at all in conjunction with augmented-reality system 2600.

Acoustic transducers 2620 on frame 2610 may be positioned along the length of the temples, across the bridge, above or below display devices 2615(A) and 2615(B), or some combination thereof. Acoustic transducers 2620 may be oriented such that the microphone array is able to detect sounds in a wide range of directions surrounding the user wearing the augmented-reality system 2600. In some embodiments, an optimization process may be performed during manufacturing of augmented-reality system 2600 to determine relative positioning of each acoustic transducer 2620 in the microphone array.

In some examples, augmented-reality system 2600 may include or be connected to an external device (e.g., a paired device), such as neckband 2605. Neckband 2605 generally represents any type or form of paired device. Thus, the following discussion of neckband 2605 may also apply to various other paired devices, such as charging cases, smart watches, smart phones, wrist bands, other wearable devices, hand-held controllers, tablet computers, laptop computers, other external compute devices, etc.

As shown, neckband 2605 may be coupled to eyewear device 2602 via one or more connectors. The connectors may be wired or wireless and may include electrical and/or non-electrical (e.g., structural) components. In some cases, eyewear device 2602 and neckband 2605 may operate independently without any wired or wireless connection between them. While FIG. 26 illustrates the components of eyewear device 2602 and neckband 2605 in example locations on eyewear device 2602 and neckband 2605, the components may be located elsewhere and/or distributed differently on eyewear device 2602 and/or neckband 2605. In some embodiments, the components of eyewear device 2602 and neckband 2605 may be located on one or more additional peripheral devices paired with eyewear device 2602, neckband 2605, or some combination thereof.

Pairing external devices, such as neckband 2605, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 2600 may be provided by a paired device or shared between a paired device and an eyewear device, thus reducing the weight, heat profile, and form factor of the eyewear device overall while still retaining desired functionality. For example, neckband 2605 may allow components that would otherwise be included on an eyewear device to be included in neckband 2605 since users may tolerate a heavier weight load on their shoulders than they would tolerate on their heads. Neckband 2605 may also have a larger surface area over which to diffuse and disperse heat to the ambient environment. Thus, neckband 2605 may allow for greater battery and computation capacity than might otherwise have been possible on a stand-alone eyewear device. Since weight carried in neckband 2605 may be less invasive to a user than weight carried in eyewear device 2602, a user may tolerate wearing a lighter eyewear device and carrying or wearing the paired device for greater lengths of time than a user would tolerate wearing a heavy stand-alone eyewear device, thereby enabling users to more fully incorporate artificial reality environments into their day-to-day activities.

Neckband 2605 may be communicatively coupled with eyewear device 2602 and/or to other devices. These other devices may provide certain functions (e.g., tracking, localizing, depth mapping, processing, storage, etc.) to augmented-reality system 2600. In the embodiment of FIG. 26, neckband 2605 may include two acoustic transducers (e.g., 2620(I) and 2620(J)) that are part of the microphone array (or potentially form their own microphone subarray). Neckband 2605 may also include a controller 2625 and a power source 2635.

Acoustic transducers 2620(I) and 2620(J) of neckband 2605 may be configured to detect sound and convert the detected sound into an electronic format (analog or digital). In the embodiment of FIG. 26, acoustic transducers 2620(I) and 2620(J) may be positioned on neckband 2605, thereby increasing the distance between the neckband acoustic transducers 2620(I) and 2620(J) and other acoustic transducers 2620 positioned on eyewear device 2602. In some cases, increasing the distance between acoustic transducers 2620 of the microphone array may improve the accuracy of beamforming performed via the microphone array. For example, if a sound is detected by acoustic transducers 2620(C) and 2620(D) and the distance between acoustic transducers 2620(C) and 2620(D) is greater than, for example, the distance between acoustic transducers 2620(D) and 2620(E), the determined source location of the detected sound may be more accurate than if the sound had been detected by acoustic transducers 2620(D) and 2620(E).

Controller 2625 of neckband 2605 may process information generated by the sensors on neckband 2605 and/or augmented-reality system 2600. For example, controller 2625 may process information from the microphone array that describes sounds detected by the microphone array. For each detected sound, controller 2625 may perform a direction-of-arrival (DOA) estimation to estimate a direction from which the detected sound arrived at the microphone array. As the microphone array detects sounds, controller 2625 may populate an audio data set with the information. In embodiments in which augmented-reality system 2600 includes an inertial measurement unit, controller 2625 may compute all inertial and spatial calculations from the IMU located on eyewear device 2602. A connector may convey information between augmented-reality system 2600 and neckband 2605 and between augmented-reality system 2600 and controller 2625. The information may be in the form of optical data, electrical data, wireless data, or any other transmittable data form. Moving the processing of information generated by augmented-reality system 2600 to neckband 2605 may reduce weight and heat in eyewear device 2602, making it more comfortable to the user.

Power source 2635 in neckband 2605 may provide power to eyewear device 2602 and/or to neckband 2605. Power source 2635 may include, without limitation, lithium ion batteries, lithium-polymer batteries, primary lithium batteries, alkaline batteries, or any other form of power storage. In some cases, power source 2635 may be a wired power source. Including power source 2635 on neckband 2605 instead of on eyewear device 2602 may help better distribute the weight and heat generated by power source 2635.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 2700 in FIG. 27, that mostly or completely covers a user's field of view. Virtual-reality system 2700 may include a front rigid body 2702 and a band 2704 shaped to fit around a user's head. Virtual-reality system 2700 may also include output audio transducers 2706(A) and 2706(B). Furthermore, while not shown in FIG. 27, front rigid body 2702 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented-reality system 2600 and/or virtual-reality system 2700 may include one or more liquid crystal displays (LCDs), light emitting diode (LED) displays, organic LED (OLED) displays digital light project (DLP) micro-displays, liquid crystal on silicon (LCoS) micro-displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some artificial reality systems may include one or more projection systems. For example, display devices in augmented-reality system 2600 and/or virtual-reality system 2700 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. The display devices may accomplish this using any of a variety of different optical components, including waveguides components (e.g., holographic, planar, diffractive, polarized, and/or reflective waveguide elements), light-manipulation surfaces and elements (such as diffractive, reflective, and refractive elements and gratings), coupling elements, etc. Artificial reality systems may also be configured with any other suitable type or form of image projection system, such as retinal projectors used in virtual retina displays.

Artificial reality systems may also include various types of computer vision components and subsystems. For example, augmented-reality system augmented-reality system 2600 and/or virtual-reality system 2700 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. Examples may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some examples, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

As noted, artificial reality systems 2600 and 2700 may be used with a variety of other types of devices to provide a more compelling artificial reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 28:
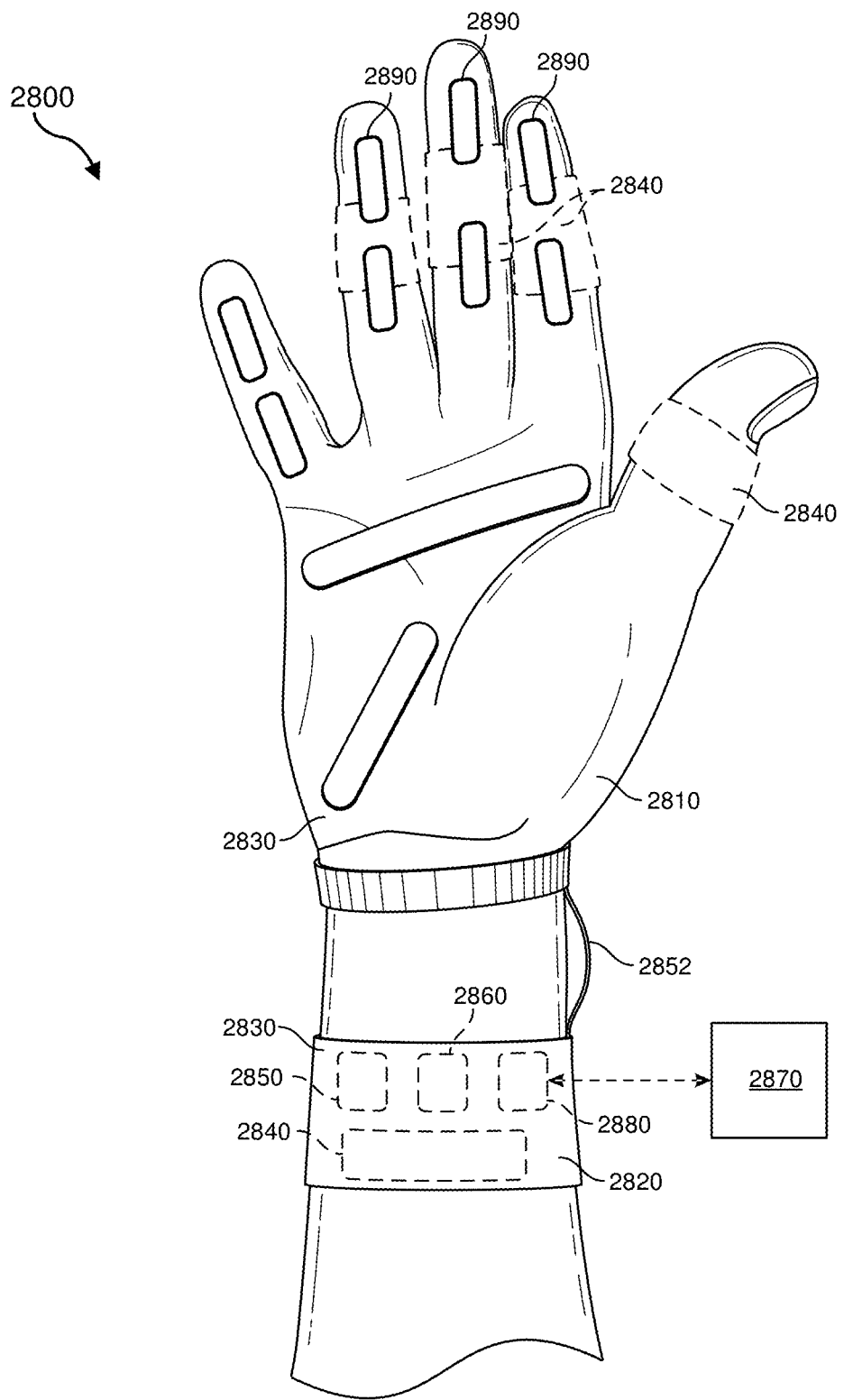
FIG. 28 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 28 illustrates a vibrotactile system 2800 in the form of a wearable glove (haptic device 2810) and wristband (haptic device 2820). Haptic device 2810 and haptic device 2820 are shown as examples of wearable devices that include a flexible, wearable textile material 2830 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 2840 may be positioned at least partially within one or more corresponding pockets formed in textile material 2830 of vibrotactile system 2800. Vibrotactile devices 2840 may be positioned in locations to provide a vibrating sensation (e.g., haptic feedback) to a user of vibrotactile system 2800. For example, vibrotactile devices 2840 may be positioned against the user's finger(s), thumb, or wrist, as shown in FIG. 28. Vibrotactile devices 2840 may, in some examples, be sufficiently flexible to conform to or bend with the user's corresponding body part(s).

A power source 2850 (e.g., a battery) for applying a voltage to the vibrotactile devices 2840 for activation thereof may be electrically coupled to vibrotactile devices 2840, such as via conductive wiring 2852. In some examples, each of vibrotactile devices 2840 may be independently electrically coupled to power source 2850 for individual activation. In some embodiments, a processor 2860 may be operatively coupled to power source 2850 and configured (e.g., programmed) to control activation of vibrotactile devices 2840.

Vibrotactile system 2800 may be implemented in a variety of ways. In some examples, vibrotactile system 2800 may be a standalone system with integral subsystems and components for operation independent of other devices and systems. As another example, vibrotactile system 2800 may be configured for interaction with another device or system 2870. For example, vibrotactile system 2800 may, in some examples, include a communications interface 2880 for receiving and/or sending signals to the other device or system 2870. The other device or system 2870 may be a mobile device, a gaming console, an artificial reality (e.g., virtual reality, augmented reality, mixed reality) device, a personal computer, a tablet computer, a network device (e.g., a modem, a router, etc.), a handheld controller, etc. Communications interface 2880 may enable communications between vibrotactile system 2800 and the other device or system 2870 via a wireless (e.g., Wi-Fi, Bluetooth, cellular, radio, etc.) link or a wired link. If present, communications interface 2880 may be in communication with processor 2860, such as to provide a signal to processor 2860 to activate or deactivate one or more of the vibrotactile devices 2840.

Vibrotactile system 2800 may optionally include other subsystems and components, such as touch-sensitive pads 2890, pressure sensors, motion sensors, position sensors, lighting elements, and/or user interface elements (e.g., an on/off button, a vibration control element, etc.). During use, vibrotactile devices 2840 may be configured to be activated for a variety of different reasons, such as in response to the user's interaction with user interface elements, a signal from the motion or position sensors, a signal from the touch-sensitive pads 2890, a signal from the pressure sensors, a signal from the other device or system 2870, etc.

Although power source 2850, processor 2860, and communications interface 2880 are illustrated in FIG. 28 as being positioned in haptic device 2820, the present disclosure is not so limited. For example, one or more of power source 2850, processor 2860, or communications interface 2880 may be positioned within haptic device 2810 or within another wearable textile.

Figure 29:
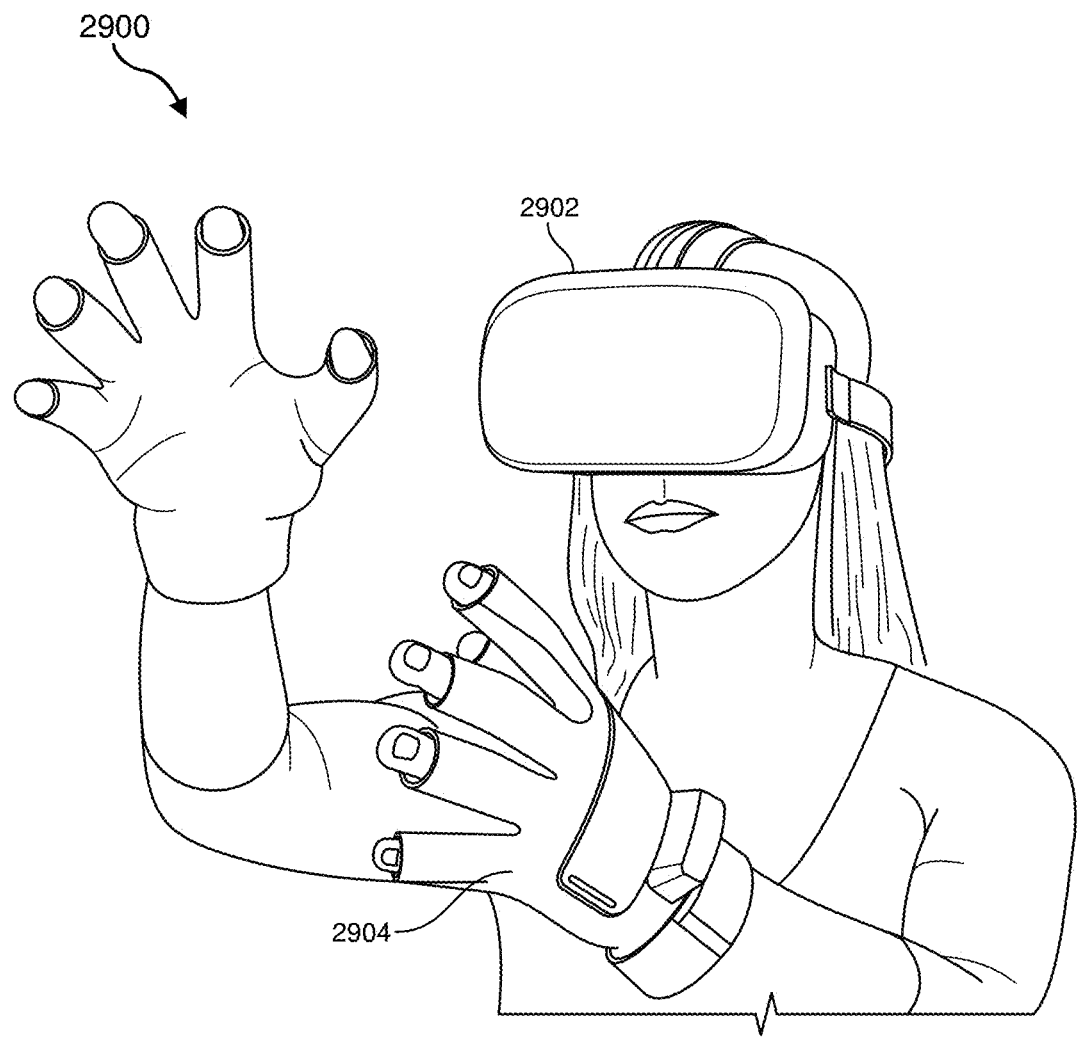
FIG. 29 is an illustration of an exemplary virtual-reality environment according to embodiments of this disclosure.

Haptic wearables, such as those shown in and described in connection with FIG. 28, may be implemented in a variety of types of artificial-reality systems and environments. FIG. 29 shows an example artificial reality environment 2900 including one head-mounted virtual-reality display and two haptic devices (i.e., gloves), and in other embodiments any number and/or combination of these components and other components may be included in an artificial reality system. For example, in some embodiments there may be multiple head-mounted displays each having an associated haptic device, with each head-mounted display and each haptic device communicating with the same console, portable computing device, or other computing system.

Figure 27:
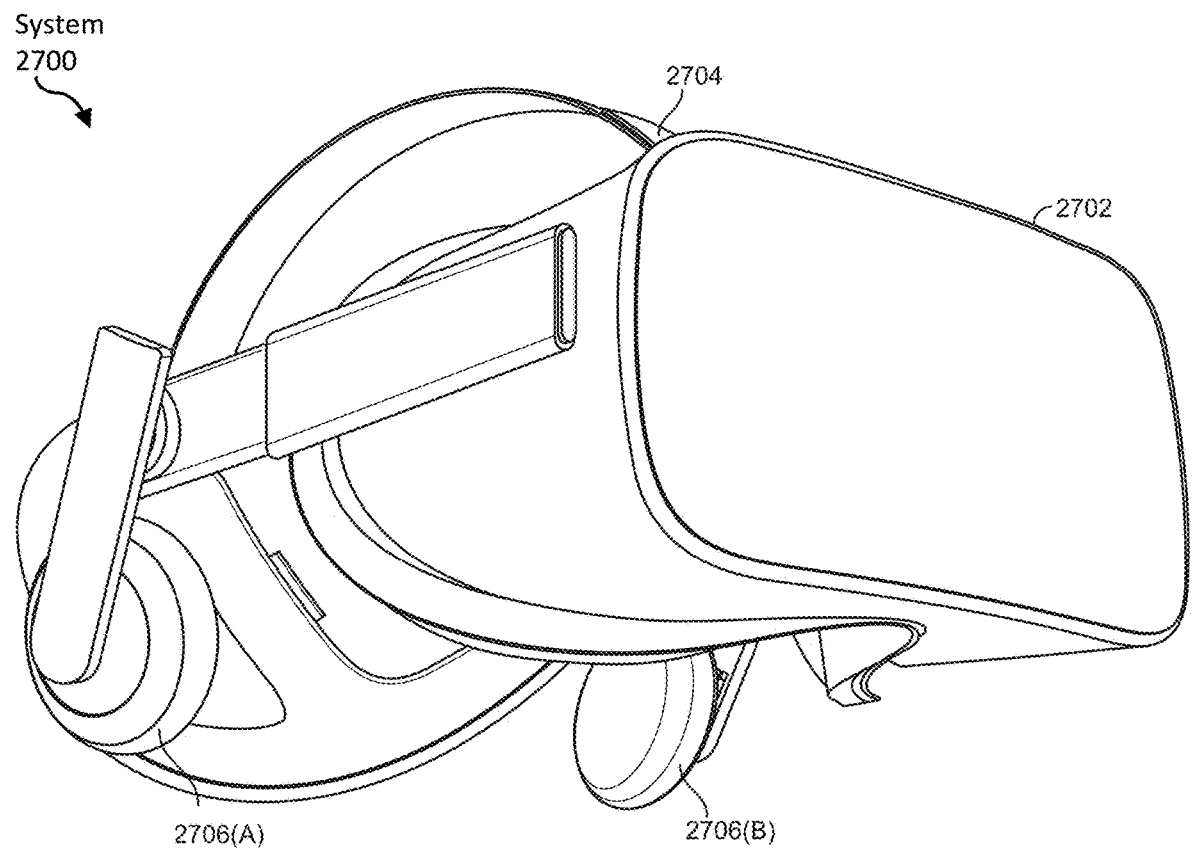
FIG. 27 is an illustration of an exemplary virtual-reality headset that may be used in connection with embodiments of this disclosure.

Head-mounted display 2902 generally represents any type or form of virtual-reality system, such as virtual-reality system 2700 in FIG. 27. Haptic device 2904 generally represents any type or form of wearable device, worn by a user of an artificial reality system, that provides haptic feedback to the user to give the user the perception that he or she is physically engaging with a virtual object. In some embodiments, haptic device 2904 may provide haptic feedback by applying vibration, motion, and/or force to the user. For example, haptic device 2904 may limit or augment a user's movement. To give a specific example, haptic device 2904 may limit a user's hand from moving forward so that the user has the perception that his or her hand has come in physical contact with a virtual wall. In this specific example, one or more actuators within the haptic advice may achieve the physical-movement restriction by pumping fluid into an inflatable bladder of the haptic device. In some examples, a user may also use haptic device 2904 to send action requests to a console. Examples of action requests include, without limitation, requests to start an application and/or end the application and/or requests to perform a particular action within the application.

Figure 30:
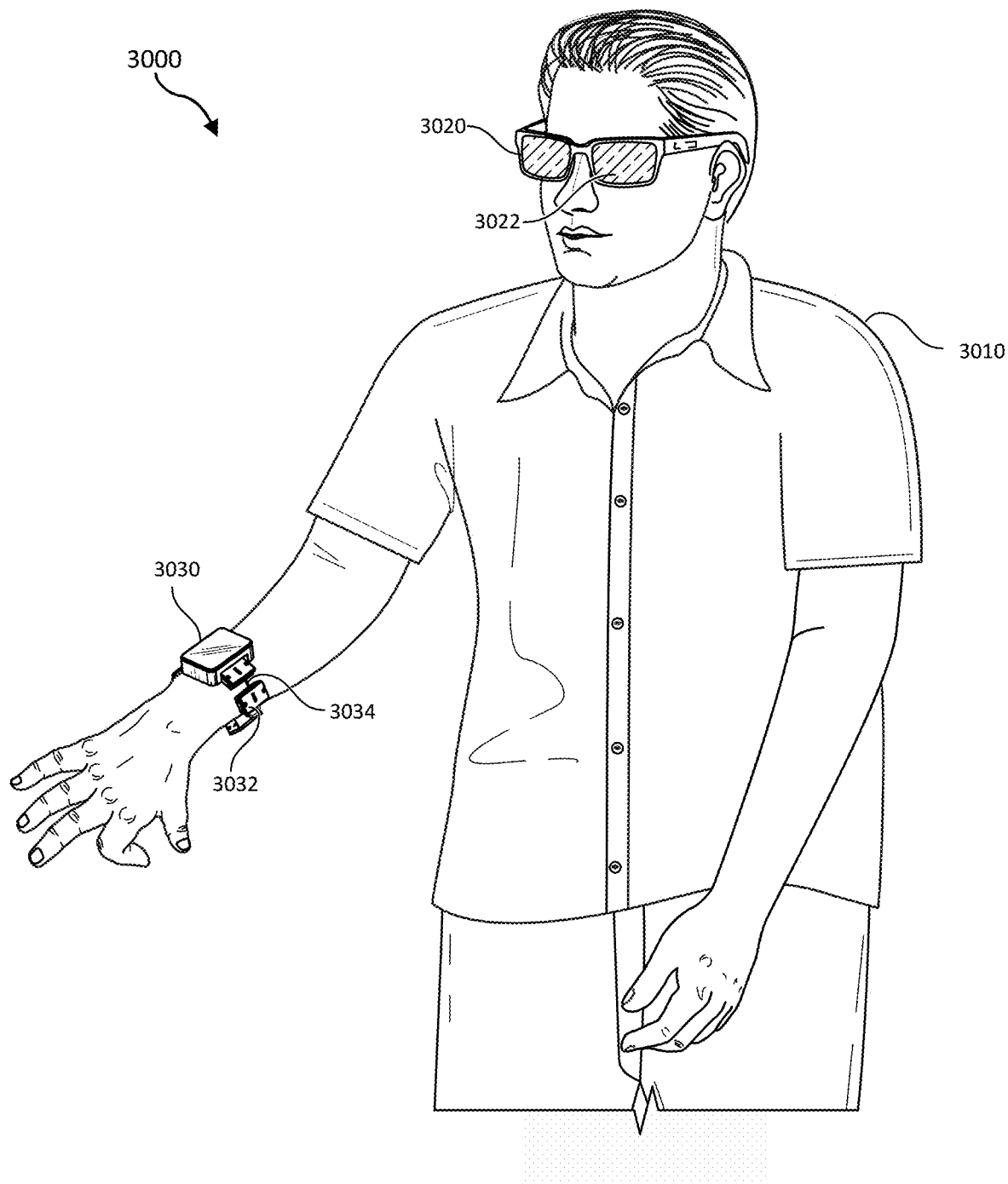
FIG. 30 is an illustration of an exemplary augmented-reality environment according to embodiments of this disclosure.

While haptic interfaces may be used with virtual-reality systems, as shown in FIG. 29, haptic interfaces may also be used with augmented-reality systems, as shown in FIG. 30. FIG. 30 is a perspective view of a user 3010 interacting with an augmented-reality system 3000. In this example, user 3010 may wear a pair of augmented-reality glasses 3020 that may have one or more displays 3022 and that are paired with a haptic device 3030. In this example, haptic device 3030 may be a wristband that includes a plurality of band elements 3032 and a tensioning mechanism 3034 that connects band elements 3032 to one another.

One or more of band elements 3032 may include any type or form of actuator suitable for providing haptic feedback. For example, one or more of band elements 3032 may be configured to provide one or more of various types of cutaneous feedback, including vibration, force, traction, texture, and/or temperature. To provide such feedback, band elements 3032 may include one or more of various types of actuators. In one example, each of band elements 3032 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 2810, 2820, 2904, and 3030 may include any suitable number and/or type of haptic transducer, sensor, and/or feedback mechanism. For example, haptic devices 2810, 2820, 2904, and 3030 may include one or more mechanical transducers, piezoelectric transducers, and/or fluidic transducers. Haptic devices 2810, 2820, 2904, and 3030 may also include various combinations of different types and forms of transducers that work together or independently to enhance a user's artificial-reality experience. In one example, each of band elements 3032 of haptic device 3030 may include a vibrotactor (e.g., a vibrotactile actuator) configured to vibrate in unison or independently to provide one or more of various types of haptic sensations to a user.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. For example, one or more of the modules recited herein may receive data to be transformed, transform the data, output a result of the transformation to perform a function, use the result of the transformation to perform a function, and store the result of the transformation to perform a function. In some examples, a function may include one or more of applying a control signal to an actuator, receiving sensor data, or other function. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

U.S. Provisional Application No. 62/777,825, filed Dec. 11, 2018, is incorporated, in its entirety, by this reference.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

Features from any of the embodiments described herein may be used in combination with one another in accordance with the general principles described herein. These and other embodiments, features, and advantages will be more fully understood upon reading the following detailed description in conjunction with the accompanying drawings and claims.

What is claimed is:

1. A device, comprising:
   a first electrode;
   a second electrode; and
   an anisotropic nanovoided polymer comprising anisotropic nanovoids within a polymer matrix, the anisotropic nanovoids separated from each other by polymer walls having a mean wall thickness, the anisotropic nanovoids comprising a gas, wherein:
   at least a portion of the anisotropic nanovoided polymer is located between the first electrode and the second electrode;
   the gas has a characteristic diffusion time to diffuse half the mean wall thickness through the polymer walls;
   the device is an electroactive device having a response time for a transition from a first state to a second state; and
   the characteristic diffusion time is less than the response time.

2. The device of claim 1, wherein the mean thickness of the polymer walls is sufficiently thin so that the gas can diffuse through the polymer walls during the response time.

3. The device of claim 1, wherein the characteristic diffusion time for the gas is less than approximately one millisecond.

4. The device of claim 1, wherein the device is an actuator, and the response time is an actuation time for the transition from the first state to the second state in response to an electric field applied between the first electrode and the second electrode.

5. The device of claim 4, wherein the first state is a generally uncompressed state.

6. The device of claim 4, wherein the second state is compressed by at least 50%, relative to the first state, along a compression direction parallel to the electric field.

7. The device of claim 6, wherein the anisotropic nanovoids in a generally uncompressed state are elongated along at least one direction perpendicular to the compression direction.

8. The device of claim 1, wherein the mean wall thickness of the polymer walls is less than 1 micron.

9. The device of claim 1, wherein the response time is less than approximately 1 millisecond.

10. The device of claim 1, wherein the response time is at least ten times greater than the characteristic diffusion time.

11. The device of claim 1, wherein the polymer matrix comprises an electroactive polymer.

12. The device of claim 11, wherein the electroactive polymer shows appreciable electroconstriction when an electric field is applied between the first electrode and the second electrode.

13. The device of claim 11, wherein the electroactive polymer comprises a silicone polymer.

14. The device of claim 13, wherein the silicone polymer is polydimethylsiloxane, or a derivative thereof.

15. The device of claim 1, wherein the gas comprises air.

16. The device of claim 1, wherein the anisotropic nanovoids have an anisotropy ratio determined by a ratio of a first dimension measured along a first direction, and a second dimension measured along a second direction perpendicular to the first direction, wherein the anisotropy ratio is at least approximately 2 when the anisotropic nanovoided polymer is in a generally uncompressed state.

17. The device of claim 1, wherein the device is sensor, and the response time is a deformation time for a mechanically-induced transition from the first state to the second state.

18. A method, comprising:
applying an electric field between a first electrode and a second electrode to switch an actuator from a first state to a second state, wherein
the actuator comprises a nanovoided polymer located between the first electrode and the second electrode, the nanovoided polymer comprising nanovoids enclosing a gas separated by polymer walls,
the second state is compressed parallel to the electric field, relative to the first state, and
a characteristic diffusion time of the gas through the polymer walls is less than a response time of the actuator.

19. The method of claim 18, wherein the second state is at least 50% compressed along a compression direction of the electric field, relative to a generally uncompressed state.

20. The method of claim 18, wherein the response time of the actuator is 1 millisecond or less.

* * * * *